United States Patent
Tonar et al.

(10) Patent No.: US 9,346,402 B2
(45) Date of Patent: May 24, 2016

(54) VEHICULAR REARVIEW MIRROR ELEMENTS AND ASSEMBLIES INCORPORATING THESE ELEMENTS

(71) Applicant: Gentex Corporation, Zeeland, MI (US)

(72) Inventors: William L. Tonar, Holland, MI (US); David J. Cammenga, Zeeland, MI (US); John S. Anderson, Holland, MI (US); David L. Poll, Holland, MI (US); George A. Neuman, Holland, MI (US); Joel A. Stray, Hudsonville, MI (US); Bradley L. Busscher, Grand Rapids, MI (US); Kenton J. Ypma, Hudsonville, MI (US)

(73) Assignee: GENTEX CORPORATION, Zeeland, MI (US)

(*) Notice: Subject to any disclaimer, the term of this patent is extended or adjusted under 35 U.S.C. 154(b) by 0 days.

(21) Appl. No.: 14/699,402

(22) Filed: Apr. 29, 2015

(65) Prior Publication Data

US 2015/0239399 A1 Aug. 27, 2015

Related U.S. Application Data

(60) Division of application No. 14/164,505, filed on Jan. 27, 2014, now Pat. No. 9,041,998, which is a continuation of application No. 13/188,042, filed on Jul. 21, 2011, now Pat. No. 8,638,488, which is a continuation of application No. 12/505,458, filed on Jul. 17, 2009, now Pat. No. 8,004,741, which is a continuation-in-part of application No. 12/151,669, filed on May 8, 2008, now Pat. No. 7,570,413, which is a continuation of application No. 11/066,903, filed on Feb. 25, 2005, now Pat. No. 7,372,611, said application No. 12/505,458 is a continuation-in-part of (Continued)

(51) Int. Cl.
| | |
|---|---|
| G02F 1/153 | (2006.01) |
| B05D 5/12 | (2006.01) |
| B60R 1/08 | (2006.01) |
| G02F 1/157 | (2006.01) |
| B60R 1/12 | (2006.01) |
| B60R 1/06 | (2006.01) |
| B60R 1/04 | (2006.01) |

(Continued)

(52) U.S. Cl.
CPC .............. *B60R 1/088* (2013.01); *B32B 17/06* (2013.01); *B32B 17/10036* (2013.01); *B32B 17/10174* (2013.01); *B32B 17/10321* (2013.01); *B32B 17/10513* (2013.01); *B60R 1/04* (2013.01); *B60R 1/06* (2013.01); *B60R 1/12* (2013.01); *G02F 1/153* (2013.01); *G02F 1/157* (2013.01); *B32B 2255/205* (2013.01); *B32B 2307/202* (2013.01); *B32B 2307/40* (2013.01); *B32B 2307/412* (2013.01); *B32B 2307/728* (2013.01); *B32B 2307/73* (2013.01); *B32B 2605/00* (2013.01); *B32B 2605/006* (2013.01); *B60R 2001/1215* (2013.01); *C23C 14/086* (2013.01); *C23C 14/34* (2013.01); *Y10T 29/49002* (2015.01)

(58) Field of Classification Search
CPC ......................................................... G02F 1/155
USPC .......... 359/265–275, 105; 427/108, 164, 165, 427/596, 554
See application file for complete search history.

(56) References Cited

U.S. PATENT DOCUMENTS

| | | |
|---|---|---|
| 3,280,701 A | 10/1966 | Donnelly et al. |
| 3,837,129 A | 9/1974 | Losell |

(Continued)

*Primary Examiner* — Tuyen Tra
(74) *Attorney, Agent, or Firm* — Price Heneveld LLP; Scott P. Ryan

(57) ABSTRACT

The present invention relates to improved electro-optic rearview mirror elements and assemblies incorporating the same, including processes for making such elements and assemblies.

24 Claims, 23 Drawing Sheets

Related U.S. Application Data application No. 11/478,224, filed on Jun. 29, 2006, now Pat. No. 7,602,542, which is a continuation-in-part of application No. 11/066,903, said application No. 13/188,042 is a continuation-in-part of application No. 12/832,838, filed on Jul. 8, 2010, now Pat. No. 8,169,684, which is a continuation-in-part of application No. 12/750,357, filed on Mar. 30, 2010, now abandoned, which is a continuation of application No. 12/154,736, filed on May 27, 2008, now Pat. No. 7,719,750, which is a continuation of application No. 11/477,312, filed on Jun. 29, 2006, now Pat. No. 7,379,225, which is a continuation of application No. 11/066,903, which is a continuation-in-part of application No. 10/430,885, filed on May 6, 2003, now Pat. No. 7,324,261, which is a continuation-in-part of application No. 10/260,741, filed on Sep. 30, 2002, now Pat. No. 7,064,882.

(60) Provisional application No. 60/614,150, filed on Sep. 29, 2004, provisional application No. 60/605,111, filed on Aug. 27, 2004, provisional application No. 60/548,472, filed on Feb. 27, 2004.

(51) Int. Cl.
*B32B 17/06* (2006.01)
*B32B 17/10* (2006.01)
*C23C 14/08* (2006.01)
*C23C 14/34* (2006.01)

(56) References Cited

U.S. PATENT DOCUMENTS

| | | |
|---|---|---|
| 4,902,108 A | 2/1990 | Byker |
| 5,052,163 A | 10/1991 | Czekala |
| 5,066,112 A | 11/1991 | Lynam et al. |
| 5,069,535 A | 12/1991 | Baucke et al. |
| 5,073,012 A | 12/1991 | Lynam |
| 5,076,673 A | 12/1991 | Lynam et al. |
| 5,115,346 A | 5/1992 | Lynam |
| 5,151,824 A | 9/1992 | O'Farrell |
| 5,158,638 A | 10/1992 | Osanami et al. |
| 5,253,109 A | 10/1993 | O'Farrell et al. |
| 5,379,146 A | 1/1995 | Defendini |
| 5,421,940 A | 6/1995 | Cornils et al. |
| 5,448,397 A | 9/1995 | Tonar |
| 5,649,756 A | 7/1997 | Adams et al. |
| 5,724,187 A | 3/1998 | Varaprasad et al. |
| 5,790,298 A | 8/1998 | Tonar |
| 5,808,778 A | 9/1998 | Bauer et al. |
| 5,818,625 A | 10/1998 | Forgette et al. |
| 5,923,457 A | 7/1999 | Byker et al. |
| 6,064,508 A | 5/2000 | Forgette et al. |
| 6,068,380 A | 5/2000 | Lynn et al. |
| 6,102,546 A | 8/2000 | Carter |
| 6,170,956 B1 | 1/2001 | Rumsey et al. |
| 6,195,194 B1 | 2/2001 | Roberts et al. |
| 6,239,899 B1 | 5/2001 | DeVries et al. |
| 6,249,369 B1 | 6/2001 | Theiste et al. |
| 6,317,248 B1 | 11/2001 | Agrawal et al. |
| 6,407,468 B1 | 6/2002 | LeVesque et al. |
| 6,407,847 B1 | 6/2002 | Poll et al. |
| 6,447,123 B2 | 9/2002 | Tonar et al. |
| 6,606,183 B2 | 8/2003 | Ikai et al. |
| 6,614,579 B2 | 9/2003 | Roberts et al. |
| 6,650,457 B2 | 11/2003 | Busscher et al. |
| 6,781,738 B2 | 8/2004 | Kikuchi et al. |
| 6,870,656 B2 | 3/2005 | Tonar et al. |
| 7,042,616 B2 | 5/2006 | Tonar et al. |
| 7,324,261 B2 | 1/2008 | Tonar et al. |
| 7,543,947 B2 | 6/2009 | Varaprasad et al. |
| 7,612,929 B2 | 11/2009 | Tonar et al. |
| 7,706,046 B2 | 4/2010 | Bauer et al. |
| 7,817,020 B2 | 10/2010 | Turnbull et al. |
| 7,859,738 B2 | 12/2010 | Baur et al. |
| 7,864,399 B2 | 1/2011 | McCabe et al. |
| 8,520,287 B2 * | 8/2013 | Lee ............ G02B 27/2214 359/273 |
| 8,638,488 B2 | 1/2014 | Tonar et al. |
| 2004/0032638 A1 | 2/2004 | Tonar et al. |
| 2005/0270620 A1 | 12/2005 | Bauer et al. |
| 2008/0225396 A1 | 9/2008 | McCabe et al. |
| 2009/0243824 A1 | 10/2009 | Peterson et al. |
| 2012/0038964 A1 | 2/2012 | DeWind et al. |
| 2012/0069444 A1 | 3/2012 | Campbell et al. |
| 2012/0236388 A1 | 9/2012 | DeWind et al. |
| 2014/0022390 A1 | 1/2014 | Blank et al. |

* cited by examiner

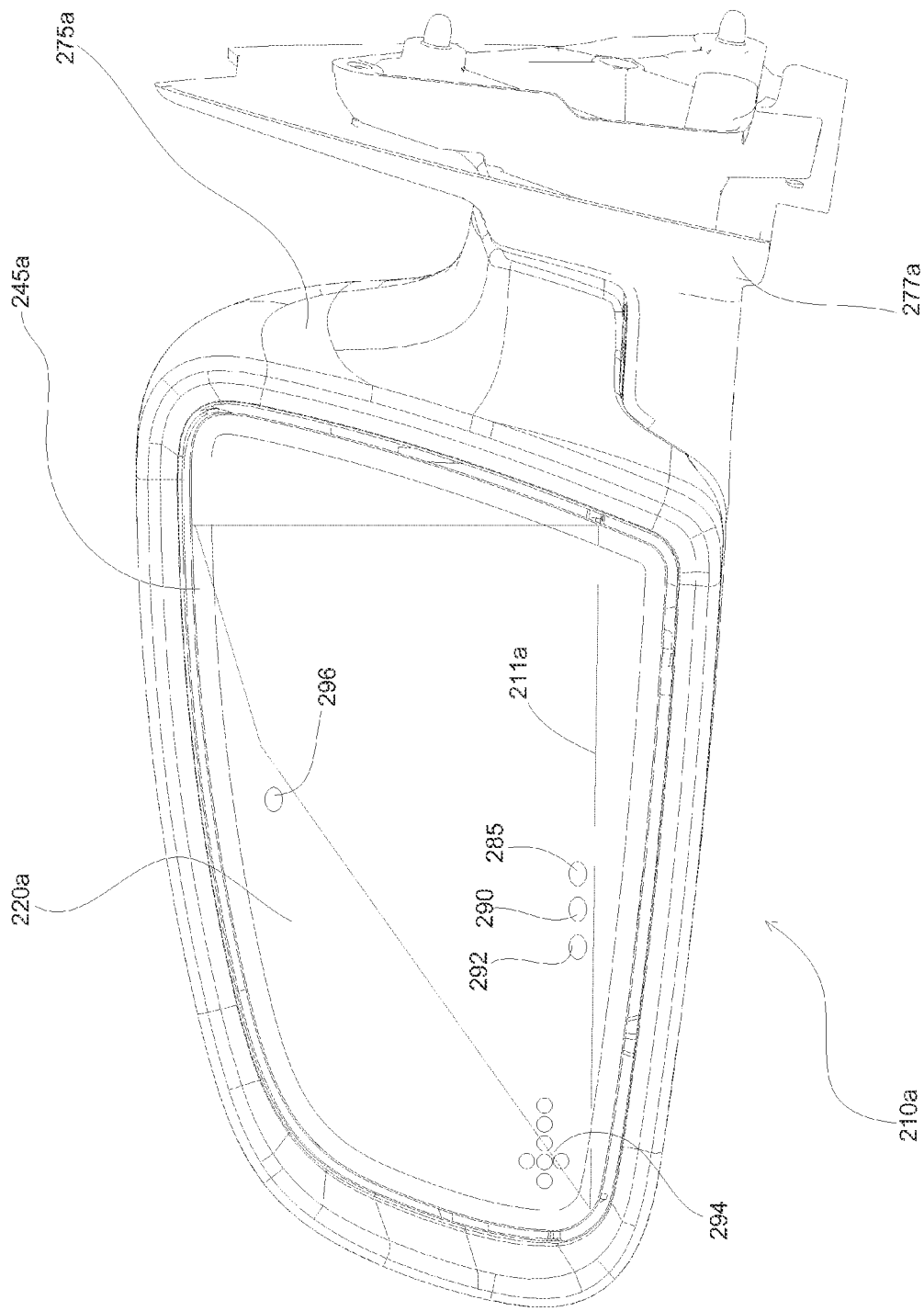

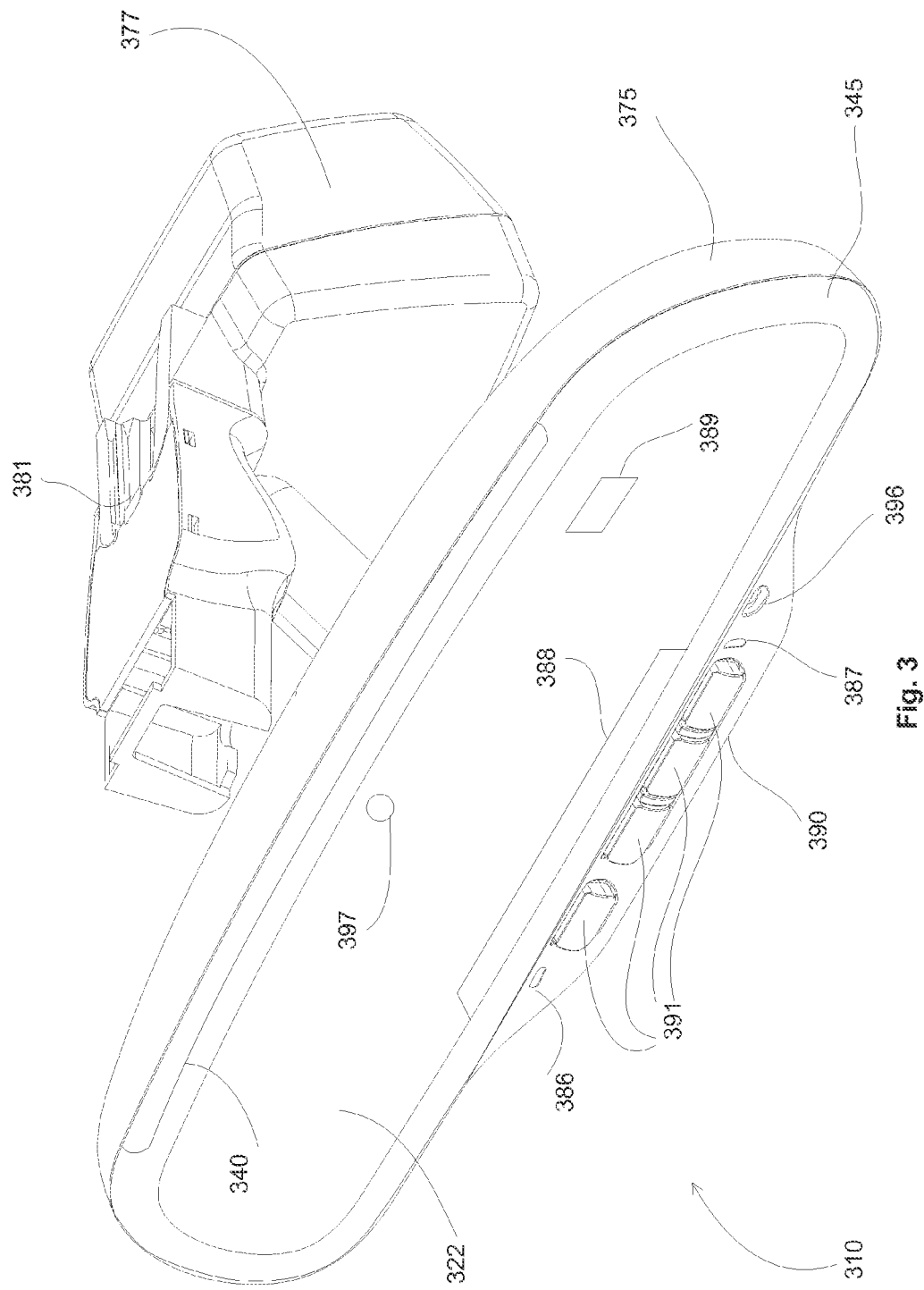

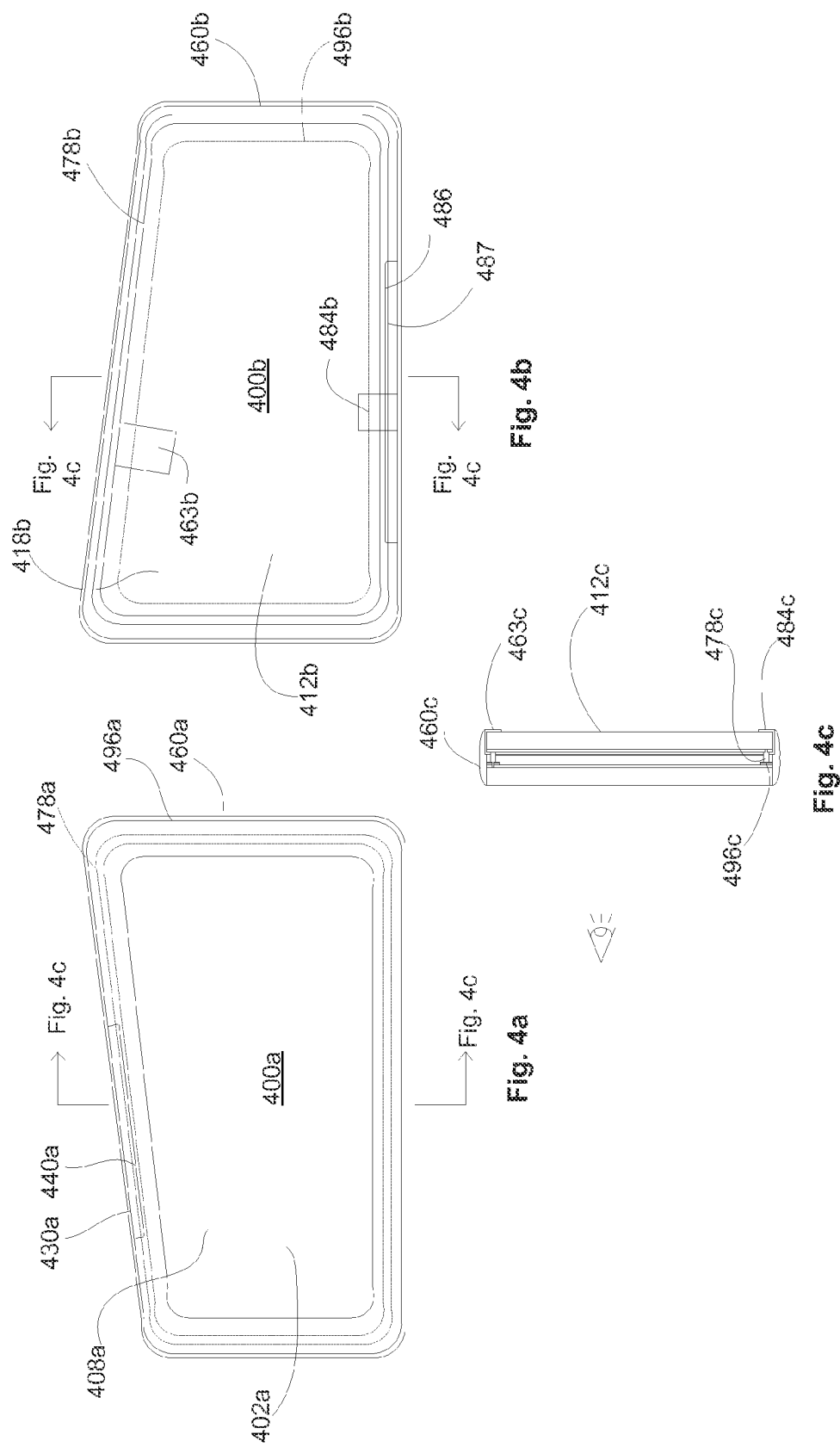

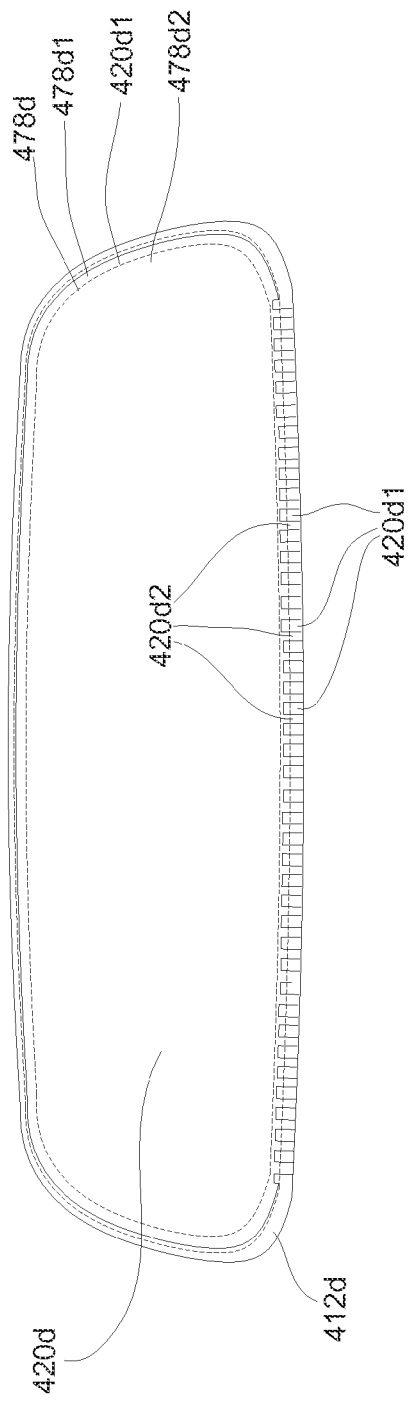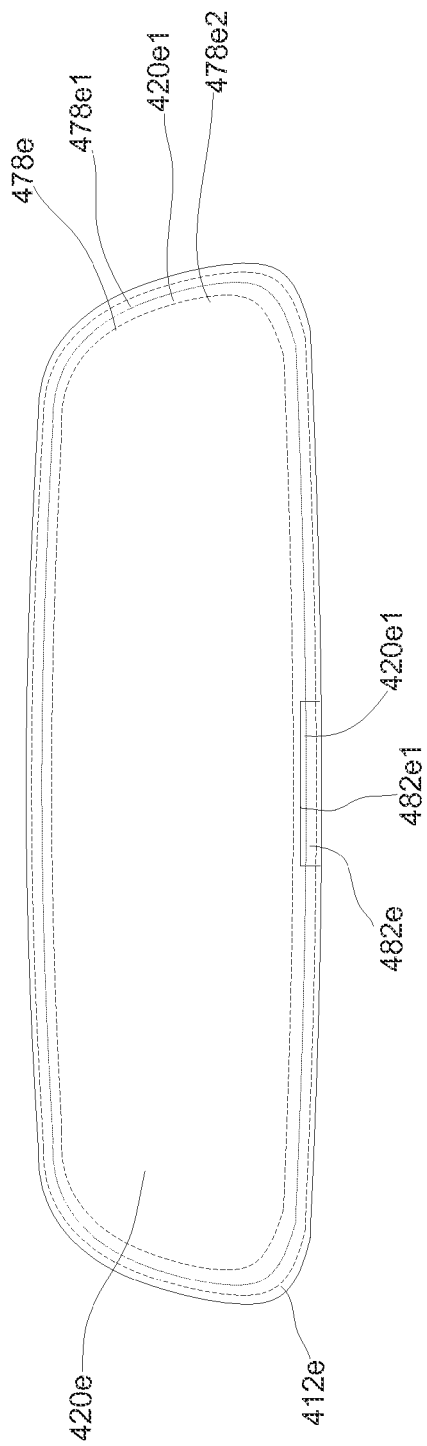

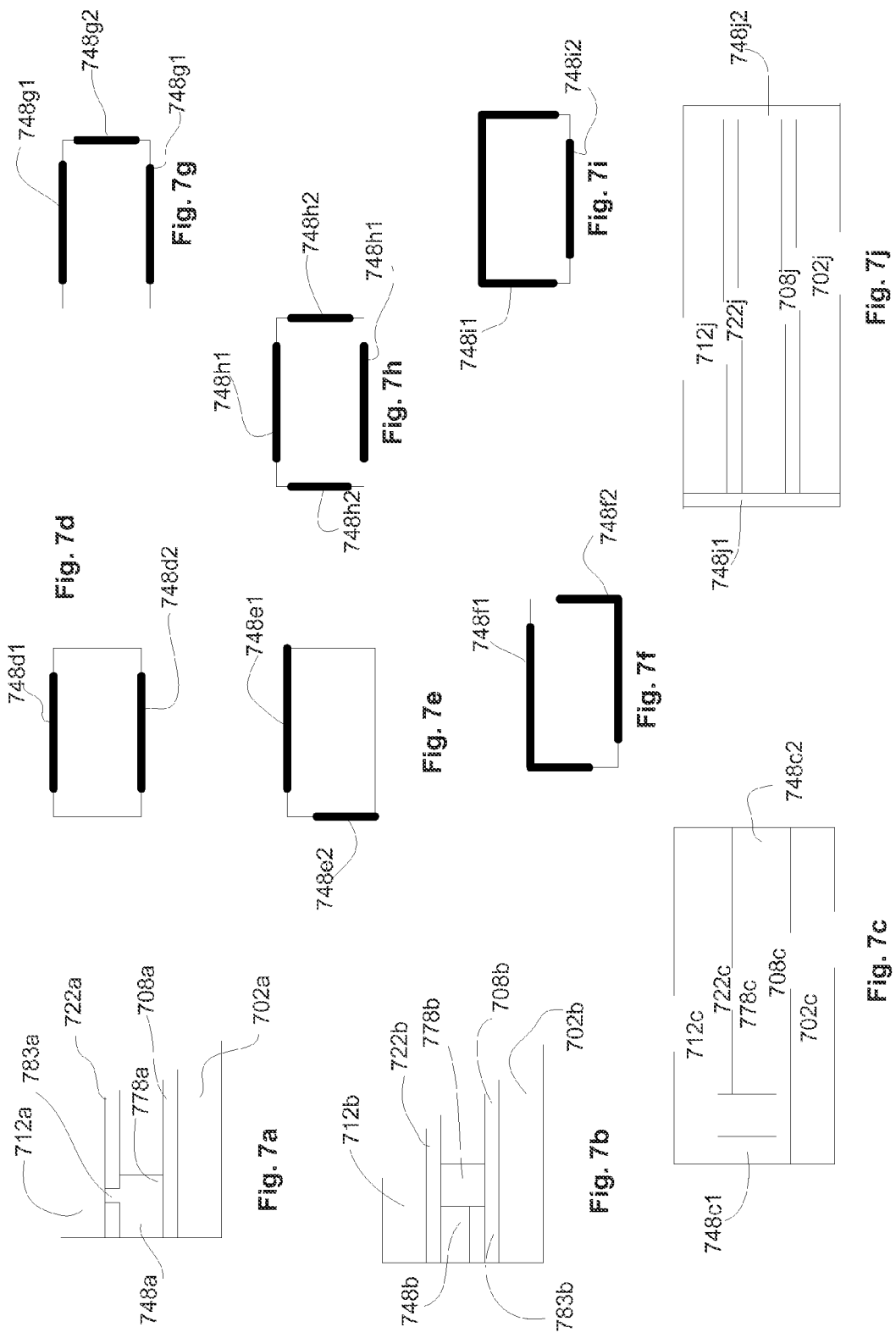

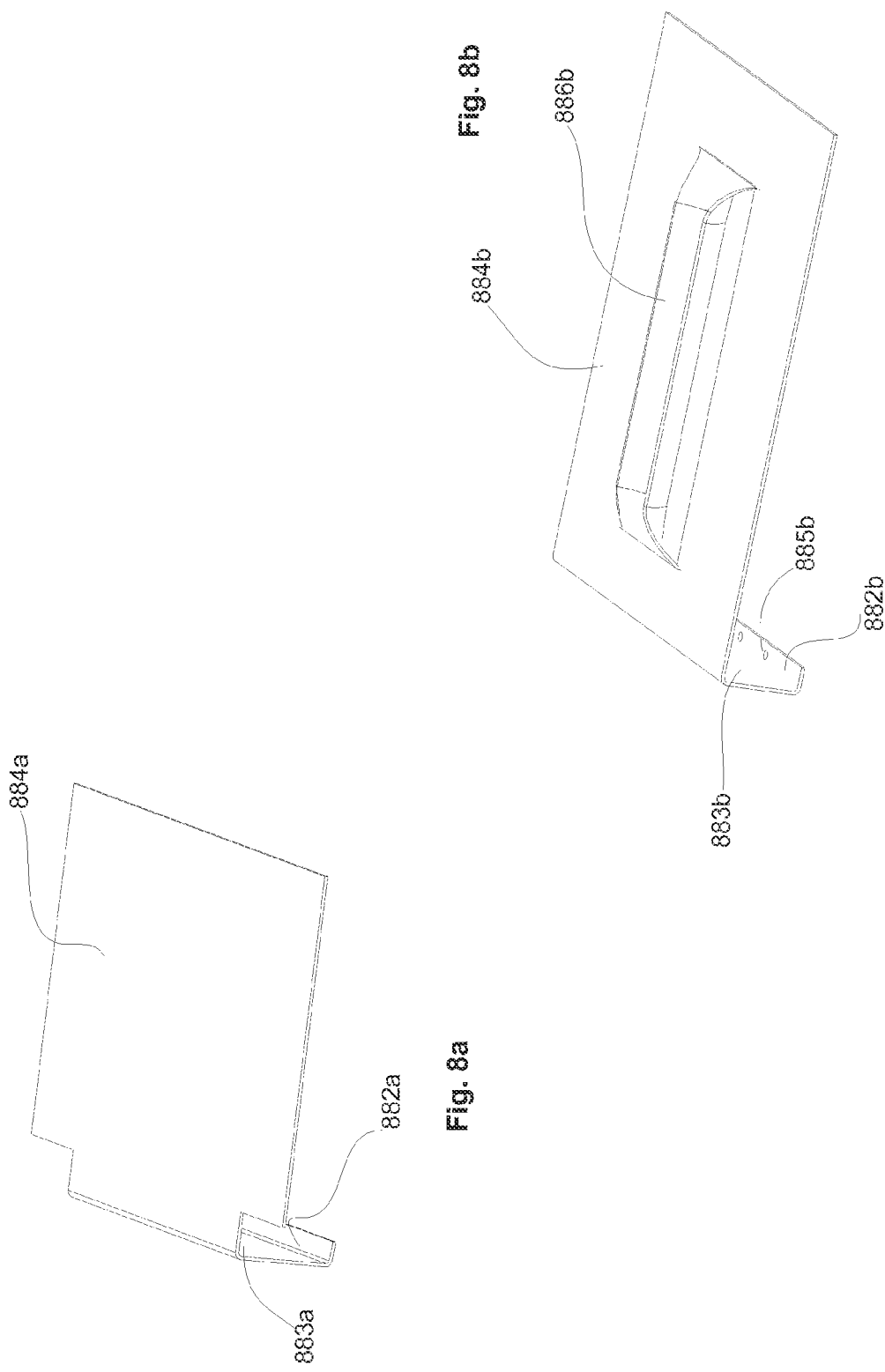

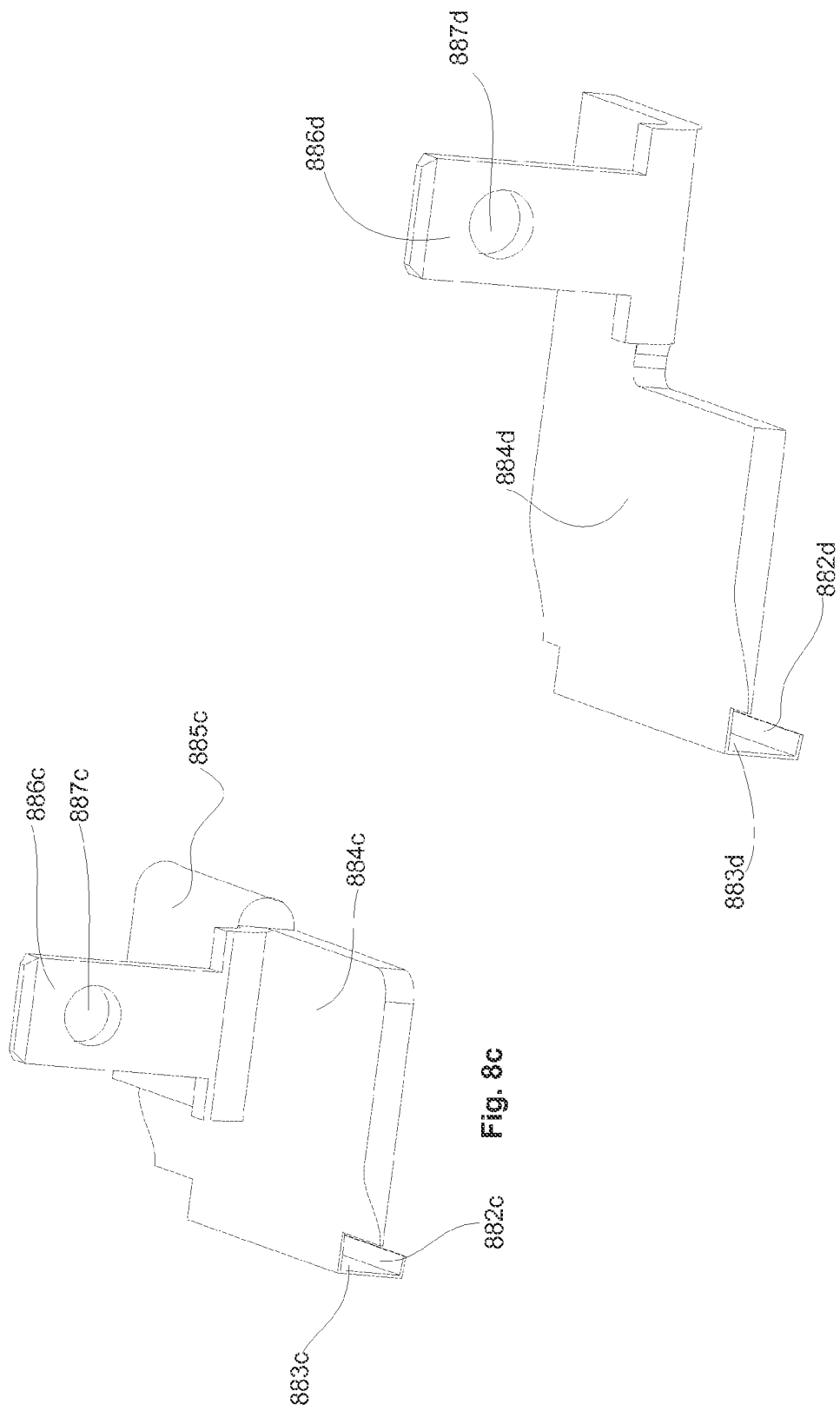

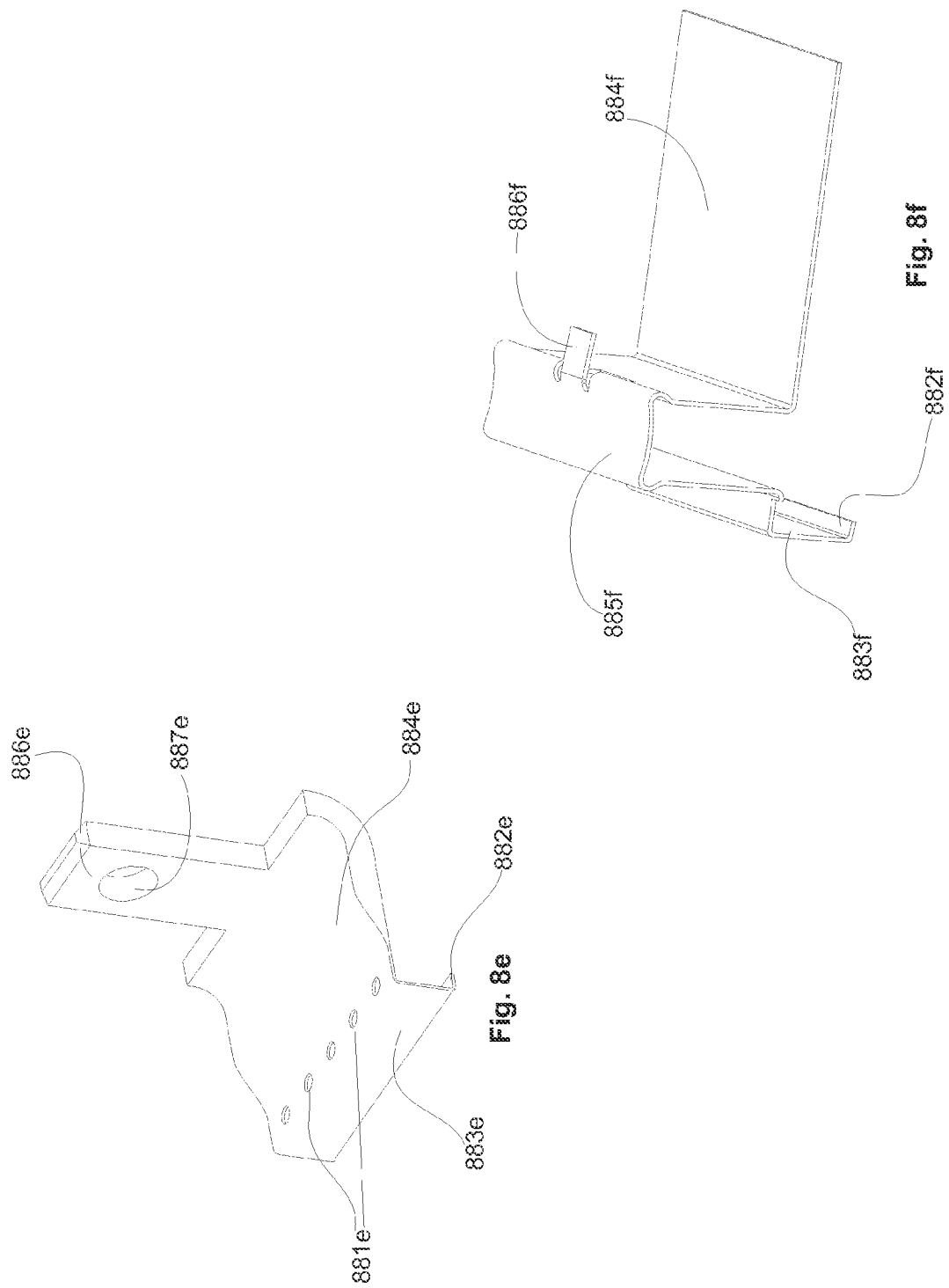

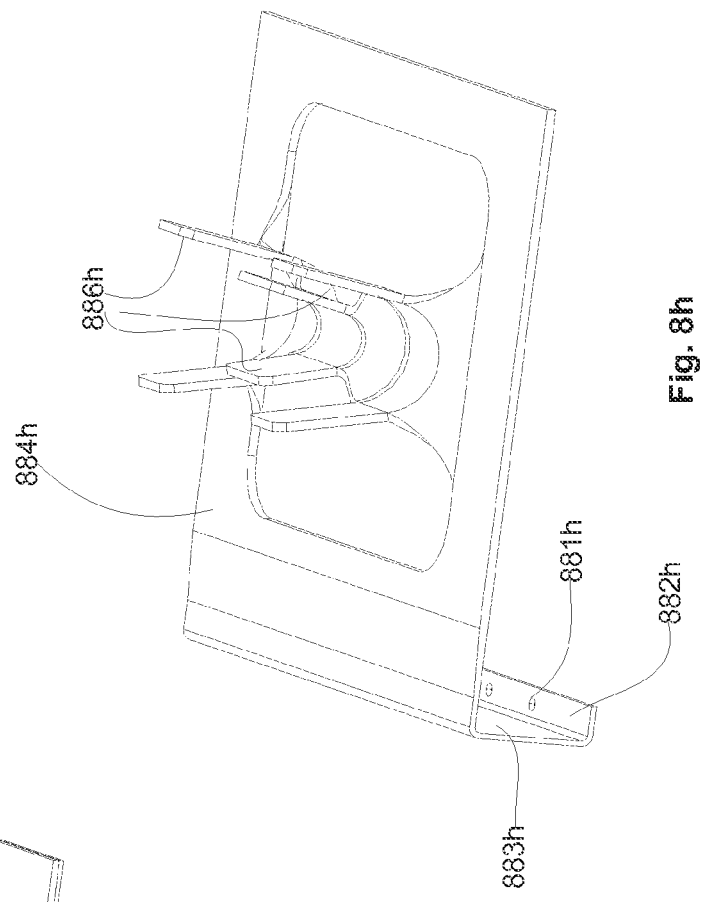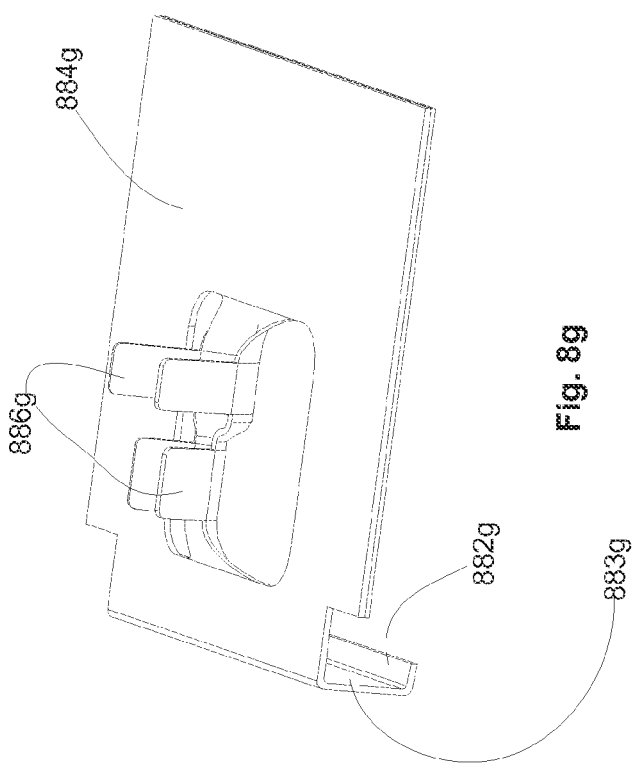

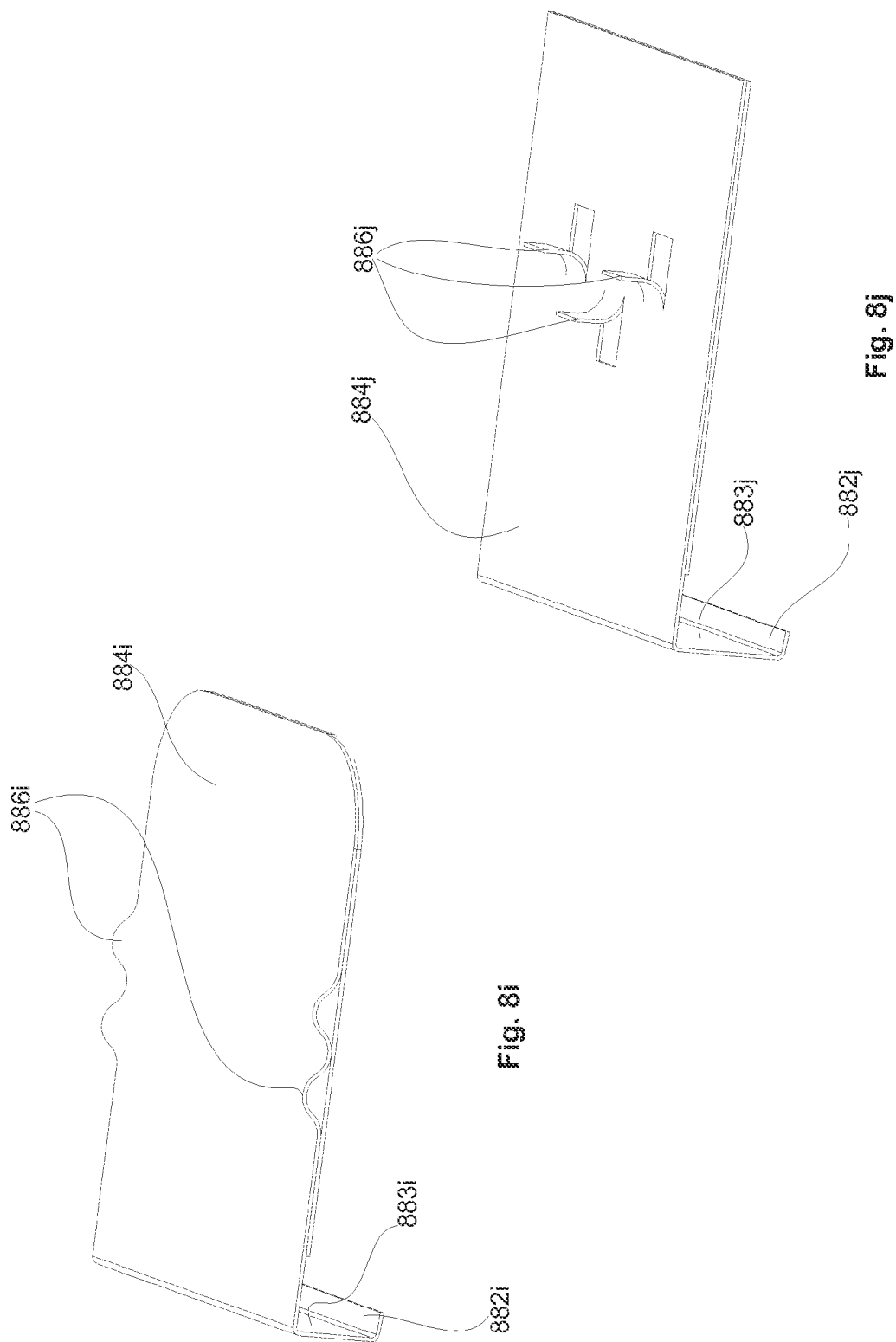

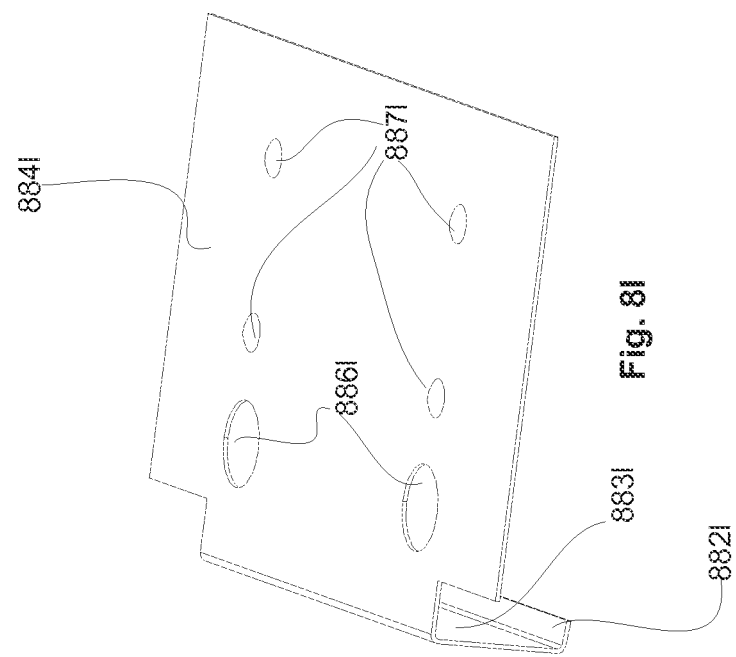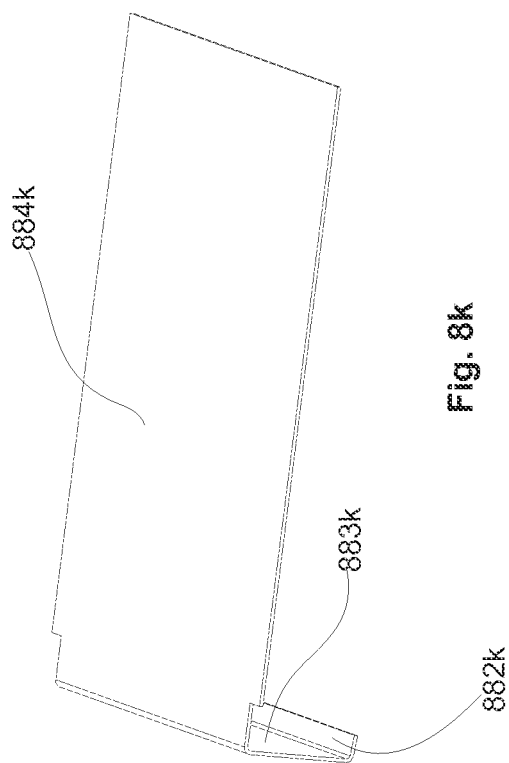

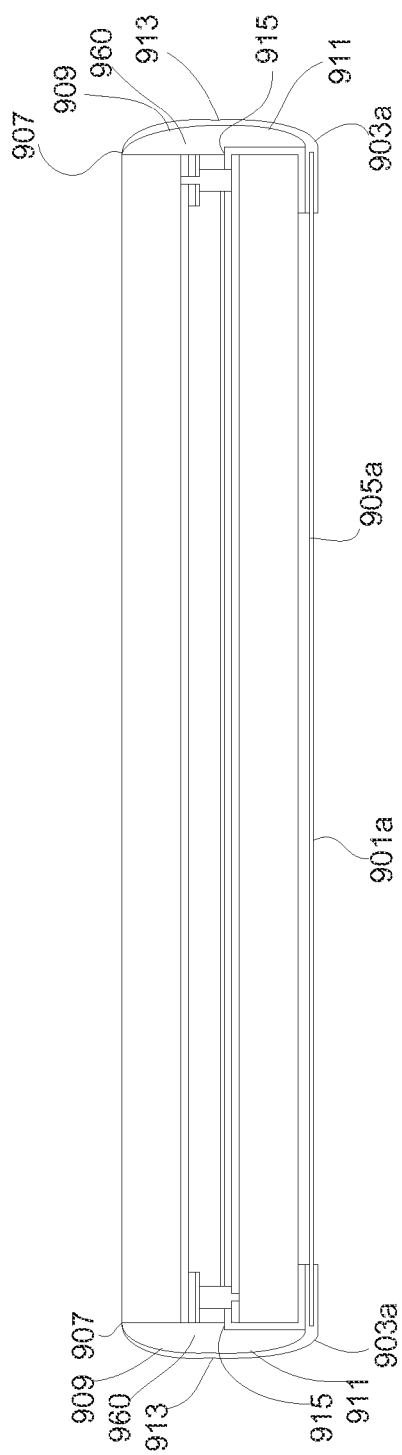
Fig. 9a
Fig. 9b
Fig. 9c

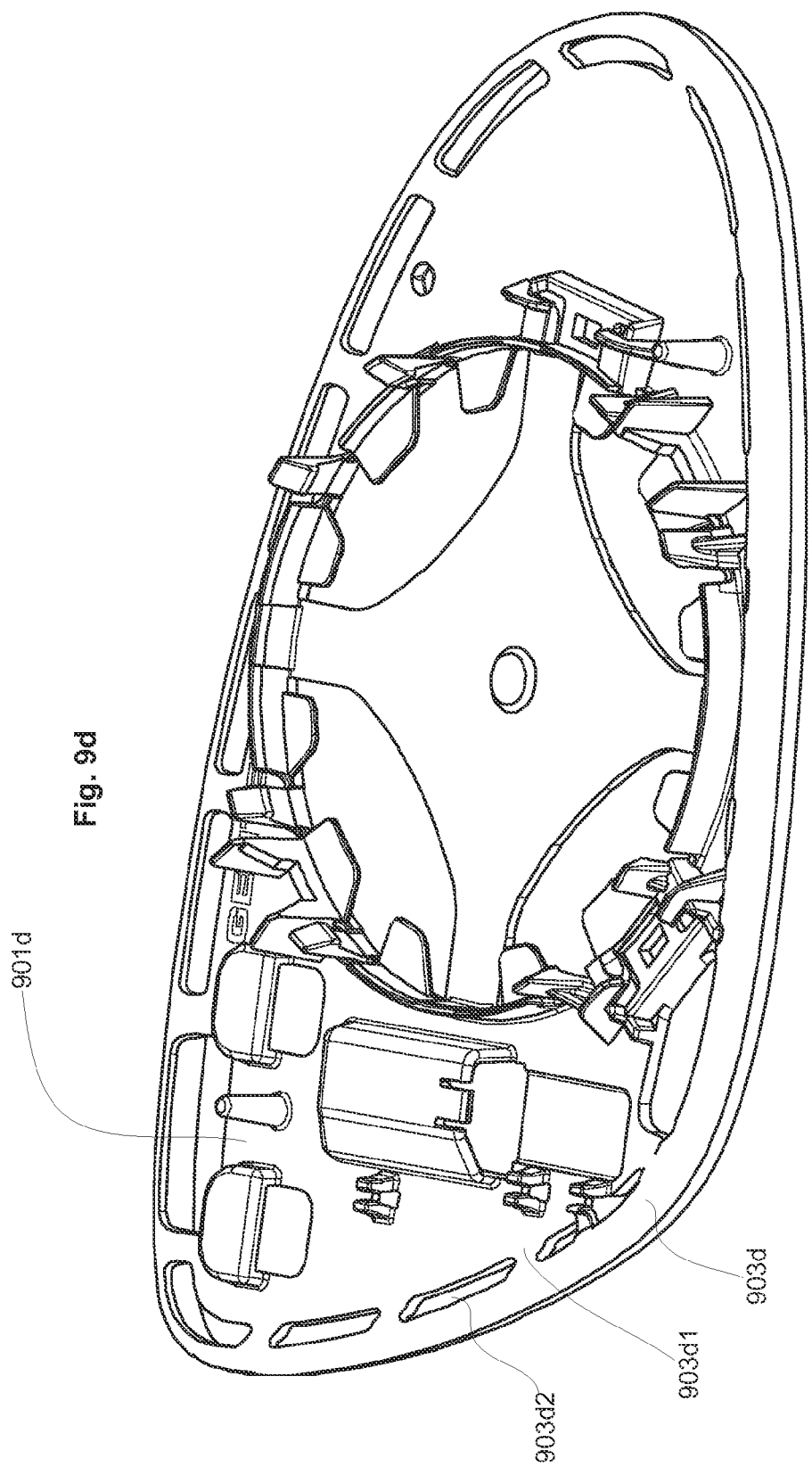

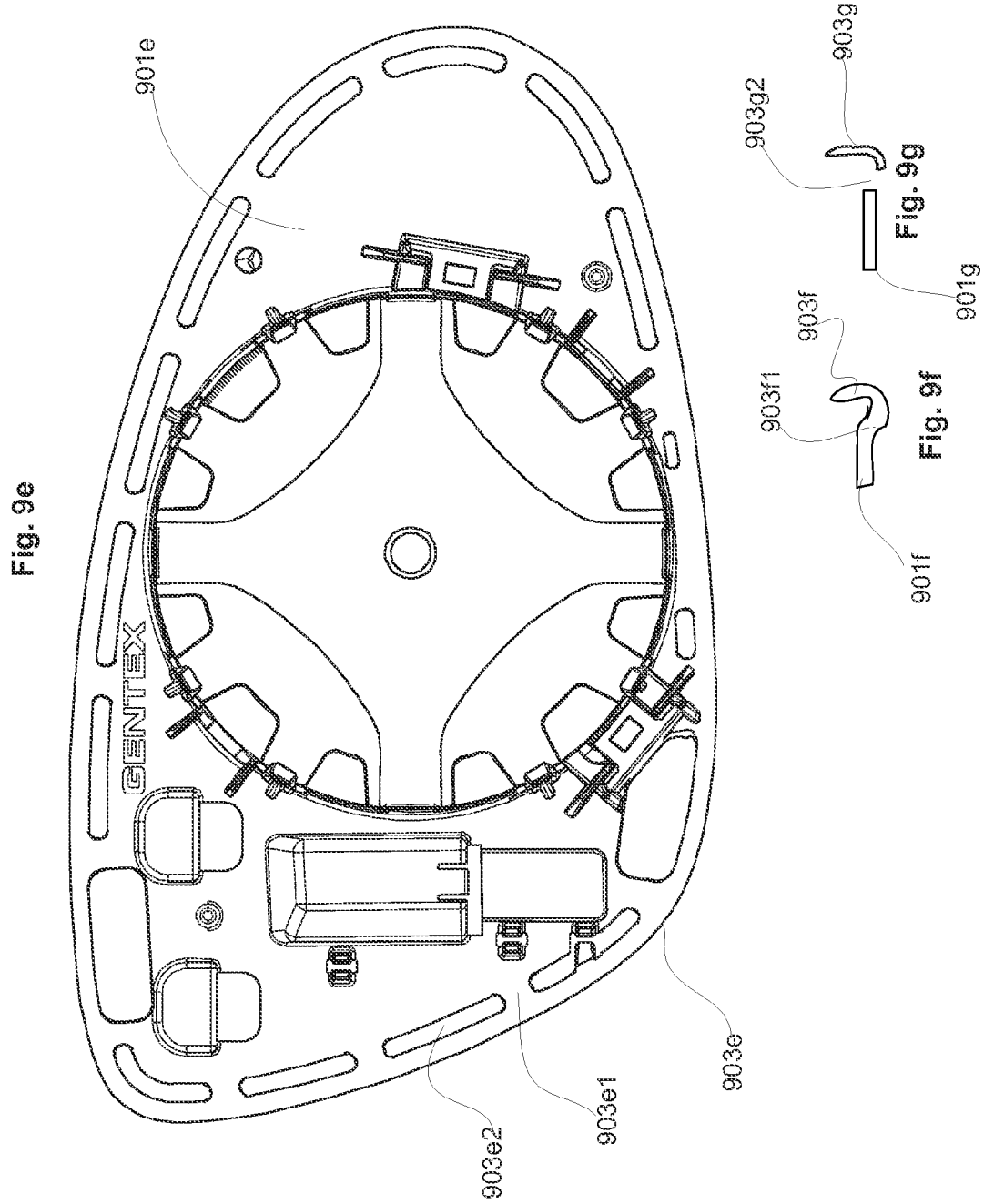

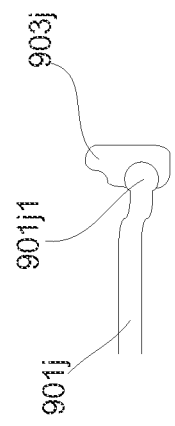
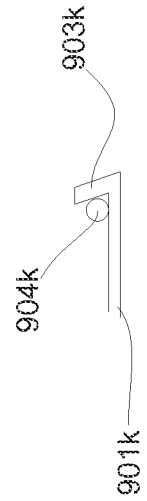
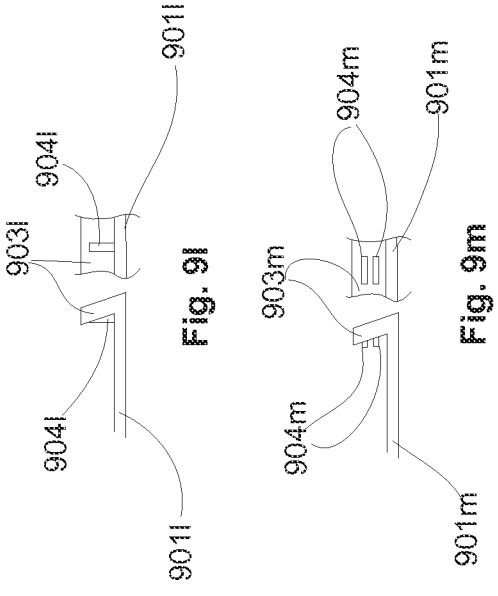
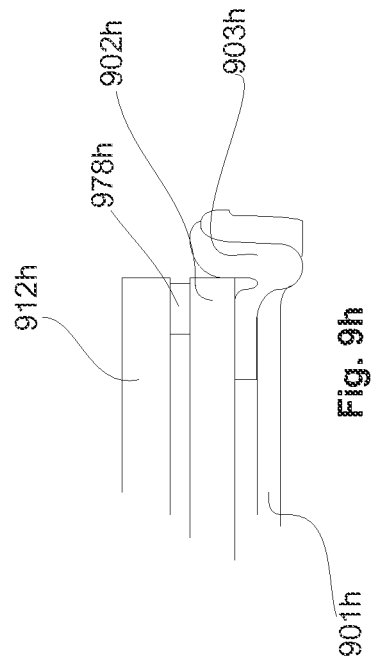
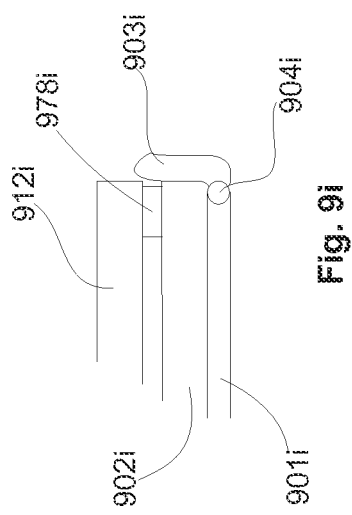

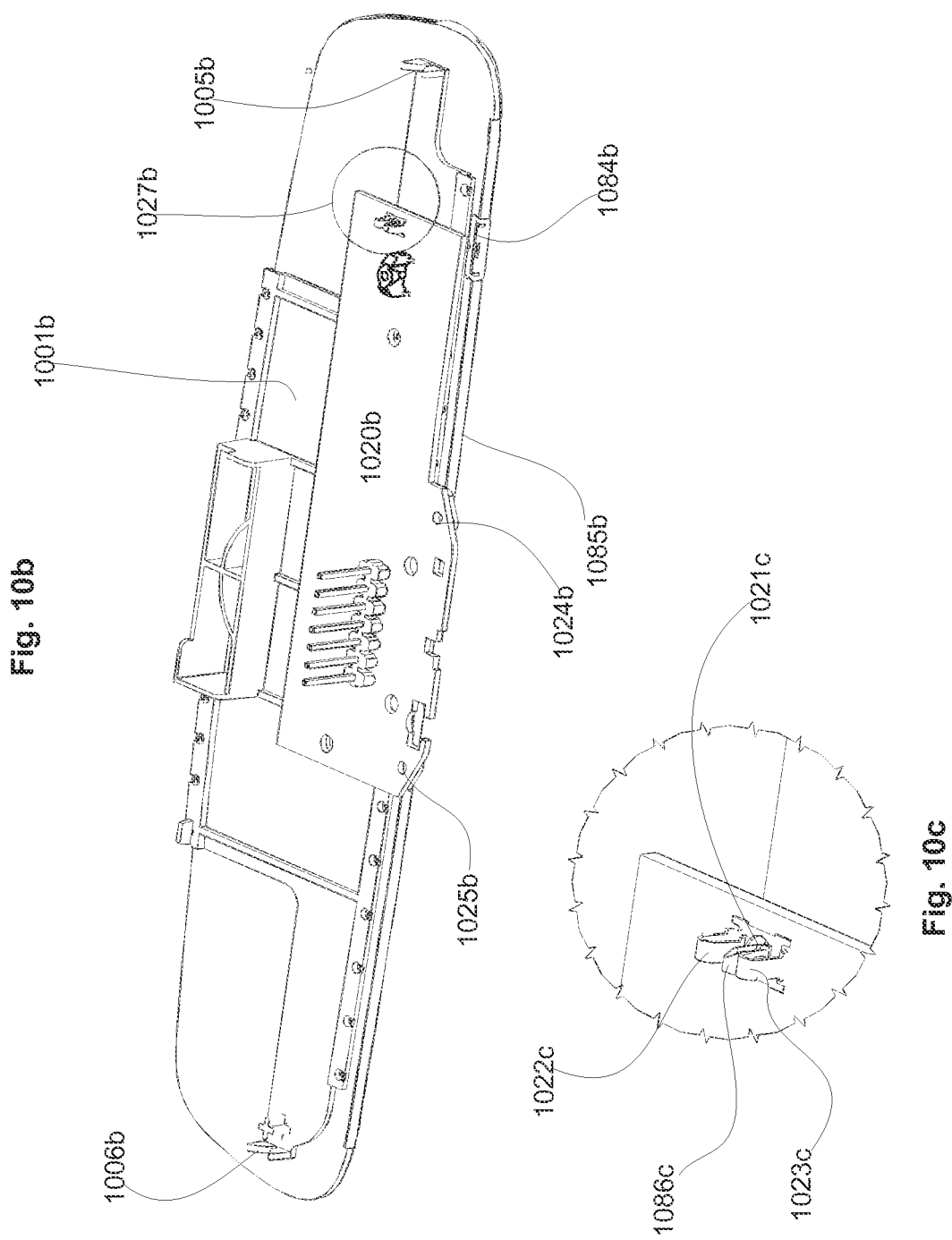

VEHICULAR REARVIEW MIRROR ELEMENTS AND ASSEMBLIES INCORPORATING THESE ELEMENTS

CROSS-REFERENCE TO RELATED APPLICATIONS

The present application is a divisional application under 35 U.S.C. §121 of U.S. application Ser. No. 14/164,505, filed on Jan. 27, 2014, which is a continuation under 35 U.S.C. §120 of U.S. application Ser. No. 13/188,042, filed on Jul. 21, 2011, now issued as U.S. Pat. No. 8,638,488, which is a continuation of U.S. application Ser. No. 12/505,458, filed on Jul. 17, 2009, now issued as U.S. Pat. No. 8,004,741, which is a continuation-in-part under 35 U.S.C. §120 of U.S. application Ser. No. 12/151,669, filed on May 8, 2008, now issued as U.S. Pat. No. 7,570,413, which is a continuation of U.S. application Ser. No. 11/066,903, filed on Feb. 25, 2005, now issued as U.S. Pat. No. 7,372,611. The above-mentioned U.S. application Ser. No. 12/505,458 is also a continuation-in-part of U.S. application Ser. No. 11/478,224, filed on Jun. 29, 2006, now issued as U.S. Pat. No. 7,602,542, which is a continuation-in-part of the U.S. application Ser. No. 11/066,903, filed on Feb. 25, 2005, now issued as U.S. Pat. No. 7,372,611, which claims priority under 35 U.S.C. §119(e) to U.S. Provisional Application Nos. 60/614,150, filed on Sep. 29, 2004, 60/605,111, filed on Aug. 27, 2004, and 60/548,472, filed on Feb. 27, 2004. Through the above-referenced non-provisional applications, the present divisional application also claims the benefit under 35 U.S.C. §119(e) of the U.S. Provisional Application Nos. 60/614,150, 60/605,111, and 60/548,472. In addition, the above-mentioned U.S. application Ser. No. 13/188,042 is also a continuation-in-part of U.S. application Ser. No. 12/832,838 filed on Jul. 8, 2010, now issued as U.S. Pat. No. 8,169,684, which is a continuation-in-part of U.S. application Ser. No. 12/750,357 filed on Mar. 30, 2010, now abandoned, which is a continuation of U.S. application Ser. No. 12/154,736, filed on May 27, 2008, now issued as U.S. Pat. No. 7,719,750 which is a continuation of U.S. application Ser. No. 11/477,312, filed on Jun. 29, 2006, now issued as U.S. Pat. No. 7,379,225, which is a continuation of U.S. application Ser. No. 11/066,903, filed on Feb. 25, 2005, now issued as U.S. Pat. No. 7,372,611, which is a continuation-in-part of U.S. application Ser. No. 10/430,885, filed on May 6, 2003, now issued as U.S. Pat. No. 7,324,261, which is a continuation-in-part of U.S. application Ser. No. 10/260,741, filed on Sep. 30, 2002, now issued as U.S. Pat. No. 7,064,882. The disclosure of each of the above-mentioned applications is incorporated herein by reference in its entirety.

BACKGROUND OF THE INVENTION

Electro-optic rearview mirror elements are becoming more common in vehicular applications with regard to both inside and outside, both driver's and passenger's side, rearview mirrors. Typical electro-optic elements, when incorporated in vehicular rearview mirror assemblies, will have an effective field of view (as defined by relevant laws, codes and specifications) that is less than the area defined by the perimeter of the element itself. Primarily, the effective field of view is limited, at least in part, by the construction of the element itself and, or, an associated bezel.

Various attempts have been made to provide an electro-optic element having an effective field of view substantially equal to the area defined by its perimeter. Assemblies incorporating these elements have also been proposed.

What is needed is an improved electro-optic mirror element. Improvements in assemblies incorporating these improved electro-optic mirror elements are also needed.

SUMMARY OF THE INVENTION

At least one embodiment of the present invention provides improved electro-optic mirror elements. A related embodiment has an effective field of view area substantially equal to the field of view associated with an area defined by the perimeter of the element.

At least one embodiment of the present invention provides improved assemblies incorporating electro-optic elements. A related embodiment has an effective field of view area substantially equal to the area of the element itself as defined by its outer most perimeter.

Other advantages of the present invention will become apparent while reading the detailed description of the invention in light of the figures and appended claims.

BRIEF DESCRIPTION OF THE FIGURES

FIG. 2a depicts an assembly incorporating an electro-optic element;

FIG. 3 depicts an inside rearview mirror assembly incorporating an electro-optic element;

FIGS. 4a-c depict first surface plan view, fourth surface plan view and section view of an electro-optic element, respectively;

FIG. 4d depicts a plan view of a fourth surface;

FIG. 4e depicts a plan view of a second substrate;

FIGS. 9a-m depict various views of carrier/bezel assemblies for use with electro-optic elements in a rearview mirror assembly; and FIGS. 10a-c depict various views of an electro-optic element/electrical circuit board interconnection.

DETAILED DESCRIPTION OF THE INVENTION

Figure 1:
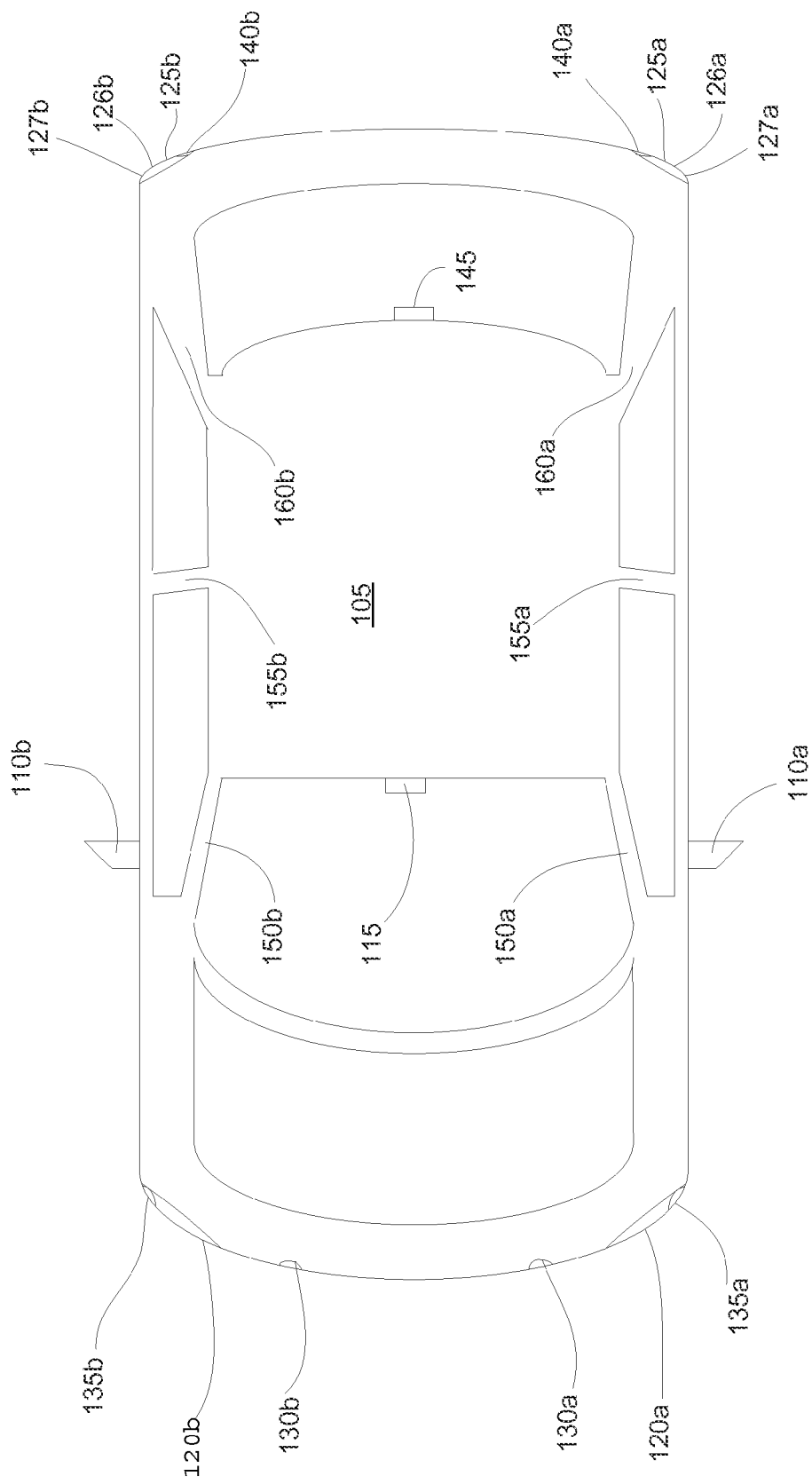
FIG. 1 depicts a controlled vehicle.

Referring initially to FIG. 1, there is shown a controlled vehicle 105 having a driver's side outside rearview mirror 110a, a passenger's side outside rearview mirror 110b and an inside rearview mirror 115. Details of these and other features will be described herein. Preferably, the controlled vehicle comprises an inside rearview mirror of unit magnification. Unit magnification mirror, as used herein, means a plane or flat mirror with a reflective surface through which the angular height and width of an image of an object is equal to the angular height and width of the object when viewed directly at the same distance with the exception for flaws that do not exceed normal manufacturing tolerances. A prismatic day-night adjustment rearview mirror wherein at least one associated position provides unit magnification is considered herein to be a unit magnification mirror. Preferably, the mirror provides a field of view with an included horizontal angle measured from the projected eye point of at least 20 degrees and a sufficient vertical angle to provide a view of a level road surface extending to the horizon beginning at a point not greater than 61 m to the rear of the controlled vehicle when the controlled vehicle is occupied by a driver and four passengers or the designated occupant capacity, if less, based on an average occupant weight of 68 kg. It should be understood that the line of sight may be partially obscured by seated occupants or by head restraints. The location of the driver's eye reference points are preferably in accordance with regulation or a nominal location appropriate for any 95th percentile male driver. Preferably, the controlled vehicle comprises at least one outside mirror of unit magnification. Preferably, the outside mirror provides a driver of a controlled vehicle a view of a level road surface extending to the horizon from a line, perpendicular to a longitudinal plane tangent to the driver's side of the controlled vehicle at the widest point, extending 2.4 m out from the tangent plane 10.7 m behind the driver's eyes, with the seat in the rearmost position. It should be understood that the line of sight may be partially obscured by rear body or fender contours of the controlled vehicle. Preferably, the locations of the driver's eye reference points are in accordance with regulation or a nominal location appropriate for any 95th percentile male driver. Preferably, the passenger's side mirror is not obscured by an unwiped portion of a corresponding windshield and is preferably adjustable by tilting in both horizontal and vertical directions from the driver's seated position. In at least one embodiment, the controlled vehicle comprises a convex mirror installed on the passenger's side. Preferably, the mirror is configured for adjustment by tilting in both horizontal and vertical directions. Preferable, each outside mirror comprises not less than 126 cm of reflective surface and is located so as to provide the driver a view to the rear along an associated side of the controlled vehicle. Preferably, the average reflectance of any mirror, as determined in accordance with SAE Recommended Practice J964, OCT84, is at least 35 percent (40% for many European Countries). In embodiments where the mirror element is capable of multiple reflectance levels, such as with electro-optic mirror elements in accordance with the present invention, the minimum reflectance level in the day mode shall be at least 35 (40 when for European use) percent and the minimum reflectance level in the night mode shall be at least 4 percent.

With further reference to FIG. 1, the controlled vehicle 105 may comprise a variety of exterior lights, such as, headlight assemblies 120a, 120b, foul conditions lights 130a, 130b, front turn signal indicators 135a, 135b, taillight assembly 125a, 125b, rear turn signal indicators 126a, 126b, rear emergency flashers 127a, 127b, backup lights 140a, 140b and center high mounted stop light (CHMSL) 145.

As described in detail herein, the controlled vehicle may comprise at least one control system incorporating various components that provide shared function with other vehicle equipment. An example of one control system described herein integrates various components associated with automatic control of the reflectivity of at least one rearview mirror element and automatic control of at least one exterior light. Such systems may comprise at least one image sensor within a rearview mirror, an A-pillar, a B-pillar, a C-pillar, a CHMSL or elsewhere within or upon the controlled vehicle. Images acquired, or portions thereof, maybe used for automatic vehicle equipment control. The images, or portions thereof, may alternatively, or additionally, be displayed on one or more displays. At least one display may be covertly positioned behind a transflective, or at least partially transmissive, electro-optic element. A common controller may be configured to generate at least one mirror element drive signal and at least one other equipment control signal.

Figure 2B:
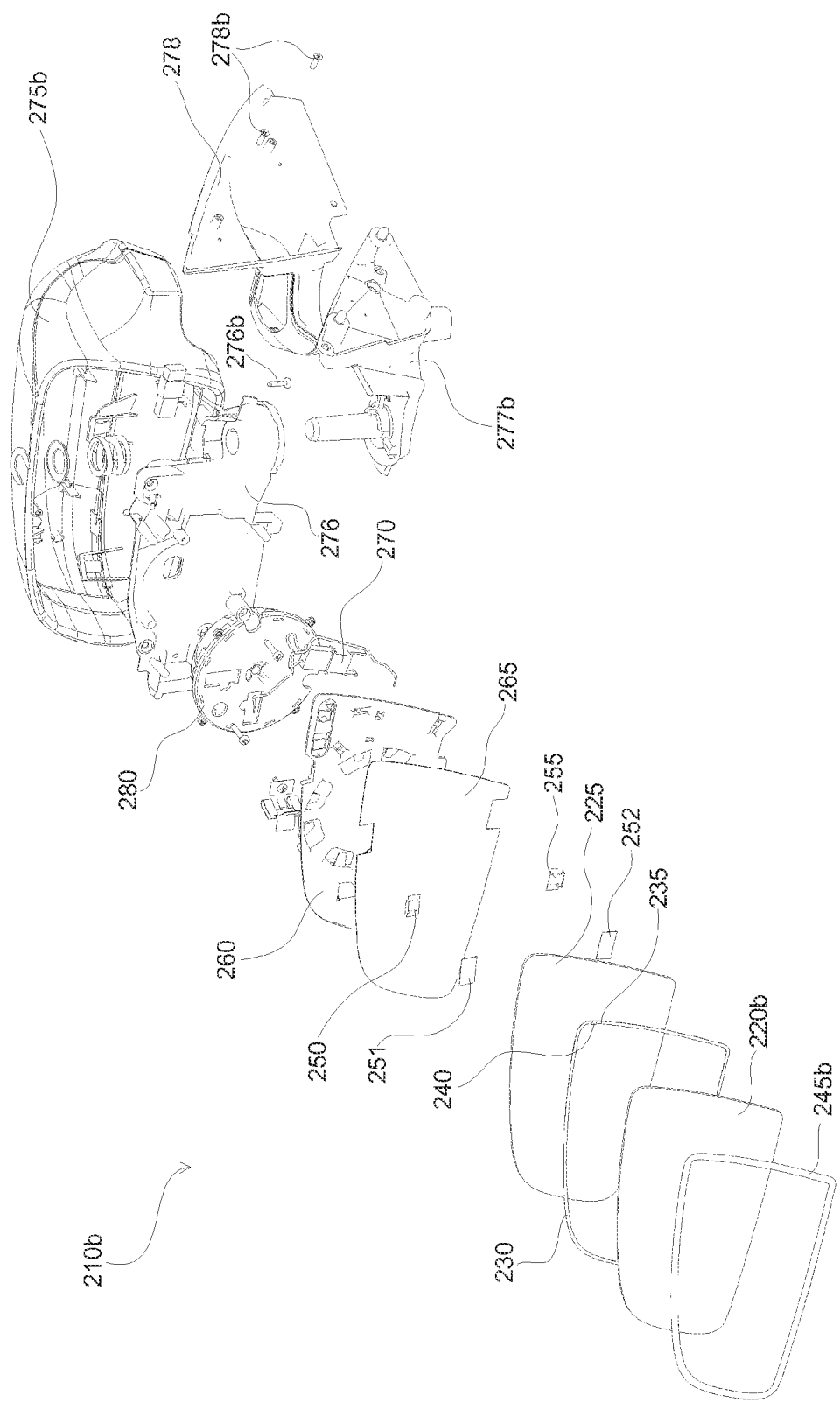
FIG. 2b depicts an exploded view of an outside rearview mirror.

Turning now to FIGS. 2a and 2b, various components of an outside rearview mirror assembly 210a, 210b are depicted. As described in detail herein, an electro-optic mirror element may comprise a first substrate 220a, 220b secured in a spaced apart relationship with a second substrate 225 via a primary seal 230 to form a chamber there between. At least a portion of the primary seal is left void to form at least one chamber fill port 235. An electro-optic medium is enclosed in the chamber and the fill port(s) are sealingly closed via a plug material 240. Preferably, the plug material is a UV curable epoxy or acrylic material. Also shown is a spectral filter material 245a, 245b located near the periphery of the element. Electrical clips 250, 255 are preferably secured to the element, respectively, via first adhesive material 251, 252. The element is secured to a carrier plate 260 via second adhesive material 265. Electrical connections from the outside rearview mirror to other components of the controlled vehicle are preferably made via a connecter 270. The carrier is attached to an associated housing mount 276 via a positioner 280. Preferably, the housing mount is engaged with a housing 275a, 275b and secured via at least one fastener 276a. Preferably the housing mount comprises a swivel portion configured to engage a swivel mount 277a, 277b. The swivel mount is preferably configured to engage a vehicle mount 278 via at least one fastener 278a. Additional details of these components, additional components, their interconnections and operation is provided herein.

With further reference to FIG. 2a, the outside rearview mirror assembly 210a is oriented such that a view of the first substrate 220a is shown with the spectral filter material 245a positioned between the viewer and the primary seal material (not shown). A blind spot indicator 285, a keyhole illuminator 290, a puddle light 292, a turn signal 294, a photo sensor 296, anyone thereof, a subcombination thereof or a combination thereof may be incorporated within the rearview mirror assembly such that they are positioned behind the element with respect to the viewer. Preferably, the devices 285, 290, 292, 294, 296 are configured in combination with the mirror element to be at least partially covert as discussed in detail within various references incorporated by reference herein. Additional details of these components, additional components, their interconnections and operation are provided herein.

Turning now to FIG. 3, there is shown an inside rearview mirror assembly 310 as viewed looking at the first substrate 320 with a spectral filter material 345 positioned between the viewer and a primary seal material (not shown). The mirror element is shown to be positioned within a movable housing 375 and combined with a stationary housing 377 on a mounting structure 381. A first indicator 386, a second indicator 387, operator interfaces 391 and a first photo sensor 396 are positioned in a chin portion of the movable housing. A first information display 388, a second information display 389 and a second photo sensor 397 are incorporated within the assembly such that they are behind the element with respect to the viewer. As described with regard to the outside rearview mirror assembly, it is preferable to have devices 388, 389, 397 at least partially covert. For example, a "window" may be formed in the associated mirror element third and, or, fourth surface coatings and configured to provide a layer of a platinum group metal (PGM) (i.e. iridium, osmium, palladium, platinum, rhodium, and ruthenium) only on the third surface. Thereby, light rays impinging upon the associated "covert" photo sensor "glare" will first pass through the first surface stack, if any, the first substrate, the second surface stack, the electro-optic medium, the platinum group metal and, finally, the second substrate. The platinum group metal functions to impart continuity in the third surface conductive electrode, thereby, reducing electro-optic medium coloring variations associated with the window.

Turning now to FIGS. 4a-4e and 5, a discussion of additional features of the present invention is provided. FIG. 4a depicts a rearview mirror element 400a viewed from the first substrate 402a with a spectral filter material 496a positioned between the viewer and a primary seal material 478a. A first separation area 440a is provided to substantially electrically insulate a first conductive portion 408a from a second conductive portion 430a. A perimeter material 460a is applied to the edge of the element. FIG. 4b depicts a rearview mirror element 400b viewed from the second substrate 412b with a primary seal material 478b positioned between the viewer and a spectral filter material 496b. A second separation area 486b is provided to substantially electrically insulate a third conductive portion 418b from a fourth conductive portion 487b. A perimeter material 460b is applied to the edge of the element. FIG. 4c depicts a rearview mirror element 400c viewed from a section line FIG. 4c-FIG. 4c of either the element of FIG. 4a or 4b. A first substrate 402c is shown to be secured in a spaced apart relation via a primary seal material 478c with a second substrate 412c. A spectral filter material 496c is positioned between a viewer and the primary seal material 478c. First and second electrical clips 463c, 484c, respectively, are provided to facilitate electrical connection to the element. A perimeter material 460c is applied to the edge of the element. It should be understood that the primary seal material may be applied by means commonly used in the LCD industry such as by silk-screening or dispensing. U.S. Pat. No. 4,094,058, to Yasutake et al., the disclosure of which is incorporated in its entirety herein by reference, describes applicable methods. Using these techniques the primary seal material may be applied to an individually cut to shape substrate or it can be applied as multiple primary seal shapes on a large substrate. The large substrate with multiple primary seals applied may then be laminated to another large substrate and the individual mirror shapes can be cut out of the laminate after at least partially curing the primary seal material. This multiple processing technique is a commonly used method for manufacturing LCD's and is sometimes referred to as an array process. Electro-optic devices can be made using a similar process. All coatings such as the transparent conductors, reflectors, spectral filters and in the case of solid state electro-optic devices the electro-optic layer or layers may be applied to a large substrate and patterned if necessary. The coatings can be patterned using a number of techniques such as by applying the coatings through a mask, by selectively applying a patterned soluble layer under the coating and removing it and the coating on top of it after coating application, laser ablation or etching. These patterns can contain registration marks or targets that can be used to accurately align or position the substrates throughout the manufacturing process. This is usually done optically for instance with a vision system using pattern recognition technology. The registration marks or targets may also be applied to the glass directly such as by sand blasting, laser or diamond scribing if desired. Spacing media for controlling the spacing between the laminated substrates may be placed into the primary seal material or applied to a substrate prior to lamination. The spacing media or means may be applied to areas of the laminate that will be cut away from the finished singulated mirror assemblies. The laminated arrays can be cut to shape before or after filling with electro-optic material and plugging the fill port if the devices are solution phase electro-optic mirror elements.

FIG. 4d depicts a plan view of a second substrate 412d comprising a stack of materials on a third, fourth or both third and fourth surfaces. In at least one embodiment, at least a portion 420d1 of a stack of materials, or at least the substantially opaque layers of a stack of materials, are removed, or masked, beneath the primary seal material. At least a portion 420d2 of at least a layer of the stack of materials extends substantially to the outer edge of the substrate or extends to an area to facilitate electrical contact between the third surface stack and an element drive circuit (not shown). Related embodiments provide for inspection of the seal and, or, plug viewing and, or, plug curing the rear of the element subsequent to element assembly. In at least one embodiment, at least a portion of an outer edge 420d1 of a stack of materials 420d is located between an outer edge 478d1 and an inner edge 478d2 of a primary seal material 478d. In at least one embodiment, the portion 420d1 of a stack of materials, or at least the substantially opaque layers of a stack of materials, are removed, or masked, beneath the primary seal material between approximately 2 mm and approximately 8 mm wide, preferably approximately 5 mm wide. At least a portion 420d2 of at least a layer of the stack of materials extends substantially to the outer edge of the substrate or extends to an area to facilitate electrical contact between the third surface stack and an element drive circuit (not shown) between approximately 0.5 mm and approximately 5 mm wide, preferably approximately 1 mm. It should be understood that any of the first, second, third and fourth surface layers or stacks of materials may be as disclosed herein or within the references incorporated elsewhere herein by reference.

Figure 7K:
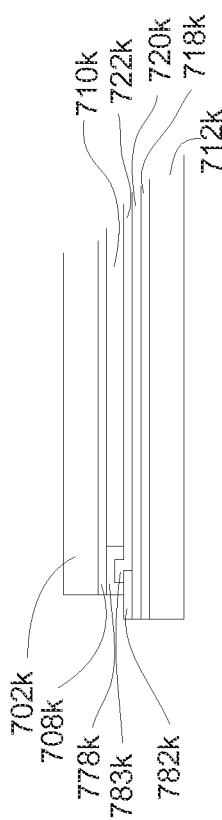
FIGS. 7a-n depicts various techniques for establishing external electrical connections to the second and third surface conductive electrodes.

FIG. 4e depicts a plan view of a second substrate 412e comprising a third surface stack of materials. In at least one embodiment, at least a portion of an outer edge 420e1 of a third surface stack of materials 420e is located between an outer edge 478e1 and an inner edge 478e2 of a primary seal material 478e. In at least one related embodiment, a conductive tab portion 482e extends from an edge of the second substrate inboard of an outer edge 478e1 of a primary seal material 478e. In at least one related embodiment, a conductive tab portion 482e1 overlaps with at least a portion of a third surface stack of materials beneath a primary seal material 478e. In at least one embodiment, a substantially transparent conductive layer (not shown individually), such as a conductive metal oxide, of a third surface stack of materials extends beyond an outer edge 420e1 of a remainder of the third surface stack and is in electrical communication with a conductive tab portion as depicted in FIG. 7k. It should be understood that the conductive tab may be deposited along any of the substrate peripheral areas as shown in FIGS. 7d-7n. In at least one embodiment, a conductive tab portion comprises chrome. It should be understood that the conductive tab portion improves conductivity over the conductive electrode; as long as a conductive electrode layer is provided with sufficient conductivity, the conductive tab portion is optional. In at least one embodiment, the conductive electrode layer imparts the desired color specific characteristics of the corresponding reflected light rays in addition to providing the desired conductivity. Therefore, when the conductive electrode is omitted, color characteristics are controlled via the underlayer material specifications. It should be understood that any of the first, second, third and fourth surface layers or stacks of materials may be as disclosed herein or within the references incorporated elsewhere herein by reference.

Figure 5:
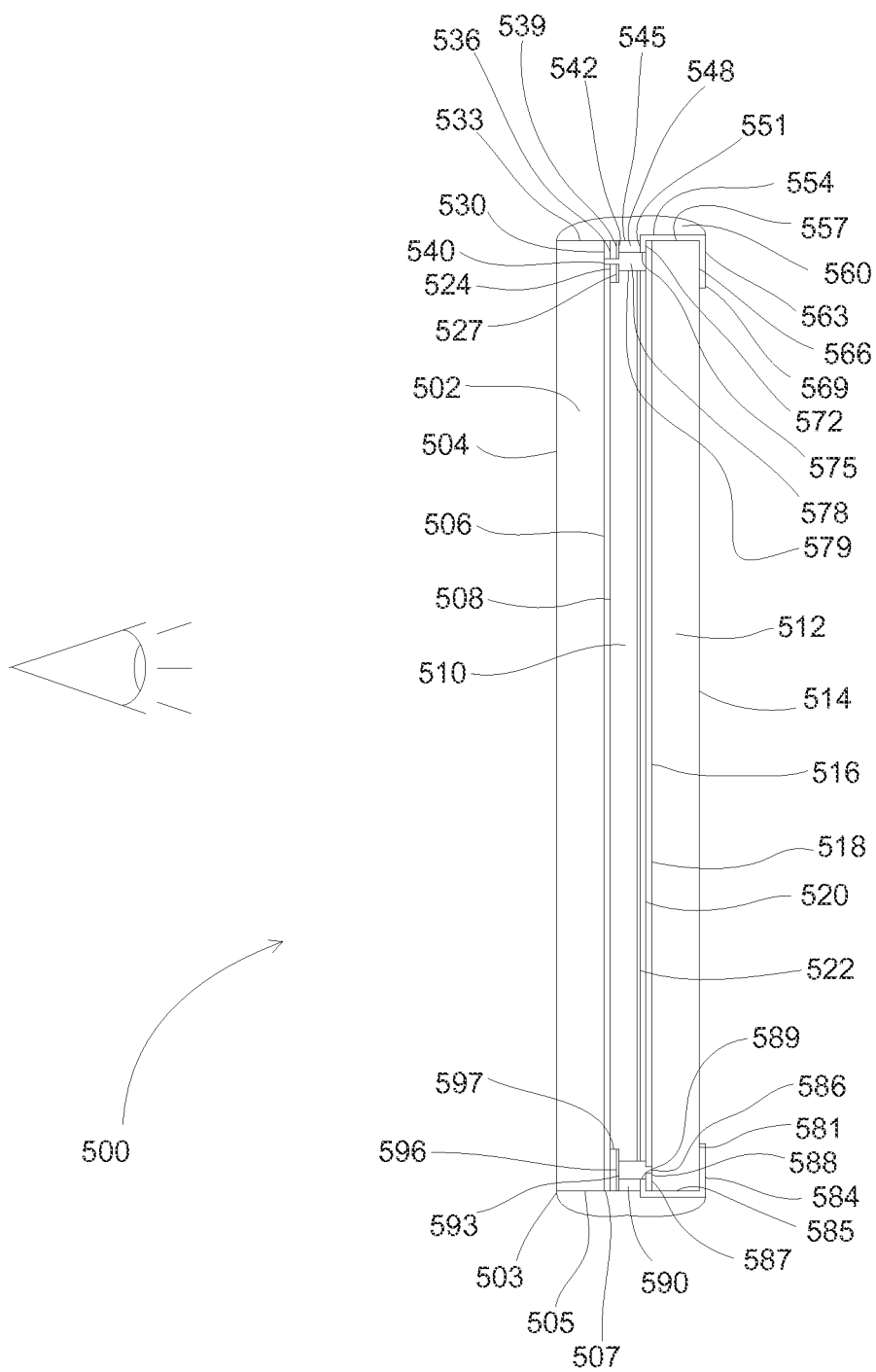
FIG. 5 depicts an enlarged view of FIG. 4c.

FIG. 5 depicts rearview mirror element 500 which is an enlarged view of the element depicted in FIG. 4c to provide greater detail. Element 500 comprises a first substrate 502 having a first surface 504 and a second surface 506. A first conductive electrode portion 508 and a second conductive electrode portion 530 applied to the second surface 506 are substantially electrically insulated from one another via a first separation area 540. As can be seen, in at least one embodiment the separation area is located such that the spectral filter material 596 and a corresponding adhesion promotion material 593 are also substantially electrically insulated to define first and second spectral filter material portions 524, 536, respectively, and first and second adhesion promotion material portions 527, 539, respectively. A portion of the first separation area 540, 440a, 440b, 440c is shown to be extending parallel within a portion of the primary seal material 578 located near the center thereof. It should be understood that this portion of the separation area 540 may lie such that a viewer would not readily perceive a line within the spectral filter material; for example, a portion of the separation area may be substantially aligned with an inboard edge 597 of spectral filter material 596. It should be understood that when any portion of the separation area 540 is located inboard of the primary seal material, as is described in more detail elsewhere herein, a discontinuity in the electro-optic material coloring and, or, clearing may be observed. This operational characteristic may be manipulated to derive a subjectively visually appealing element.

With further reference to FIG. 5, the element 500 is depicted to comprise a second substrate 512 having a third surface 515 and a fourth surface 514. It should be noted that the first substrate may be larger than the second substrate to create an offset along at least a portion of the perimeter of the mirror. Third and fourth conductive electrode portions 518, 587, respectively, are shown proximate the third surface 515 substantially electrically insulated via second separation area 586. A portion of the second separation area 586, 486a, 486b, 486c is shown to be extending parallel within a portion of the primary seal material 578 located near the center thereof. It should be understood that this portion of the separation area 586 may lie such that a viewer would not readily perceive a line within the spectral filter material; for example, a portion of the separation area may be substantially aligned with an inboard edge 597 of spectral filter material 596. As further shown in FIG. 5, a reflective material 520 may be applied between an optional overcoat material 522 and the third conductive electrode portion 518. It should be understood that any of the materials as disclosed in commonly assigned U.S. Pat. Nos. 6,111,684, 6,166,848, 6,356,376, 6,441,943, Ser. No. 10/115,860 U.S. Pat. Nos. 5,825,527, 6,111,683, 6,193,378, Ser. Nos. 09/602,919, 10/260,741 and 10/430,885, the disclosures of which are incorporated herein by reference in their entirety, may be employed to define a unitary surface coating, such as a hydrophilic coating on a first surface, or a composite stack of coatings, such as conductive electrode material, spectral filter material, adhesion promotion material, reflective material, overcoat material applied to the first, second, third and fourth surfaces. It should be additionally understood that a hydrophobic coating, such as, a fluorinated alkyl saline or polymer, a silicone containing coating or a specially textured surface may be applied to the first surface. Either a hydrophilic or hydrophobic coating will alter the contact angle of moisture impinging upon the first surface relative to glass with no such coating and will enhance rear vision when moisture is present. It should be understood that both third surface and fourth surface reflector embodiments are within the scope of the present invention. In at least one embodiment, the materials applied to the third surface and, or, fourth surface are configured to provide a partially reflective/partially transmissive characteristic for at least a portion of the corresponding surface stack. In at least one embodiment, the materials applied to the third surface are integrated to provide a combination reflector/conductive electrode. It should be understood that additional "third surface" materials may extend outboard of the primary seal, in which case, it should be understood that the corresponding separation area extend through the additional materials. Having at least a portion of the primary seal visible from the fourth surface, as depicted in FIG. 4d for example, facilitates inspection and UV curing of plug material. In at least one embodiment, at least a portion of a stack of materials 420d, or at least the substantially opaque layers of a stack of materials, are removed, or masked, beneath the primary seal material to provide for inspection of at least 25% of the primary seal width around at least a portion of the perimeter. It is more preferred to provide for inspection of 50% of the primary seal width around at least a portion of the perimeter. It is most preferred to provide for inspection of at least 75% of the primary seal width around at least a portion of the perimeter. Various embodiments of the present invention will incorporate portions of a particular surface having a coating or stack of coatings different from other portions; for example, a "window" in front of a light source, information display, a photo sensor, or a combination thereof may be formed to selectively transmit a particular band of light ray wavelengths or bands of light ray wavelengths as described in many of the references incorporated herein.

With further reference to FIGS. 4a-4b and 5, the first separation area 540 cooperates with a portion of the primary seal material 575 to define the second conductive electrode portion 530, the second spectral filter material portion 536 and the second adhesion promotion material portion 539 substantially electrically insulated from the first conductive electrode portion 508, the first spectral filter material portion 524 and first adhesion promotion material portion 527. This configuration allows for placement of an electrically conductive material 548 such that the first electrical clip 563 is in electrical communication with the third conductive electrode portion 518, the reflective material 520, the optional overcoat 522 and the electro-optic medium 510. It should be apparent, particularly in embodiments wherein the electrically conductive material 548 is applied to the element prior to placement of the first electrical clip 569, that electrically conductive material may at least partially separate the interfaces 557, 566, 572, 575. Preferably, the material, or composition of materials, forming the third conductive electrode portion 518, the first electrical clip 563 and the electrically conductive material 548 are chosen to promote durable electrical communication between the clip and the materials leading to the electro-optic medium. The second separation area 586 cooperates with a portion of the primary seal material 575 to define the fourth conductive electrode portion 587 substantially electrically insulated from the third conductive electrode portion 518, the reflective layer 520, the optional overcoat material 522 and the electro-optic medium 510. This configuration allows for placement of an electrically conductive material 590 such that the second electrical clip 584 is in electrical communication with the first adhesion promotion material portion 527, the first spectral filter material portion 524, the first conductive electrode portion 508 and the electro-optic medium 510. It should be apparent, particularly in embodiments wherein the electrically conductive material 590 is applied to the element prior to placement of the first electrical clip 584, that electrically conductive material may at least partially separate the interfaces 585, 588, 589. Preferably, the material, or composition of materials, forming the first conductive electrode portion 508, the first electrical clip 584, the adhesion promotion material 593, the spectral filter material 596 and the electrically conductive material 590 are chosen to promote durable electrical communication between the clip and the materials leading to the electro-optic medium.

Preferably, the perimeter material 560 is selected such that the resulting visible edge surface is visually appealing and such that good adhesion is obtained at interfaces 533, 545 554. It should be understood that at least a portion of the first substrate 502 in the areas proximate the first corner 503, the edge 505, the second corner 507 and combinations thereof may be treated to smooth protrusions and depressions noticeable to a viewer. It is within the scope of the present invention to treat at least a portion of a surface, a corner, an edge or a combination thereof to define "beveled," "rounded," or combinations thereof. Commonly assigned U.S. patent application Ser. Nos. 10/260,741 and 10/430,885 describe various mechanisms for carrying out the edge treatment. The corresponding treatment improves the visual appearance and durability of the element.

Figure 6:
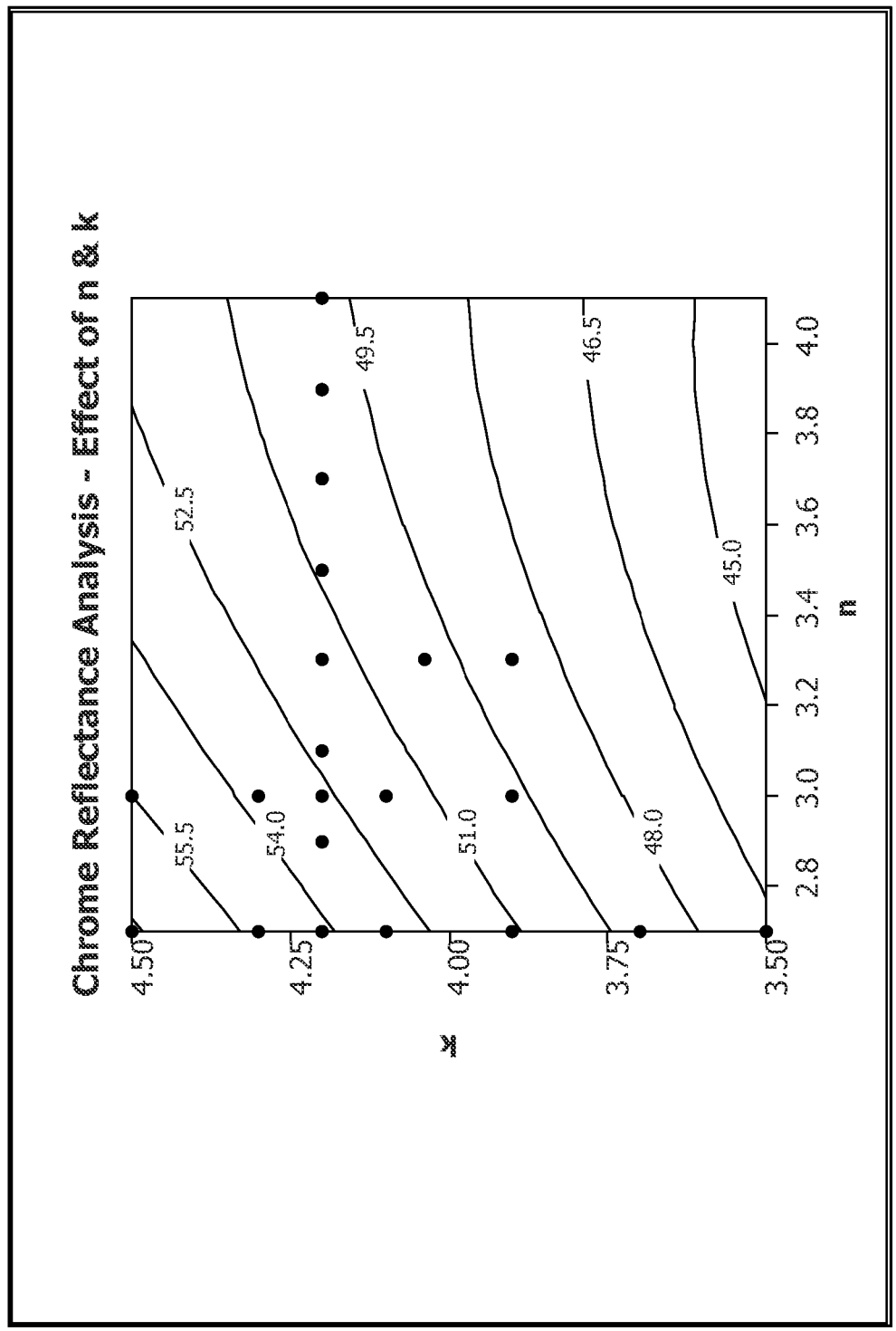
FIG. 6 depicts a graph of color related characteristics for various electro-optic element components.

Turning to FIG. 6 and Tables 1-4a, the color rendered as a result of having an indium-tin-oxide conductive electrode between the second surface of the first substrate and a spectral filter material, or ring, is described. In the example mirror element description contained herein, the reflectivity associated with the spectral filter material with respect to that of the third surface reflector results, in at least one embodiment, in a more blue hue for the spectral filter material when the electro-optic medium is in a "clear" state. As depicted in the Tables contained herein, the b* of the reflector is higher than the b* of the spectral filter material. When there is mismatch between the hue of the main reflector and spectral filter material it is often desirable to have a spectral filter material with a lower b* value than the main reflective area. Many outside mirrors are designed to have a bluish hue in the main reflective area. As described in at least one embodiment herein, use of aluminum in combination with, or in lieu of, chrome for the spectral filter material provides additional color rendering options. Other options, or embodiments, are depicted with and provide a better match between the ring and the mirror viewing area. In these other cases the spectral filter or ring has virtually identical reflectance and color allowing a seamless match between the viewing area and the ring.

Table 1 summarizes various color characteristics, namely, Y specular included (A10); a*; b*; C* and Y specular excluded, for seven uniquely configured spectral filter materials, second surface conductive electrode and related materials.

Tables 1a through 1d contain variations for the spectral filter materials. The reflectance is in CIE-D65. Individual layers thicknesses are in nanometers. Table 1a shows the effect of chrome thickness on the stack Glass/ITO/Cr/Ru/Rh. The reflectance of the stack increases as the thickness of the chrome is thinned. In this example the refractive index of the chrome is n=3.4559 and k=3.9808. Where n represents the real portion and k represents the imaginary portion of a complex number. The refractive index of the chrome in part defines the reflectivity of the stack and will be discussed in more detail later. Also as the chrome is thinned the reflected a* values increase leading to a better match for the ring material.

In at least one embodiment, the reflectivity of the spectral filter is increased by putting Rhodium next to the first chrome layer instead of Ruthenium. Table 1b shows the effect of chrome thickness on the reflectance and color of the ring as the chrome thickness is changed. Again, like the previous example, the reflectance increases as the chrome layer is thinned. This example is preferred when the reflectance of the center of the mirror reflectance is relatively high.

Typical production mirror properties are shown below:

| Full Mirror Reference Color | | | |
|---|---|---|---|
| | Reflectance | a* | b* |
| Typical Outside Mirror | 56.3 | −2.2 | 2.4 |
| Typical Inside Mirror | 85.0 | −3.0 | 5.0 |

TABLE 1a alternate stacks - chrome thickness with ruthenium

| Run # | ITO | Cr | Ru | Rh | Cr | Ru | Rh | CIE-D65 R | a* | b* |
|---|---|---|---|---|---|---|---|---|---|---|
| 1 | 118 | 60 | 20 | 3.5 | | | | 45.5 | −6.1 | −3.1 |
| 2 | 118 | 20 | 20 | 3.5 | | | | 47.5 | −4.9 | −2.8 |
| 3 | 118 | 10 | 20 | 3.5 | | | | 50.24 | −4.3 | −2.3 |
| 4 | 118 | 5 | 20 | 3.5 | | | | 51.16 | −4.3 | −2.1 |
| 5 | 118 | 2.5 | 20 | 3.5 | | | | 51.17 | −4.3 | −1.9 |

TABLE 1b alternate stacks - chrome thickness with rhodium/ruthenium

| Run # | ITO | Cr | Ru | Rh | Cr | Ru | Rh | CIE-D65 R | a* | b* |
|---|---|---|---|---|---|---|---|---|---|---|
| 17 | 118 | 0 | | 5 | | 30 | | 59.82 | −3.3 | −0.14 |
| 18 | 118 | 2.5 | | 5 | | 30 | | 57.36 | −3.2 | −0.6 |
| 19 | 118 | 5 | | 5 | | 30 | | 54.9 | −3.3 | −1.1 |
| 20 | 118 | 7.5 | | 5 | | 30 | | 52.64 | −3.6 | −1.6 |
| 21 | 118 | 10 | | 5 | | 30 | | 50.66 | −3.9 | −2.2 |
| 22 | 118 | 12.5 | | 5 | | 30 | | 49.02 | −4.3 | −2.6 |

Table 1c depicts the effect of Ruthenium thickness when a thin Rhodium layer is used next to a thin chrome layer. A particular benefit is attained when the Ruthenium is approximately 20 nm. The minimum requirement of Ruthenium will vary with Rhodium thickness, the thin chrome thickness and the target reflectivity value.

TABLE 1c alternate stacks - varying ruthenium behind rhodium

| Run # | ITO | Cr | Ru | Rh | Cr | Ru | Rh | CIE-D65 R | a* | b* |
|---|---|---|---|---|---|---|---|---|---|---|
| 11 | 118 | 5 | | 2.5 | | 0 | | 19.63 | −8.5 | −3.4 |
| 12 | 118 | 5 | | 2.5 | | 10 | | 44.46 | −4.7 | −2.8 |
| 13 | 118 | 5 | | 2.5 | | 20 | | 52.9 | −3.7 | −1.6 |
| 14 | 118 | 5 | | 2.5 | | 30 | | 53.97 | −3.6 | −1.3 |
| 15 | 118 | 5 | | 2.5 | | 40 | | 53.4 | −3.9 | −1.6 |

Table 1d depicts the how the reflectance will change with Rhodium thickness at a fixed chrome and Ruthenium thickness. The intensity of the reflectance increases with increasing Rhodium thickness and the reflected a* increases. The increase in the reflected a* may be exploited to help improve the color match between the center of glass and the ring. The change in reflectance with changing Rhodium thickness will differ depending on the thickness of the chrome layer between the Rhodium and the ITO. The thicker the chrome layer, the more the Rhodium reflectance will be dampened. Also in Table 1d are alternate metals between a thin and thick chrome layer. Palladium, Iridium, Cadmium and Platinum are shown. The reflectance versus metal thickness is shown along with the effect of changing the thin chrome base layer thickness.

TABLE 1d alternate stacks - varying rhodium thickness

| Run # | ITO | Cr | Ru | Rh | Cr | Ru | Rh | CIE-D65 R | a* | b* |
|---|---|---|---|---|---|---|---|---|---|---|
|  | 118 | 5 |  | 0 |  | 30 |  | 52.59 | −4 | −1.6 |
| 14 | 118 | 5 | 2.5 |  |  | 30 |  | 53.97 | −3.6 | −1.3 |
| 16 | 118 | 5 | 5 |  |  | 30 |  | 54.9 | −3.3 | −1.1 |
| 19 | 118 | 5 | 7.5 |  |  | 30 |  | 55.5 | −3.1 | −0.9 |

| Layer | | | | | | |
|---|---|---|---|---|---|---|
| Glass | 1.2 mm | 1.2 mm | 1.2 mm | 1.2 mm | 1.2 mm | 1.2 mm |
| ITO | 120 | 120 | 120 | 120 | 120 | 120 |
| IRIDIUM | 3 | 6 | 9 | 12 | 15 | 18 |
| CR | 40 | 40 | 40 | 40 | 40 | 40 |
| R (cap Y) | 50.5 | 52.8 | 54.3 | 55.4 | 56.0 | 56.4 |
| Glass | 1.2 mm | 1.2 mm | 1.2 mm | 1.2 mm | 1.2 mm | 1.2 mm |
| ITO | 120 | 120 | 120 | 120 | 120 | 120 |
| Chrome | 1 | 2 | 4 | 6 | 8 | 10 |
| IRIDIUM | 15 | 15 | 15 | 15 | 15 | 15 |
| CR | 40 | 40 | 40 | 40 | 40 | 40 |
| R (cap Y) | 55.3 | 54.5 | 53.3 | 52.2 | 51.4 | 50.8 |
| Glass | 1.2 mm | 1.2 mm | 1.2 mm | 1.2 mm | 1.2 mm | 1.2 mm |
| ITO | 120 | 120 | 120 | 120 | 120 | 120 |
| Palladium | 3 | 6 | 9 | 12 | 15 | 18 |
| CR | 40 | 40 | 40 | 40 | 40 | 40 |
| R (cap Y) | 50.9 | 53.6 | 55.6 | 57.0 | 58.0 | 58.7 |
| Glass | 1.2 mm | 1.2 mm | 1.2 mm | 1.2 mm | 1.2 mm | 1.2 mm |
| ITO | 120 | 120 | 120 | 120 | 120 | 120 |
| Chrome | 1 | 2 | 4 | 6 | 8 | 10 |
| Palladium | 15 | 15 | 15 | 15 | 15 | 15 |
| CR | 40 | 40 | 40 | 40 | 40 | 40 |
| R (cap Y) | 56.5 | 55.2 | 53.0 | 51.5 | 50.4 | 49.6 |
| Glass | 1.2 mm | 1.2 mm | 1.2 mm | 1.2 mm | 1.2 mm | 1.2 mm |
| ITO | 120 | 120 | 120 | 120 | 120 | 120 |
| Platinum | 3 | 6 | 9 | 12 | 15 | 18 |
| CR | 40 | 40 | 40 | 40 | 40 | 40 |
| R (cap Y) | 49.7 | 51.3 | 52.3 | 52.9 | 53.1 | 53.2 |
| Glass | 1.2 mm | 1.2 mm | 1.2 mm | 1.2 mm | 1.2 mm | 1.2 mm |
| ITO | 120 | 120 | 120 | 120 | 120 | 120 |
| Chrome | 1 | 2 | 4 | 6 | 8 | 10 |
| Platinum | 15 | 15 | 15 | 15 | 15 | 15 |
| CR | 40 | 40 | 40 | 40 | 40 | 40 |
| R (cap Y) | 52.3 | 51.6 | 50.5 | 49.7 | 49.2 | 48.9 |
| Glass | 1.2 mm | 1.2 mm | 1.2 mm | 1.2 mm | 1.2 mm | 1.2 mm |
| ITO | 120 | 120 | 120 | 120 | 120 | 120 |
| Cadmium | 3 | 6 | 9 | 12 | 15 | 18 |
| CR | 40 | 40 | 40 | 40 | 40 | 40 |
| R (cap Y) | 52.3 | 56.5 | 59.9 | 62.5 | 64.6 | 66.1 |
| Glass | 1.2 mm | 1.2 mm | 1.2 mm | 1.2 mm | 1.2 mm | 1.2 mm |
| ITO | 120 | 120 | 120 | 120 | 120 | 120 |
| Chrome | 1 | 2 | 4 | 6 | 8 | 10 |
| Cadmium | 15 | 15 | 15 | 15 | 15 | 15 |
| CR | 40 | 40 | 40 | 40 | 40 | 40 |
| R (cap Y) | 62.2 | 60.1 | 56.6 | 54.0 | 52.0 | 50.7 |

Different metals or mixtures of metals may be used next to the thin chrome layer. The thin chrome layer may be considered optional, it is used when an adhesion promoter layer is desired. Alternate adhesion promoting metals or materials may fulfill a comparable function. The different metals are selected to alter the reflectance, either higher or lower, depending on the match desired with respect to the center of the viewing area. The metal can have another benefit, that of altering the color or hue of the ring area. The presence of the ITO or other dielectric layer under the metals tends to move the color to a more negative b* direction. The use of a "red" high reflectance metal such as copper may both enhance reflectivity while simultaneously facilitating a color match to the viewing area. Table 1e shows the effect of a thin copper layer placed between two chrome layers. The reflectance is substantially increased while simultaneously making the ring color more neutral. A copper gold alloy similar properties.

TABLE 1e

Color and reflectance effects of copper addition to stack

| | | |
|---|---|---|
| ITO | 114 | 114 |
| Chrome | 1 | 1 |
| Copper | 0 | 15 |
| Chrome | 40 | 40 |
| R | 47.3 | 56.2 |
| a* | −5.2 | −0.7 |
| b* | −3.5 | 2.3 |

Suitable metals which will result in increased reflectance include cadmium, cobalt, copper, palladium, silver, gold, aluminum and iridium or other high reflectance metals, their alloys and/or mixtures of metals.

TABLE 1

| Reflectance | A10 | D65-2 (specular included) | | | D65-2 Macbeth Color Eye 7000 Y specular |
|---|---|---|---|---|---|
| Trial | Y | a* | b* | C* | excluded |
| 1  856csito | 11.665 | 2.088 | −5.491 | 5.874 | 0.01 |
| 2  cswchr | 38.312 | −3.477 | 4.183 | 5.439 | 0.133 |
| 3  cswchral | 61.366 | −3.108 | 6.965 | 7.627 | 0.186 |
| 4  halfchral | 61.679 | −4.484 | 12.279 | 13.072 | 0.376 |
| 5  halfchr | 41 | −5.929 | 12.809 | 14.114 | 0.073 |
| 6  Tec15Chr | 23.76 | 0.984 | 8.603 | 8.659 | 1.322 |
| 7  Tec 15 | 11.284 | −3.363 | 0.442 | 3.392 | 0.162 |

1 - Glass/856 Ang. Al2O3/Half wave (Optical thickness) ITO
2 - 1 plus opaque chrome layer
3 - 1 plus approx 30 Ang. Chrome/250 Ang. Aluminum
4 - Glass/Half wave ITO/30 Ang. Chrome/250 Ang. Aluminum
5 - Glass/Half wave ITO/Opaque Chrome layer
6 - Glass/Tec15/Opaque chrome
7 - Tec 15

Table 2 summarizes various color characteristics, namely, a*; b*; C* and Y specular included (A10) for the combinations of various indium-tin-oxide second surface conductive electrodes positioned between a first substrate and a substantially paque chrome spectral filter material. The data contained in this table depicts the ability to control the resulting b* value by varying the ITO thickness from approximately 65% to approximately 100% of a ½ wave thickness. Specific thicknesses anticipated to obtain a given color may vary somewhat based on deposition parameters that affect the optical constants. The color of a particular stack may vary, to some degree, based on choice of process parameters, as well as, process fluctuations that result in small, but, sometimes significant shifts in the optical constants of the materials used. For example, the half wave optical thickness of ITO will correspond to a lesser physical thickness if the physical density of the coating is increased and an increase absorption in the ITO coating would decrease the reflectivity of a second surface ITO plus chrome stack. This does not negate the fact that over the range of optical constants usually associated with ITO, a half wave optical thickness of ITO (relative to 550 nm) when coated with, for example, chrome, will tend to produce a reflection having a yellowish hue. Table 2a shows the same effect over a narrower range of ITO thicknesses and with a modified metal stack. As the ITO is increased in thickness the reflectance increases providing a better intensity match. The a* value decreases and the b* value increases. The net effect is that the color match will be improved with the appropriate ITO thickness. Or if a color mismatch is chosen the color of the spectral filter material can be made to have a lower b* value than the main reflective area.

TABLE 2

TCO plus Chrome Specular Included

| Trial | a* | b* | C* | A10Y |
|---|---|---|---|---|
| 85CHR | −6.801 | 2.486 | 7.241 | 44.829 |
| 80CHR | −6.717 | −0.829 | 6.768 | 44.375 |
| 75CHR | −6.024 | −4.031 | 7.248 | 43.759 |
| 70CHR | −5.613 | −5.426 | 7.807 | 42.917 |
| 65CHR | −5.227 | −6.639 | 8.45 | 42.64 |
| 100CHR | −7.06 | 12.85 | 14.662 | 45.255 |

TABLE 2a

Effect of ITO with modified metal stack

| Run # | ITO | Cr | Ru | Rh | Cr Ru | Rh | CIE-D65 R | a* | b* |
|---|---|---|---|---|---|---|---|---|---|
| 108 | 5 | | 2.5 | | | 30 | 52.3 | −2.5 | −4.5 |
| 113 | 5 | | 2.5 | | | 30 | 53.2 | −3.1 | −3.0 |
| 118 | 5 | | 2.5 | | | 30 | 54.0 | −3.6 | −1.3 |
| 123 | 5 | | 2.5 | | | 30 | 54.5 | −4.1 | 0.6 |
| 128 | 5 | | 2.5 | | | 30 | 54.9 | −4.5 | 2.6 |
| 133 | 5 | | 2.5 | | | 30 | 55.1 | −4.7 | 4.7 |

Table 3 summarizes various color characteristics, namely, a*; b*; C* and Y specular included (A10) for various indium-tin-oxide second surface conductive electrodes. The data contained in this table depicts the resulting values produced by varying the ITO thickness from approximately 65% to approximately 100% of a ½ wave thickness.

TABLE 3

TCO Specular Included

| Trial | a* | b* | C* | A10Y | Thickness (Å) |
|---|---|---|---|---|---|
| 65CLR | −0.988 | 15.535 | 15.567 | 15.678 | 1095 |
| 100CLR | 13.588 | −17.765 | 22.366 | 8.967 | 1480 |
| 85CLR | 8.376 | 2.896 | 8.863 | 11.352 | 1306 |
| 80CLR | 4.481 | 11.34 | 12.193 | 12.892 | 1253 |
| 75CLR | 1.565 | 15.019 | 15.101 | 14.275 | 1194 |
| 70CLR | −0.276 | 15.654 | 15.656 | 15.259 | 1135 |

Materials used for transparent second surface conductive electrodes are typically materials with an approximately 1.9 index of refraction, or greater. It is known to minimize color impact of these conductive electrode materials by using half wave thickness multiples, using the thinnest layer possible for the application or by the use of one of several "non-iridescent glass structures." Non-iridescent structures will typically use either a high and low index layer under the high index conductive coating (see, for example, U.S. Pat. No. 4,377,613 and U.S. Pat. No. 4,419,386 by Roy Gordon), or an intermediate index layer (see U.S. Pat. No. 4,308,316 by Roy Gordon) or graded index layer (see U.S. Pat. No. 4,440,822 by Roy Gordon) to minimize color impact. The intensity of the ring with a color suppression layer is lower than the center of the part. The color suppression layer helps the color of the ring but the ring would still be visible because of the intensity contrast. The color suppressed ITO would therefore benefit from the use of a different sequence of metal layers on top of the ITO. Table 3a shows the color for a range of different metal options. The top chrome layer is optional, it does not contribute to the color or reflectance match of the ring. The top chrome layer is added to minimize the transmittance of the layer stack and to minimize the amount of UV light that would reach the seal, thus, extending the lifetime of the product. A chrome/rhodium/ruthenium stack is shown but it is understood that other metals, alloys, high reflectors described elsewhere in this document can be used.

The results of varying the thickness of the ITO with and without a color suppression layer are shown in Table 3a2. The colors shown in the table represent the changes which occur with an ITO thickness between 100 and 300 nm. Therefore, the use of a color suppression layer allows a broader thickness range for the ITO layer without causing the strong color variations experienced without the color suppression layer.

TABLE 3a

Effect of metal layers with color suppressed ITO - Reflectance in CIE-D65

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Color Suppression Layer | 80 | 80 | 80 | 80 | 80 | 80 | 80 | 80 | 80 | 80 | 80 |
| ITO 1/2 Wave | 148.7 | 148.7 | 148.7 | 148.7 | 148.7 | 148.7 | 148.7 | 148.7 | 148.7 | 148.7 | 148.7 |
| Chrome Layer | 0 | 3 | 5 | 5 | 5 | 5 | 5 | 4 | 3 | 2 | 60 |
| Rhodium | 0 | 0 | 0 | 3 | 6 | 9 | 12 | 12 | 12 | 12 | 0 |
| Ruthenium | 30 | 30 | 30 | 30 | 30 | 30 | 30 | 30 | 30 | 30 | 30 |
| Chrome Layer | 25 | 25 | 25 | 25 | 25 | 25 | 25 | 25 | 25 | 25 | 0 |
| Reflectance Cap Y | 48.8 | 49.2 | 49.3 | 51.1 | 52.2 | 52.9 | 53.2 | 54.3 | 55.5 | 56.8 | 45.7 |
| a* | −2.2 | −1.6 | −1.4 | −0.9 | −0.5 | −0.2 | 0.0 | 0.0 | −0.1 | −0.2 | −1.8 |
| b* | 2.1 | 0.5 | −0.3 | −0.3 | −0.3 | −0.2 | −0.2 | 0.4 | 1.0 | 1.7 | −3.3 |

TABLE 3a2

Effect of color suppressed ITO thickness on color - 200nm ITO +/− 100 nm

| Stack | Case 1 | Case 2 | Case 3 | Case 4 | Case 5 | Case 6 | Case 7 | Case 8 |
|---|---|---|---|---|---|---|---|---|
| 1.670 | 80 | 80 | 80 | 80 | 80 | 80 | 80 | 80 |
| ITO | 100 | 130 | 150 | 180 | 210 | 240 | 270 | 300 |
| Chrome | 2 | 2 | 2 | 2 | 2 | 2 | 2 | 2 |
| Rhodium | 5 | 5 | 5 | 5 | 5 | 5 | 5 | 5 |
| Ruthenium | 30 | 30 | 30 | 30 | 30 | 30 | 30 | 30 |
| a* | 1.15 | 0.54 | −0.76 | −1.5 | 0 | 0.54 | −0.84 | −1.1 |
| b* | 0.9 | 0.14 | 1.7 | 3.22 | 0.92 | −0.16 | 2.17 | 3.1 |
| 1.670 | 0 | 0 | 0 | 0 | 0 | 0 | 0 | 0 |
| ITO | 100 | 130 | 150 | 180 | 210 | 240 | 270 | 300 |
| Chrome | 2 | 2 | 2 | 2 | 2 | 2 | 2 | 2 |
| Rhodium | 5 | 5 | 5 | 5 | 5 | 5 | 5 | 5 |
| Ruthenium | 30 | 30 | 30 | 30 | 30 | 30 | 30 | 30 |
| a* | −1 | −3.9 | −3.4 | 5.5 | 8 | −4 | −10.1 | −0.9 |
| b* | −5.4 | 3.19 | 9.9 | 3.8 | −8.6 | −4.3 | 7.6 | 5.5 |

A partially transmissive layer such as thin chrome adjacent to the glass may be used to provide adhesion benefits compared to metals that might be used for better reflectivity compared to chrome such as a platinum group metal (PGM) (i.e. iridium, osmium, palladium, platinum, rhodium, and ruthenium), Silver, Aluminum and various alloys of such metals with each other, such as silver-gold, white gold, or other metals. When these other metals or alloys are placed behind the partially transmissive adhesion promoting layer, some of the improved reflectance of the second material will be realized. It may also be beneficial to overcoat the spectral filter material with a material that improves the durability of the spectral filter material whether it is in contact with a transparent conductor overcoat or if it is in direct contact with the electro-optic medium. It should be understood that the reflector may be a dichroic stack. The spectral filter material may comprise a single material such as chrome or may comprise a stack of materials such as: 1) chrome, rhodium, ITO; 2) moly; 3) chrome, rhodium, TCO; 4) chrome, platinum group metal, ITO; 5) ITO, silver, ITO; 6) ITO, silver alloy, ITO; 7) $Z_NO$, silver/silver alloy, $Z_NO$; 8) transparent conductor, metal reflector, transparent conductor; silicon, ITO 9) silicon, $Z_NO$, 10) chrome, ruthenium, ITO and 11) chrome/rhodium/ruthenium/ITO or other metals, metal alloys or combinations described elsewhere in this document can be used.

There may also be advantages to applying the transparent conductive oxide(s) on the second surface of the mirror in more than one step. For example a Zinc oxide layer may be deposited initially to form a layer to which silver or its alloys bond well. This is preferably chosen at a thickness that produced a desirable color and reflectivity when combined with silver, silver alloy or other metals and their alloys. Then the metal layer(s) are applied around the perimeter of the part followed by additional transparent conductive oxide(s) over at least the electrochromic area. The additional applications of oxides improve the conductivity in the electrochromic area and may be chosen at a thickness, which yields a desirable range of hue when going from bright state to dark state, in the electrochromic area, but particularly in the fully darkened state. If the conductive oxide adjacent to the electrochromic medium has sufficient conductivity, not all of the metal oxides in the stack would necessarily need to be conductive.

For example, using an optical model, opaque silver deposited over 100 nm of ITO, the color of a reflective ring would be about, using D65 illuminant, 2 degree observer a*=−1, b*=−2 and Y value of 89. For purposes of this discussion, the silver is masked such that it is only applied in a ring around the electrochromic area. The color of the electrochromic area with only the 100 nm ITO on glass using a material of index 1.43 as the electrochromic medium and no reflection from a $3^{rd}$ or $4^{th}$ surface models as a*=−3, b*=8 with a Y value of 8. To make the electrochromic area less yellow and more conductive 40 nm of ITO coating may be added in the electrochromic area. This brings the coating in the electrochromic area to about half wave optical thickness, which is approximately the second surface coating thickness that most electrochromic elements have. The model for the electrochromic area then yields a color of a*=11, b*=−14, and Y value of 5. Either, or both, of these applications of transparent conductive oxides may be of another material such as aluminum doped zinc oxide. There might also be additional layer(s) such as nickel chromium or nickel chromium suboxide, niobium or niobium suboxide, titanium or titanium suboxide, as well as, other means known in the art, that would protect or preserve a metal layer such as silver during subsequent steps of the coating and assembly process such as thermal processing steps.

Note that by using such a stack, the reflective ring will more closely match the brightness of electrochromic areas in the undarkened state that are more highly reflective such as devices that have 3$^{rd}$ surface coatings incorporating silver or silver alloys.

In particular, Aluminum in direct contact with the electro-optic medium tends to degrade upon being subjected to multiple coloring/clearing cycles. An overcoat of chrome has been demonstrated to improve that durability. When an ITO overcoat is used, a material such as silicon may improve the strength of the bond between the ITO and the substances closer to the glass. Other materials, such as a platinum group metal (PGM) (i.e. iridium, osmium, palladium, platinum, rhodium, and ruthenium), may be overcoated to improve adhesion reflection conduction electrode stability, any one thereof, subcombinations thereof or combinations thereof, characteristics.

As revealed in the above figures and tables, the thickness of ITO may be chosen to produce a desired reflection color. If the ITO coating is about 25% thinner, that is about 120 Ang. Instead of 140 Ang. then a more bluish hue results (i.e. lower b*). This, however, will also result in decreased conductivity of the ITO coating. The reflectivity of the coating will also be slightly, to somewhat, higher than for coatings of the traditional half wave optical thickness where the reference is to a minimum reflectivity near 550 nm.

The compromise between optimal color and sheet resistance of the ITO may be mitigated by the use of partial deletion of the ITO layer. For instance, the ITO may be applied to any thickness needed to give adequate color in the center of the viewing area and the required sheet resistance. Then the ring portion of the ITO coating may be ion etched or removed in any other viable method so that the final thickness of the ITO in the ring is at a point where we have the desired aesthetics. The etching or removal process for the ITO may be conducted in the same process as the deposition of the subsequent metal layers or it may be done in a separate step.

It is known in the art that a chrome layer may be applied beneath the ITO layer to provide a marginal match between the viewing area and the ring. The degree of match between the ring in this case and the viewing area is a function of the reflectance in the viewing area and properties of the chrome. What has not been taught in the art is how the properties of the chrome layer affect the match of the ring to the viewing area. For instance, in some cases, the reflectance of the viewing area may be specified by law to be greater than 55%. The reflectance of the chrome ring is a function of the thickness of the chrome and, more importantly, the refractive index of the chrome. For a given refractive index dispersion formula the reflectance can be dropped from its maximum value by reducing the thickness of the chrome layer. This can have a detrimental effect because the transmittance of the chrome layer will increase thus allowing more UV light to penetrate to the EC unit seal. The UV light can damage the seal leading to a shorter lifetime of the product.

The reflectance of the ring may be enhanced by tuning the optical properties of the chrome layer. Table 3b shows the dependence of the reflectance of chrome under ITO on the optical properties of the chrome layer. Two sets of optical constants were obtained from the open literature and were mixed in different proportions to assess the effect of the optical constants on the reflectivity. The optical constants vary with wavelength and the values in Table 3b are values at 550 nm for reference. The thickness of the chrome layer is 80 nm and the ITO is 148.7 nm. In at least one embodiment, the glass thickness is 1.2 mm and the reflectance quoted is for viewing through the glass to the coating stack.

The reflectance, in this example, varies from a low of 48.6 to a high of 54.2%. This clearly demonstrates that some chrome layers may not necessarily attain the reflectance needed for a match to the reflectance in the viewing when relatively high reflectance is present in the viewing area. In addition, there is a finite maximum reflectance attainable by a single layer of chrome under the ITO. The preferred chrome layers are defined by the refractive indices of the chrome layer.

TABLE 3b

Performance of the chrome layer under ITO versus chrome for various chrome optical constants

| Chrome Layer | 80 | 80 | 80 | 80 | 80 | (nm) |
|---|---|---|---|---|---|---|
| Chrome n | 3.456 | 3.366 | 3.279 | 3.196 | 3.116 | @ 550 nm |
| Chrome k | 3.981 | 4.089 | 4.199 | 4.310 | 4.423 | @ 550 nm |
| ITO-B18 | 148.7 | 148.7 | 148.7 | 148.7 | 148.7 | (nm) |
| Reflectance | 48.6 | 49.9 | 51.3 | 52.8 | 54.2 | (%) |

In order to define the appropriate optical constants for the chrome layer a series of calculations were performed. A simplified analysis was conducted where the refractive index of the chrome is held constant over the visible region. The analysis shows the relationship between the real and imaginary refractive indices of the chrome and the resultant reflectance. In actual practice this may varied from theoretical analysis by up to +/−20% to account for the effects of the dispersion in the Chrome optical constants. Table 3c shows the reflectance for various combinations of n and k and the ratio of n/k.

TABLE 3c

Reflectance for chrome under ITO as a function of the optical constants of the chrome @550 nm

| Example | n | k | ratio | Reflectance |
|---|---|---|---|---|
| 1 | 3.00 | 3.90 | 0.77 | 49.8 |
| 2 | 3.00 | 4.10 | 0.73 | 51.7 |
| 3 | 3.00 | 4.20 | 0.72 | 52.7 |
| 4 | 3.00 | 4.20 | 0.71 | 52.7 |
| 5 | 3.00 | 4.30 | 0.70 | 53.7 |
| 6 | 3.00 | 4.50 | 0.67 | 55.5 |
| 7 | 2.70 | 4.20 | 0.64 | 54.2 |
| 8 | 2.90 | 4.20 | 0.69 | 53.1 |
| 9 | 3.00 | 4.20 | 0.71 | 52.7 |
| 10 | 3.00 | 4.20 | 0.72 | 52.7 |
| 11 | 3.10 | 4.20 | 0.74 | 52.2 |
| 12 | 3.50 | 4.20 | 0.83 | 50.9 |
| 13 | 3.70 | 4.20 | 0.88 | 50.4 |
| 14 | 3.90 | 4.20 | 0.93 | 50.1 |
| 15 | 4.10 | 4.20 | 0.98 | 49.8 |
| 16 | 3.30 | 4.20 | 0.79 | 51.5 |
| 17 | 3.30 | 3.90 | 0.85 | 48.7 |
| 18 | 2.70 | 3.50 | 0.77 | 46.8 |
| 19 | 2.70 | 3.70 | 0.73 | 49.0 |

TABLE 3c-continued

Reflectance for chrome under ITO as a function of the optical constants of the chrome @550 nm

| Example | n | k | ratio | Reflectance |
|---|---|---|---|---|
| 20 | 2.70 | 3.90 | 0.69 | 51.2 |
| 21 | 2.70 | 4.10 | 0.66 | 53.2 |
| 22 | 2.70 | 4.30 | 0.63 | 55.2 |
| 23 | 2.70 | 4.50 | 0.60 | 57.2 |
| 24 | 3.30 | 4.04 | 0.82 | 50.0 |

An analysis of this data set was conducted to determine an equation relating n and k to reflectance. Again the reflectance is calculated when viewed through the glass.

$$\text{Reflectance} = 9.21972 - 8.39545*n + 20.3495*k + 1.76122*n^2 - 0.711437*k^2 - 1.59563*n*k.$$

The results can also be shown graphically. Using the equation and/or graph we can determine the needed n and k values necessary to attain a desired degree of reflectivity for a chrome layer.

Aesthetically, it is desirable for the ring to match the viewing area as closely as possible. The eye is then not drawn to the ring and can better focus on the object in the viewing area. It is somewhat subjective what difference in appearance between the ring and viewing area is objectionable. The intensity between the ring and viewing area is preferably within 10%, more preferably within 6% and most preferably within 3%. Similarly, the color of the ring may be objectionable. The color difference between the ring and viewing area should be less than 30, preferably less than 15 and most preferably less than 10 C* units.

There may be situations where, due to processing limitation or restrictions, it is not possible to attain the desired chrome optical constants but a match is still desired between the ring and the viewing area. In other situations it may be desirable to attain a reflectance for the ring which is higher than what is possible with chrome alone. In these circumstances an approach similar to what was discussed above for the case of the metals on top of the chrome may be applied. To attain higher reflectance a relatively thin layer of chrome is applied to the glass followed by a higher reflecting metal layer such as rhodium, ruthenium, iridium, cadmium, palladium, platinum or other appropriate metal or alloy which has an inherent higher reflectance than chrome.

Table 3d shows the effect of chrome thickness on the reflectance for a fixed n and k value for the chrome layer. The optical constants for the chrome were selected to produce a reflectance less than 50% with the goal to match a viewing area reflectance of 56%. The reflectance varies with the thickness of the first chrome layer with, essentially, a perfect match when the chrome layer thickness is reduced to 2.5 nm.

TABLE 3d

Chrome thickness effect on reflectance
Modified stack to compensate for change in chrome properties

| Chrome optical constants | n | | 3.456 | | k | 3.981 | |
|---|---|---|---|---|---|---|---|
| Chrome Layer | 40 | 30 | 20 | 10 | 5 | 2.5 | (nm) |
| Ruthenium | 35 | 35 | 35 | 35 | 35 | 35 | (nm) |
| Chrome Layer | 0 | 10 | 20 | 30 | 35 | 37.5 | (nm) |
| ITO-B18 | 148.7 | 148.7 | 148.7 | 148.7 | 148.7 | 148.7 | (nm) |
| Reflectance | 48.4 | 48.5 | 49.7 | 52.8 | 54.9 | 55.8 | (%) |

The optical constants of the chrome layer also have an effect on the reflectance of this stack. The reflectance may be attenuated significantly with the optical constants of the chrome but with the use of a thin chrome layer backed by a higher reflectance metal layer, ruthenium in this case, the reflectance may be significantly increased compared to the case where the high reflectance metal is not present. Table 3e shows the effect of optical constants of the chrome on the reflectance.

TABLE 3e

Effect of Chrome optical constants on reflectance
Effect of Chrome base layer optical constants on reflectance

| Chrome Layer | 10 | 10 | 10 | 10 |
|---|---|---|---|---|
| Ruthenium | 35 | 35 | 35 | 35 |
| Chrome Layer | 30 | 30 | 30 | 30 |
| ITO-B18 | 148.7 | 148.7 | 148.7 | 148.7 |
| Reflectance | 53.5 | 54.9 | 55.9 | 56.9 |
| Chrome n | 3.366 | 3.279 | 3.196 | 3.116 |
| Chrome k | 4.089 | 4.199 | 4.310 | 4.423 |

Another option for enhancing the reflectance of the ring and improving the aesthetic match to the viewing area consists of putting a low index material between the ITO and the metal layers. The low index layer may be silica, alumina, MgO, polymer or other suitable low index material. At least options for the low index material exist. A first is to control the thickness of the silica layer to provide an interferential increase in reflectance. Table 3f compares the color of the ring with and without the addition of the low index layer. In this case, the low index layer is silica but as mentioned above any appropriate low index material is suitable for this application. The thickness of the ITO and low index layers may be adjusted to alter the color while simultaneously increasing the reflectance. The reflectance may be further increased by combining this technique with the different metal stacks described elsewhere in this document.

TABLE 3f

Effect of addition of low index layer between the ITO and metal layers

| | Case 1 | Case 2 |
|---|---|---|
| ITO | 125 | 125 |
| SIO2 | 0 | 55 |
| Chrome | 60 | 60 |
| R | 46.6 | 54.2 |
| a* | −6.6 | −0.5 |
| b* | 0.9 | 3.0 |

Another option is to insert a relatively thick low index material between the ITO and the metal reflectors of the ring. In this case it is desirable that the low index layer to be thick enough to act as a bulk layer. The necessary thickness is dependent, at least in part, on the material properties of the bulk layer, particularly if the in-homogeneities help to eliminate the phase information of the light. The thickness of the layer may be as thin as ¼ micron or thicker to get the desired effect.

Other options to provide a match between the ring and the viewing area include the use of a High/Low/High dielectric stack. A series of dielectric layers with alternating refractive indices may be used to provide a high reflectance coating. For example, TiO2/SiO2/TiO2 alternating layers may be used. Table 3g shows a stack consisting of TiO2, SiO2 and ITO (thicknesses in nm) which provides a reflectance of the ring of 60.5% with a neutral color. The color and reflectance may be modified by adjusting the thickness of the layers. A second option, with ITO as the base layer, is also shown in Table 3g.

it does impose limitations on the IMI stack which are not present when the reflectors are between the IMI and the glass.

In the IMI stack the insulator may be a dielectric layer such as TiO2, SiO2, ZnO, SnO2, Niobium oxide, silicon metal, ZrOx, SiN or other suitable material. Mixed oxides, oxynitrides or other composites may be used. The metal is preferably Ag or an alloy of Ag. The Ag may be alloyed or doped with Au, Pd, Pt, Si, Ti, Cu or other materials selected to provide the proper electrochemical, chemical or physical properties. Protective layers may be placed between the metal layer and the dielectrics to improve adhesion, chemical stability of the metal or thermal stability of the IMI coating during heat treatment. Multiple different dielectrics may be used to attenuate color and reflectance in the viewing area and in the ring.

TABLE 3h

IMI stacks and ring reflectance. Thicknesses are in nm unless noted

| Glass | 1.6 mm | Glass | 1.6 mm | Glass | 1.6 mm | Glass | 1.6 mm | Glass | 1.6 mm | Glass | 1.6 mm |
|---|---|---|---|---|---|---|---|---|---|---|---|
| Cr | 45.0 | Cr | 30.0 | Cr | 20.0 | Cr | 0.0 | Cr | 0.0 | Cr | 40.0 |
| ZnO | 39.8 | ZnO | 39.8 | Ru | 15.0 | Ru | 0.0 | Ru | 0.0 | Ru | 0.0 |
| Ag | 9.0 | Ag | 9.0 | ZnO | 39.8 | ZnO | 39.8 | TiO2 | 23.5 | TiO2 | 23.5 |
| ITO | 52.8 | ITO | 52.8 | Ag | 9.0 | Ag | 9.0 | ZnO | 10.5 | ZnO | 10.5 |
| Cr | 0.0 | Cr | 0.0 | ITO | 52.8 | ITO | 52.8 | Ag | 9.0 | Ag | 9.0 |
| R | 54.2 | R | 53.2 | Cr | 0.0 | Cr | 10.0 | ITO | 35.7 | ITO | 35.7 |
| a* | −4.9 | a* | −5.6 | R | 55.9 | AL | 40.0 | Ru | 0.0 | Ru | 0.0 |
| b* | 0.5 | b* | 1.3 | a* | −4.3 | R | 57.5 | Cr | 25.0 | Cr | 0.0 |
|   |   |   |   | b* | 0.9 | a* | −1.5 | R | 54.3 | R | 55.1 |
|   |   |   |   |   |   | b* | 8.4 | a* | −3.4 | a* | −5.0 |
|   |   |   |   |   |   |   |   | b* | −0.2 | b* | 0.8 |

The stack may be adjusted with both configurations to give both the desired color and reflectance values. The thickness of the ITO may be adjusted to provide for a more conductive layer. The thickness and indices of the other layers may be adjusted to compensate for the changes in the ITO thickness. This increases the utility of this design option.

TABLE 3g

High/Low/High stack for ring match

| Glass | 1.6 mm | Glass | 1.6 mm |
|---|---|---|---|
| TIO2 | 55.3 | ITO | 148.7 |
| SIO2 | 94.5 | SIO2 | 90 |
| TIO2 | 55.3 | TIO2 | 50 |
| SIO2 | 94.5 | SIO2 | 90 |
| ITO | 148.7 | TIO2 | 55 |
| Reflectance | 60.5 | Reflectance | 60.7 |
| a* | −5.3 | a* | −4.9 |
| b* | 5.64 | b* | −1.9 |

Another option for the ring is the use of an IMI, or insulator/metal/insulator, stack for the electrode. Some particular IMI stacks and ring materials are noted below but other versions are also viable. In the context of this invention, it may be assumed that an IMI stack may be substituted for ITO or another TCO. A metal or dielectric stack is then put between the IMI stack and the substrate or the seal material. Both scenarios will work well. When the reflecting stack is put between the IMI and the glass, a more flexible situation for the IMI stack is achieved, particularly, if the metal reflectors are essentially opaque. The IMI is shielded by the metal reflectors and may be adjusted as needed for the center viewing area. When the IMI is in between the glass and the reflecting stack, it is desirable to ensure that the requirements in the viewing area and ring are compatible. This may be accomplished but When the ITO thickness is increased from a ½ wave to the point where a bluish color is achieved for the ITO plus chrome stack, the color is much more susceptible to shifts due to thickness variations during deposition and, or, due to viewing angle differences in actual use. ITO coatings deposited intentionally thinner than ½ wave optical thickness, per the discussion above also exhibited relatively low levels of haze when overcoated with chrome as depicted in Table 2.

The difference between coatings may be measured by using the specular excluded option available on some reflectance spectrophotometers. It is important to check that such measurements are actually measuring scattered light and not primarily small amounts of the specular component. In general, shorter wavelengths of light scatter more readily. That fact is a good indicator when used to determine whether a given reading is actually the expected scattered light intensity being measured. A MacBeth Color Eye 7000 is one spectrophotometer that gives good haze measurement results in this regard.

As used herein, the terms "haziness" and "haze" should be understood to refer to the property of scattering, or non-specular reflection, in thin films. Haziness may be caused by a number of factors, including less than fully oxidized layers, crystal sizes within a layer, surface roughness, layer interface properties, quality of cleaning of the substrate, subcombinations thereof and combinations thereof.

These properties may vary due to processing conditions and/or the materials. This is especially true with processing conditions, in that the level of haze may vary substantially even within a single process "batch" or "load" of coatings. Nonetheless, for an ITO layer overcoated with chrome and viewed through the glass, whether with or without color suppression or anti-iridescent underlayers, it has been shown to be possible to produce coatings much less hazy than those similarly obtained with Tec 15 glass from Libbey Owens Ford.

Aluminum oxide may be used as an underlayer to assist in controlling the hue of the spectral filter material stack, as well as, mixtures of oxides yielding an appropriate refractive index. It may be particularly advantageous to use a mixture of ITO and $SiO_2$ and, or, SiO as an underlayer for ITO to control the resulting hue of the spectral filter material stack. The use of ceramic targets for ITO is often considered capable of tighter process control for properties such as film thickness. A sputter target comprising ITO and Si and, or, Si in a mixture of oxidation states may be employed. Such an underlayer potentially enables one to use an in line coating system that does not have substantial gas flow isolation from either pumping or intervening doors, between the cathodes used for depositing the underlayer and the ITO layer. A mixture of ITO and $SiO_2$ to at least some percentage of $SiO_2$ will retain sufficient conductivity such that RF sputtering is not necessary. Radio Frequency (RF) sputtering compared to Medium Frequency (MF) sputtering, direct current (DC) sputtering, often requires electrical isolation and impedance matching that is not trivial to include in a thin film coating system.

Since there are regulatory requirements for 35% (40% in many European Countries) reflectivity for vehicular rearview mirrors, (clear state for electro-optic mirror elements), in order for the perimeter area to be included in the field of view calculations it needs to have such a level of reflectance. In the data provided herein with respect to chrome over Tec 15 glass, this minimum is not met.

Use of a measurably hazy CVD deposited flourine doped tin oxide that is part of an anti iridescent structure for use in electro-optic devices is known. Various thicknesses of ITO are known for providing a conductive electrode. It has not previously been known that the b* of an indium-tin-oxide conductive electrode and chrome spectral filter material stack may be predictably controlled by varying the thickness of the ITO. Pyrolitically deposited Fluorine doped tin oxide with an anti iridescent structure (Tec 15 from L.O.F) is substantially more hazy when overcoated with chrome compared with ITO deposited over a layer of aluminum oxide as shown in Table 1.

In embodiments where the spectral filter material is located proximate the first surface it can be advantageous to minimize the distance between the first surface and the third or fourth surface reflector. The greater the distance between the reflector and the first surface, the greater the discontinuity will be in the image reflected by the element when transitioning from the main reflector to the spectral filter material. This will be accentuated as the viewing angle increases.

In embodiments where a spectral filter material is located proximate the second surface of the element and an additional coating, such as a hydrophilic coating, is on the first surface, the optical properties of both coatings will affect the appearance of the perimeter of the device and may require adjustments to the layers for optimal appearance of the perimeter. In the case of an electro-optic element with a hydrophilic coating as described in commonly assigned U.S. Pat. Nos. 6,447, 123, 6,193,378 and application Ser. No. 09/602,919 hereby incorporated in their entireties by reference, the first surface coating will have a reflectance substantially lower than the reflectance of the preferred embodiments of a second surface spectral filter material as described herein. This will result in the hue and, or, chroma of the color of the perimeter of the device being more dependent on the second surface coatings than those on the first surface. Nonetheless, especially when color is chosen near a point of transition from perceived yellowish to bluish, +b* to −b*, respectively, or reddish to greenish, +a* to −a*, respectively, these differences tend to become more perceivable. When attempting to match the hue of the spectral filter material to that of the overall field of view of the reflector, small differences in the materials that result in transitions from more yellow to less yellow, or less blue to more blue, when compared to the overall field of view of the element may be avoided by practicing the teachings herein. A similar contrast in reddish or greenish hue may be managed.

For example, the color and reflectance of the ring and viewing area with and without a hydrophilic surface coating were modeled with a thin film program. The spectral filter ring consists of 126 nm of ITO, 3 nm of Cr, 5 nm of Rh, 30 nm of Ru and 40 nm of Cr. The exit medium or material next to the metals and dielectric layers is an electrochromic fluid with an index of approximately 1.365. The hydrophilic layer consists of a 65 nm color suppression layer next to the glass, a 234 nm TiO2 layer with a surface morphology and 10 nm of SiO2.

Table 4a shows the reflectance and color of various portions of the mirror. The first two rows show the effect of the presence or absence of the hydrophilic layer on the appearance of the ring. The color and reflectance are essentially unchanged with the application of the hydrophilic layer on the first surface of the mirror. In rows 3 and 4 we see the change of color in the viewing area when the mirror is in the darkened state. In the undarkened state the higher reflectance of the back reflector dominates the appearance. The reflectance increases with the hydrophilic layer which may have advantages in certain markets. The color of the viewing area without the hydrophilic layer in this case is somewhat objectionable because of the thickness of the ITO is selected to optimize the color of the ring. This results in a somewhat compromised color in the viewing area. By adding the hydrophilic coating on surface one the color becomes more neutral, a positive benefit to the combination. The fifth row shows the color of the hydrophilic layer without any other coatings on surface two of the glass and with an electrochromic fluid as the exit medium for reference.

TABLE 4a

Color and reflectance of different mirror components

| Structure | R | a* | b* |
|---|---|---|---|
| Hydro/Glass/ITO/Cr/Rh/Ru/Cr | 58.46 | −4.20 | 3.23 |
| Glass/ITO/Cr/Rh/Ru/Cr | 58.23 | −4.20 | 1.96 |
| Hydro/Glass/ITO | 13.50 | 0.69 | −3.10 |
| Glass/ITO | 5.65 | 4.69 | 1.92 |
| Hydro/Glass | 12.47 | −1.70 | −4.60 |

Example Mirror Element Description

A particularly advantageous element configuration in conformance with FIGS. 4a-4c and 5 comprises a first substrate of glass approximately 1.6 mm thick having a conductive electrode approximately 0.4 wavelengths (approximately 80% of ½ wave) thick of indium-tin-oxide applied over substantially the entire second surface by sputtering. At least a portion of the first corner, the edge and the second corner are treated such that approximately 0.25 mm of material is removed from the second surface and approximately 0.5 mm of material is removed from the first surface. It should be apparent that a portion of conductive electrode is removed during treatment. A spectral filter material approximately 400 Å thick of chrome is applied approximately 4.5 mm wide near the perimeter of the first substrate proximate the conductive electrode. An electrical conduction stabilizing material approximately 100 Å thick of a platinum group metal (PGM) (i.e. iridium, osmium, palladium, platinum, rhodium, and ruthenium) is applied approximately 2.0 cm wide near the perimeter of the first substrate proximate the spectral filter material. A first separation area is laser etched approximately 0.025 mm wide with a portion thereof extending parallel to, and within the width of, a portion of a primary seal material area to substantially electrically insulate the first and second conductive electrode portions, spectral filter material portions and adhesion promotion material portions. A second substrate of glass approximately 1.6 mm thick having a conductive electrode approximately 0.5 wavelengths thick over substantially all of the third surface is provided. A second separation area is laser etched approximately 0.025 mm wide with a portion thereof extending parallel to, and within the width of, a portion of a primary seal material to substantially electrically insulate the third and fourth conductive electrode portions. A reflective material approximately 400 Å thick of chrome is applied proximate the third conductive electrode portion substantially defined by the inboard edge of the primary seal. An optional overcoat approximately 120 Å thick of ruthenium is applied proximate the reflective material substantially defined by the inboard edge of the primary seal. A primary seal material, comprising an epoxy having a cycloaliphatic amine curing agent and approximately 155 μm substantially spherical glass balls, is provided to secure the first and second substrates together in a spaced apart relation to define a chamber. A substantially rigid polymer matrix electro-optic medium, as taught in many commonly assigned U.S. patents and patent applications, the disclosures of which are incorporated in their entireties herein by reference, is provided between the first conductive electrode portion and the optional overcoat material within the chamber through a plug opening in the primary seal material. The plug opening is sealingly closed using ultra-violet light curable material with UV light irradiating the plug bottom thru the third and fourth surface. The cured primary seal material and the plug material are inspected by viewing the element looking toward the fourth surface. An electrically conductive material comprising a bisphenol F epoxy functional resin, viscosity of approximately 4000 cP, having a cycloaliphatic amine curing agent, viscosity of approximately 60 cP, and a silver flake, tap density approximately 3 g/cc and average particle size of approximately 9 μm, is applied proximate the outboard edge of the primary seal material between the second adhesion promotion material portion, the third conductive electrode portion and the first electrical clip. This same electrically conductive material is applied proximate the outboard edge of the primary seal material between the first adhesion promotion material portion, the fourth conductive electrode portion and the second electrical clip. A double sided, pressure sensitive, adhesive material is provided between the electrical clip and the fourth surface of the second substrate. The electrically conductive material is cured after placement of the first and second electrical clips. The primary seal material is partially cured prior to application of the electrically conductive material; additional primary seal material curing coincides with curing the electrically conductive material. This curing process is beneficial to prevent warping of the element and improves overall related adhesion, sealing and conductivity characteristics.

This example mirror element description is provided for illustrative purposes and in no way should be construed to limit the scope of the present invention. As described throughout this disclosure, there are many variants for the individual components of a given element and associated rearview mirror assembly.

In embodiments of the present invention having a highly reflective spectral filter material applied between the second surface of the first substrate and the primary seal, it has proven advantageous to use specifically selected spacer material to eliminate bead distortion. Glass beads are typically added to the primary seal material to control the spacing between the substrates that form the chamber containing the electro-optic medium. The diameter of, preferably substantially spherically shaped, glass beads is a function of the desired "cell" spacing.

These glass beads function well as spacers in electro-optic devices that have two transparent substrates, a transparent front substrate and a reflector positioned on surface three or four. These spacers also function well in devices with a spectral filter material on the first surface or within the first substrate. However, when the spectral filter material is applied proximate the primary seal material and the second surface, "dimples" or small distortions in the chrome spectral filter material are created by typical glass spacer beads and are visible in the seal area of a resulting mirror element. These dimples are also visible in mirror elements having a third surface reflector, however, they can only be seen if the mirror element is viewed looking at the fourth surface. These third surface dimples in a reflector are not visible in a resulting mirror element when viewed once installed in a vehicle.

In contrast, these dimples are readily visible in a resulting mirror element when the spectral filter material is proximate the second surface and covers the primary seal material area. These dimples are created, at least in part, by high stress areas proximate the glass spacer beads. Typically, the primary seal material comprises a substantially rigid thermal curing epoxy; preferably comprising a cycloaliphatic amine curing agent. The curing temperature of the epoxy material is often greater than 150 degrees Centigrade. There is often a significant difference in thermal expansion between the customarily used ceramic glass bead (low coefficient of thermal expansion) and the epoxy material (high coefficient of thermal expansion). At least a portion of the glass spacer beads are in contact with the top material of a respective stack of materials proximate the second and third surfaces of the substrates when the seal solidifies and cures at high temperatures. As the mirror element cools in the post primary seal material cure cycle, the seal material shrinks much more than the spacer beads and stress develops around the bead creating a distorted area, or dimple, in the substrate stack. When the substrate comprises a reflector on a surface that is in contact with the primary seal material, these distorted areas, or dimples are visually perceptible.

These distorted areas can be eliminated in a number of ways. A more elastomeric or flexible primary seal material may be used that inherently does not build areas of high stress. A spacer that is more compressible may be used such that the spacer flexes as stress develops. A breakable spacer may also be used such that the spacer breaks to relieve the localized stress during primary seal material curing. A room or low temperature curing seal material with low cure shrinkage may be used that will eliminate or minimize the thermal expansion related stress. A seal material and spacers that are a closer match in thermal expansion may be used to eliminate or minimize the thermal expansion related stress plastic spacer beads and plastic seal material, ceramic spacer beads and ceramic seal material or seal material and/or spacer beads containing a thermal expansion modifying filler. The spacer beads in the seal material may be eliminated all together if proper methods of element manufacturing are used to control the element gap ("cell" spacing). For example, a spacing media such as a PMMA bead or fiber that dissolves in the electro-optic media could be applied to the area internal the primary seal to control the element gap during primary seal material curing. The element substrates may also be held apart mechanically until the seal solidifies.

Example 1

Primary Seal with Spacers

A master batch of thermal cure epoxy was made using 96 parts by weight Dow 431 epoxy novolac resin, 4 parts fumed silica and 4 parts 2 ethyl 4 methyl imidazole. To small portions of the above master batch 2 parts by weight of the following spacer materials were added. A dab of the epoxy/spacer mixture was then put on a 1"×2"×0.085" thick piece of chrome coated glass such that the epoxy mixture was in contact with the chrome reflector. A 1"×1"×0.85" piece of ITO coated glass was placed on top and the glass sandwich was clamped such that the glass pieces bottomed out to the spacer material. The element was then cured at about 180 degrees Centigrade for about 15 minutes. Subsequently, once the element returned to room temperature, it was visually inspected for dimples looking at the chrome as if it were on surface two.

Example 2

Primary Seal Material

Using the thermal Cure Epoxy of Example 1 plus 140 um Glass Beads caused a very heavy dimple pattern to be visible.

Example 3

Primary Seal Material

Using the thermal Cure Epoxy of Example 1 plus Plastic Beads (Techpolymer, Grade XX-264-Z, 180 um mean particle size, Sekisui Plastics Co. Ltd., Tokyo, Japan) caused no dimple pattern to be visible.

Example 4

Primary Seal Material

Using the thermal Cure Epoxy of Example 1 plus Plastic Fibers (Trilene, 140 um diameter monofilament line cut to 450 um lengths, Berkley, Spring Lake, Iowa) caused no dimple pattern to be visible.

Example 5

Primary Seal Material

Using the thermal Cure Epoxy of Example 1 plus Hollow Ceramic Beads (Envirospheres, 165 um mean particle size, Envirospheres PTY Ltd., Lindfield, Australia) caused very slight but acceptable dimple pattern to be visible.

Example 6

Primary Seal Material

Using an epoxy cured at room temperature caused no dimple pattern to be visible after 1 week at room temperature.

Example 7

Primary Seal Material

Using two parts by weight glass beads (140 um) added to a UV curable adhesive, Dymax 628 from Dymax Corporation, Torrington Conn., and the adhesive was compressed between two glass substrates as described above caused a very slight but acceptable dimple pattern to be visible. The adhesive was UV cured at room temperature.

Figure 7M:
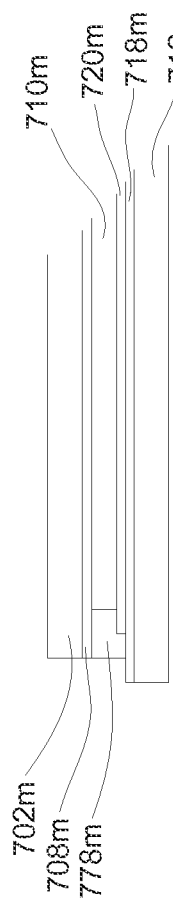
Figure 7L:
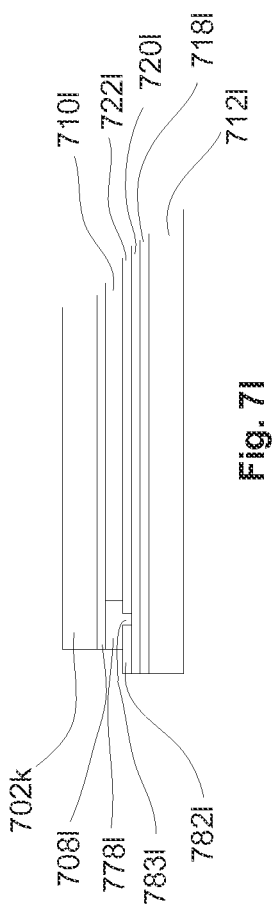
Figure 7N:
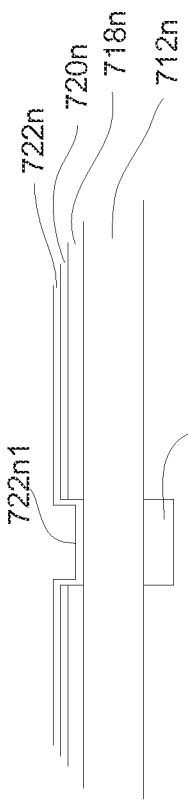

Turning to FIGS. 7*a-n* there are shown various options for selectively contacting a particular portion of the second and third surface conductive electrode portions 705, 710. As can be appreciated, the configuration of FIG. 5 results in the electrically conductive material contacting at least a portion of each the second and third surface conductive electrode portions.

The element construction depicted in FIG. 7*a* comprises a first substrate 702*a* having a second surface stack of materials 708*a* and a second substrate 712*a* having a third surface stack of materials 722*a*. The third surface stack of materials is shown to have an isolation area 783*a* such that a portion of the third surface stack of materials that is in contact with a conductive epoxy 748*a* is isolated from the remainder of the third surface stack of materials. The first and second substrates are held in spaced apart relationship to one another via a primary seal material 778*a*. It should be understood that another side of the element may have a similar isolation area associated with the second surface stack of materials for providing contact to the third surface stack of materials within the viewing area. It should be understood that either the second or third surface stack of materials may be a single layer of on materials as described elsewhere herein and within references incorporated herein by reference.

The element construction depicted in FIG. 7*b* comprises a first substrate 702*b* having a second surface stack of materials 708*b* and a second substrate 712*b* having a third surface stack of materials 722*b*. The first and second substrates are held in a spaced apart relationship with respect to one another via a primary seal material 778*b*. An electrically conductive epoxy 748*b* is in contact with the third surface stack of materials and electrically insulated from the second surface stack of materials via the insulating material 783*b*. It should be understood that another side of the element may have a similar isolation area associated with the second surface stack of materials for providing contact to the third surface stack of materials within the viewing area. It should be understood that either the second or third surface stack of materials may be a single layer of on materials as described elsewhere herein and within references incorporated herein by reference.

The element of FIG. 7*c* comprises a first substrate 702*c* having a second surface stack of materials 708*c* and a second substrate 712*c* having a third surface stack of materials 722*c*. The first and second substrates are held in spaced apart relationship with respect to one another via a primary seal material 778*c*. The second surface stack of materials extends toward the edge of the first substrate beyond the primary seal material such that it is in electrical contact with a first electrically conductive epoxy, or first solder, 748*c*1. The third surface stack of materials extends toward the edge of the second substrate beyond the primary seal material such that it is in electrical contact with a second electrically conductive epoxy, or second solder, 748*c*2. It should be understood that another side of the element may have a similar isolation area associated with the second surface stack of materials for providing contact to the third surface stack of materials within the viewing area. It should be understood that either the second or third surface stack of materials may be a single layer of on materials as described elsewhere herein and within references incorporated herein by reference.

FIG. 7*d* depicts the second surface electrical contact 748*d*1 being made on an opposite side of the element from a third surface electrical contact 748*d*2. FIG. 7*e* depicts the second surface electrical contact 748*e*1 being made on a side of the element and the third surface electrical contact being made on an end of the element. FIG. 7*f* depicts the second surface electrical contact 748*f*1 being made on one side and continuously with one end of the element and the third surface electrical contact 748*f*2 being made on an opposite side and continuously with an opposite end of the element. FIG. g depicts the second surface electrical contact 748*g*1 being made on opposite sides of the element and the third surface electrical contact 748*g*2 being made on an end of the element. FIG. 7*h* depicts the second surface electrical contact 748*h*1 being made on opposite sides of the element and the third surface electrical contact 748*h*2 being made on opposite ends of the element. FIG. 7*i* depicts the second surface electrical contact 748*i*1 being made continuously on opposite ends and one side of the element and the third surface electrical contact 748*i*2 being made on one side of the element. It should be understood that, in at least one embodiment, the longer electrical contact will correspond to the surface having the highest sheet resistance stack of materials. It should be understood that the electrical contact may be via electrical conductive epoxy, solder or an electrically conductive adhesive.

FIG. 7*j* depicts an element comprising a first substrate 702*j* having a second surface stack of materials 708*j* and a second substrate 712*j* having a third surface stack of materials 722*j*. The first and second substrates are held in spaced apart relationship with respect to one another via perimeter first and second primary seals 748*j*1, 748*j*2. The first primary seal functions to make electrical contact with the second surface stack of materials and the second primary seal functions to make electrical contact with the third surface stack of materials. The first and second primary seals hold the first and second substrates in a spaced apart relationship with respect to one another and preferably both primary seals are substantially outside the edge of each substrate.

With reference to FIG. 7*k*, a profile view of a portion of a rearview mirror element is depicted comprising a first substrate 702*k* having at least one layer 708*k* of a substantially transparent conductive material deposited on the second surface and a second substrate 712*k* having a stack of materials deposited on the third surface secured in a spaced apart relationship with respect to one another via a primary seal material 778*k* to define a chamber there between. In at least one embodiment, an electro-optic medium 710*k* is located within said chamber. In at least one embodiment, the third surface stack of materials comprises an underlayer 718*k*, a conductive electrode layer 720*k*, a metallic layer 722*k* and a conductive tab portion 782*k* having an overlap portion 783*k* underneath the metallic layer and primary seal material. It should be noted that the conductive tab portion 782*k* could alternatively be deposited over the metallic coating 722*k* to create the overlap portion. In at least one embodiment, the underlayer is titanium-dioxide. In at least one embodiment, the underlayer is not used. In at least one embodiment, the conductive electrode layer is indium-tin-oxide. In at least one embodiment, the conductive electrode layer is omitted. In at least one embodiment, the conductive electrode layer emitted and the underlayer is either a thicker layer of titanium-dioxide or some other substantially transparent material having a relatively high index of refraction (i.e. higher index of refraction than ITO), such as, silicon carbide. In at least one embodiment, the conductive tab portion comprises chrome. It should be understood that the conductive tab portion may comprise any conductive material that adheres well to glass and is resistant to corrosion under vehicular mirror testing conditions. As can be appreciated, when the third surface stack of materials, or at least those layers within the stack that are susceptible to corrosion, are kept within an area defined by an outer edge of the primary seal material, the element will be substantially immune to problems associated with third surface corrosion. It should be understood that the layer, or layers, susceptible to corrosion may extend beyond the primary seal material provided a protective overcoat or sealant is incorporated, such as, conductive epoxy or an overcoat layer. It should be understood that any of the first, second, third and fourth surface layers or stacks of materials may be as disclosed herein or within the references incorporated elsewhere herein by reference. It should be understood that the conductive tab portion improves conductivity over the conductive electrode; as long as a conductive electrode layer is provided with sufficient conductivity, the conductive tab portion is optional. In at least one embodiment, the conductive electrode layer imparts the desired color specific characteristics of the corresponding reflected light rays in addition to providing the desired conductivity. Therefore, when the conductive electrode is omitted color characteristics are controlled via the underlayer material specifications.

Turning to FIG. 7*l*, a profile view of a portion of a rearview mirror element is depicted comprising a first substrate 702*l* having at least one layer 708*l* of a substantially transparent conductive material deposited on the second surface and a second substrate 712*l* having a stack of materials deposited on the third surface secured in a spaced apart relationship with respect to one another via a primary seal material 778*l* to define a chamber there between. In at least one embodiment, an electro-optic medium 710*l* is located within said chamber. In at least one embodiment, the third surface stack of materials comprises an underlayer 718*l*, a conductive electrode layer 720*l*, a metallic layer 722*l* and a conductive tab portion underneath the primary seal material. In at least one embodiment, a void area 783*l* is defined between the metallic layer and the conductive tab portion, the conductive electrode provides electrical continuity there between. In at least one embodiment, the underlayer is titanium-dioxide. In at least one embodiment, the underlayer is not used. In at least one embodiment, the conductive electrode layer is indium-tin-oxide. In at least one embodiment, the conductive tab portion comprises chrome. It should be understood that the conductive tab portion may comprise any conductive material that adheres well to glass and is resistant to corrosion under vehicular mirror testing conditions. As can be appreciated, when the third surface stack of materials, or at least those layers within the stack that are susceptible to corrosion, are kept within an area defined by an outer edge of the primary seal material, the element will be substantially immune to problems associated with third surface corrosion. It should be understood that any of the first, second, third and fourth surface layers or stacks of materials may be as disclosed herein or within the references incorporated elsewhere herein by reference.

With reference to FIG. 7*m*, a profile view of a portion of a rearview mirror element is depicted comprising a first substrate 702*m* having at least one layer 708*m* of a substantially transparent conductive material deposited on the second surface and a second substrate 712*m* having a stack of materials deposited on the third surface secured in a spaced apart relationship with respect to one another via a primary seal material 778*m* to define a chamber there between. In at least one embodiment, an electro-optic medium 710*m* is located within said chamber. In at least one embodiment, a first metallic layer 718*m* is deposited over substantially the entire third surface. In at least one embodiment, a second metallic layer 720*m* is deposited over the first metallic layer such that an outer edge of the second metallic layer is located within an area defined by an outer edge of a primary seal material 778m. In at least one embodiment, the first metallic layer comprises chrome. In at least one embodiment, the second metallic layer comprises silver or a silver alloy. It should be understood that any of the first, second, third and fourth surface layers or stacks of materials may be as disclosed herein or within the references incorporated elsewhere herein by reference.

Turning to FIG. 7n, a second substrate 712n is depicted comprising a stack of materials having an eyehole 722n1 substantially in front of a light sensor or information display. In at least one embodiment, a first metallic layer 718n is provided with a void area in the eyehole area. In at least one embodiment, a second metallic layer 720n is provided with a void area in the eyehole area. In at least one embodiment, a third metallic layer 722n is provided. In at least one embodiment, only the third metallic layer is deposited in the eyehole area. In at least one embodiment, the first metallic layer comprises chrome. In at least one embodiment, the second metallic layer comprises silver or silver alloy. In at least one embodiment, the third metallic layer comprises a thin silver, chrome or silver alloy. It should be understood that any of the first, second, third and fourth surface layers or stacks of materials may be as disclosed herein or within the references incorporated elsewhere herein by reference.

One way the spectral filter material 715, proximate a first surface conductive electrode, can be electrically insulated from other conductive electrode portions is by overcoating at least portions of the spectral filter material with an organic or inorganic insulating material as depicted in FIG. 7b.

When a spectral filter material, such as chrome metal, is applied on top of the transparent conductor of the second surface through a mask in a coating operation (such as by vacuum sputtering or evaporation etc.), a non-conductive coating may be applied through a mask in the same process to electrically isolate the second surface conductive electrode from the third surface conductive electrode in the conductive seal area.

Example 1

Insulating Material

A spectral filter material comprising metal, metal alloy, layers of metals, layers of metal alloys or combinations there of, such as chrome, molybdenum, stainless steel, or aluminum, rhodium, platinum, palladium, silver/gold, white gold and ruthenium, often over an adhesion promotion material such as chrome, is vacuum deposited through a mask over a transparent conductor (such as ITO) to cover the seal area. An insulating material such as silicon, silicon dioxide, chromium oxide, aluminum oxide, titanium oxide, tantalum oxide, zirconium oxide, or yttrium oxide can be applied with use of a mask over top the metal layer to electrically isolate the desired spectral filter material area from other conductive portions. This electrical insulation material is not applied to, or removed from, portions of the spectral filter material or admission/conductivity promotion material where electrical conductivity is desired.

One method to reduce the size of, or to eliminate the need for, the bezel is to make an element with substantially no offset between the peripheral edges of the first and second substrates using an electrically conductive material as a portion of the electrical bus. In order to use the preferred electrically conductive material, an isolation of a portion of the conductive materials on the second and, or, third surfaces needs to take place. The second and third surfaces would be shorted together by the electrically conductive material if one portion of each surface were not isolated in non-overlapping areas. The third surface may be electrically isolated on one side of the element and the second surface would be electrically isolated on an opposite or adjacent side of the element. Preferably, a laser is employed to remove conductive material from the desired areas. The laser separation is preferably located between the electrically conductive material and the visibly active area of the element. More preferably the separation area is located such that an anode and cathode are not coexistent on the same surface and in contact with the electro-optic medium. When an anode and cathode are located on the same surface with the addition of an anode or a cathode on the adjacent surface, a residual slow to erase color will be present along the separation area. Additionally, with an anode on the second surface and the third surface between the seal and the separation area, the color produced by the anode is visible between the primary seal material, and the separation area. Likewise if a cathode is located on the third surface and the second surface between the primary seal material and the separation area the color produced by the cathode is visible from the front between the separation area and the primary seal material.

In mirror elements having a spectral filter material between the viewer and the primary seal material a separation area may be incorporated. With the spectral filter material on the first surface the mirror element is made much the same as described with regards to elements that do not include a spectral filter material. The separation areas are not visible when looking at the first surface. When the spectral filter material is proximate the second surface the separation area is visible when looking at the first surface.

A typical laser defined separation area is between 0.005-0.010 inches wide. By making the separation area 0.002-0.004 inches wide it is much less noticeable. Even more preferable would be an isolation line of less than 0.002" so as to be virtually unnoticeable from the driver's perspective. Material can be removed to create an electrical isolation line using a variety of techniques including masking during coating deposition, media blasting, laser ablation, mechanical abrasion, chemical etching, or other methods known in the art. Photolithography in combination with chemical, reactive ion or other etching method could produce isolation lines below 1 um in width. It should also be noted that shorter wavelength lasers can be focused to create a smaller spot size. This provides for a more narrow and less visible electrical isolation line. As the isolation line becomes more narrow, it may become increasingly difficult to achieve complete electrical isolation between the first and second conductive portions. The resistance between the two conductive portions can be easily measured using an ohmmeter. For a typical electro-optic mirror element it is preferred that this resistance is greater than 30 ohms. It is more preferred that this resistance is greater than 100 ohms. Complete electrical isolation is most preferred. The separation area is preferably located within the primary seal material area, and extending the length of the element to provide a large electrical contact area. When the separation area is located over the top of the primary seal material area, the color, or transparency of the seal can be adjusted to help hide the separation area. This separation area may be incorporated into artwork or text on the mirror element. A separation area may be incorporated into a disclaimer on the mirror element, a manufacturers emblem, or other graphic and, or, text. It should be understood that the laser line may be positioned along the inner edge of the spectral filter material. In this configuration, the majority of the laser line is not visible because the laser line coincides with the edge of the spectral filter material. Some residual color is present after clearing the electro-optic media on the same substrate, however, most of the colored area is hidden from view behind the spectral filter material. The only laser line portions that are visible are short line segments made through the spectral filter material near the edge in two places.

It is also generally desirable to position the electrode isolation line, such as a laser ablation line in an area of the mirror, outside of the specified field of view of the mirror. There are legal guidelines in the United States, Europe and in other countries for the minimum area to the side and rear of a vehicle that must be visible in a mirror. This area can be projected onto the surface of the mirror and objects that are within the boundaries of that projection must be visible to the driver. This projection generally takes the shape of a triangle and the size of the projection can be larger or smaller depending on whether the mirror surface in flat or bent. FIG. 2a details the shape (identified with dashed line 211a) of a typical specified minimum field of view projection for a left hand outside electrochromic mirror with a bezel. Since the bezel area is not reflective it cannot be included in the field of view of the mirror. However, the bezel area can be covered with a spectrally reflective coating such as a metallic ring on surface two. As long as this reflective ring has a high enough reflectance to meet the minimum reflectance standards for the particular country, this area could be considered field of view. As described previously the mirror could then be made smaller by the bezel width while maintaining the same specified field of view. Again, it would be preferable to locate any visible electrode isolation lines outside of the projection of the specified field of view of the mirror.

Another way to isolate the electrically conductive material is to use a nonconductive layer between the electrically conductive material and the surface to be isolated, such as a vacuum deposited dielectric ink, or a thinned layer of a nonconductive epoxy or other resin. It may be desirable to employ a separation area proximate the third surface because the separation area is not visible looking at the first surface. By using a nonconductive material on the second surface there is no need for a first separation area. This is particularly desirable when the second surface has a spectral filter material. By thinning a nonconductive epoxy a very thin layer can be obtained. This is important because enough area needs to be provided to apply the electrically conductive material. Preferably, the nonconductive epoxy is only flash cured. For example, place the material in an 85c oven for approximately two minutes. If the nonconductive epoxy is fully cured and is partially covering an area that is in contact with the primary associated spacer beads undesirable, non-uniform, cell spacing may be created. By not curing the nonconductive material completely the spacer beads will more easily penetrate the layer during the finale cure, and not affect the cell spacing.

An external electrical connection may be made to the third surface of an electro-optic mirror element having a second surface spectral filter material by extending at least a portion of the third surface conductive electrode under the primary seal material area and over the perimeter edge of the second substrate. When coating (such as by vacuum sputtering) over the edge of a piece of glass, the conductivity of the coating tends to decrease over a sharp edge or rough surface, also the coating process does not typically provide a durable coating on the side or edge of the glass. To do this without losing conductivity, a good seam or polish on the substrate corner and, or, edge is helpful to provide a smooth transition from the third surface to the edge. A rough ground surface without polishing has lower conductivity at a typical third surface coating thickness. The smoother the surface and transition from the third surface to the edge, the better the conductivity. A sputter target mounted to coat the edge of the glass during the coating process is also helpful to provide a more uniform and durable coating.

It is conceivable that the coating could be extended over the edge of the glass and onto the back of the glass such that the electrical connection to the third surface could be made on that back of the mirror element. A reflective third surface is typically more conductive than a second surface conductive electrode, therefore, an electrically conductive material may not be needed. Therefore, the primary seal material may be dispensed up to the edge of the substrate. Having the third surface material extending onto the edge may only be on one side. The opposite substrate may comprise a separation area and electrically conductive material to the third surface since it is not visible.

With the third surface material extended onto the edge of the substrate, an L clip in lieu of a J clip, can be used since there is no need to have a clip portion inserted between the second and third surfaces. The L clip only needs to be long enough to contact the conductive portion on the edge. A conductive epoxy could be used to bond to the third surface material on the edge to the L clip. A pressure sensitive adhesive could be used on the back of the L clip to secure it to the fourth surface. Alternatively, solder could be applied directly to the coating on the edge or back of the mirror. In one embodiment, the solder could be used as both the contact and as a conductive bus system.

One advantage of making external electrical contact to the third surface material extended onto the edge of the substrate is that a conductive material is not longer required adjacent to the primary seal for filter material on the first or second surface may be narrower while still covering the primary. Although a typical spectral filter material may vary from 4 to 8 mm in width, it may be aesthetically pleasing to reduce this width below 4 mm. As the width of the primary seal is reduced, the width of the spectral filter material may also be reduced. Using assembly and sealing techniques previously disclosed, it is possible to reduce the primary seal with to less than 1 mm which allows for a spectral filter width of less than 1 mm.

Another way to make electrical connection to the third surface, isolated from the second surface is to use a conductive ink or epoxy to connect the third surface to the edge. Thinning the conductive ink or epoxy and applying it to the edge of the substrate contacts the third surface, without contacting the second surface. With this thinned conductive epoxy, a conductive path can be applied such that contact is made on the edge or the back of the mirror element. An L clip may be applied contact and cured in place. A pressure sensitive adhesive may be used to secure the L clip in place during the curing process and to provide strain relief with connecting wires.

If the corrosive effects of the environment on the metal can be minimized, very thin metal films or foils can used to establish a stable interconnect to the conductive adhesive or bus. This metal foil or metal film on a plastic foil could be conformed to the shape of the J clip or other desired shape (without the need of expensive forming dies) and adhered to the substrate with an adhesive such as a pressure sensitive. This metal foil or metal film on plastic foil may be in the form of a roll of adhesive tape that is cut to size and applied to the EC element substrate such that one end comes in contact with the conductive bus that is in contact with the front and/or back electrode(s). A spade connect or wire may be attached to the other end of the metal foil or film by traditional methods such as soldering or conductive adhesive, or the end of the metal foil or tape may connect directly to the voltage source for the EC element such as a printed circuit board.

At least one embodiment of a formable contact comprises of 0.001" palladium foil (Aldrich chemical Milwaukee, Wis.) laminated to 0.002" acrylic double side adhesive tape with a release liner (product 9495 200MP series adhesive 3M Corporation, Minneapolis, Minn.). The metal foil tape may be cut to an acceptable size for application on an electrochromic device. The metal foil or metal film on plastic foil tape may also be precut to a form or shape if desired.

At least one embodiment of a formable contact may be made from a plastic film and metalized with a metal such as gold, silver, titanium, nickel, stainless steel, tantalum, tungsten, molybdenum, zirconium, alloys of the above, or other metals or metal alloys that resist salt spray corrosion. Also, palladium or other platinum group metals such as rhodium, iridium, ruthenium, or osmium may be used.

At least one embodiment of a formable contact uses a polymer carrier comprising of 0.002" polyimide tape (#7648A42 McMasterCarr, Chicago, Ill.) coated with chrome and with any platinum group metal such as rhodium, indium, ruthenium, or osmium as the base, then coated with a layer of silver, gold or alloys thereof. This system is solderable and has sufficient flexibility to wrap around the glass edge from one substrate surface to another surface.

At least one embodiment of a conductive coated polymer film is those produced for the flexible circuit industry. In at least one embodiment, Sheldahl (Northfield, Minn.) produces combinations of polyimide (Kapton) and polyester films coated with ITO, Aluminum, copper, and gold. Polyimide tapes coated with a base metal may be plated or coated with different metals or alloys to improve durability and/or solderability. These films can be coated with an adhesive or laminated to double sided tape as described above. This metalized foil can be bent around a glass edge and maintain good conductivity.

At least one embodiment using a fibrous substrate is comprised of a solvent based ink placed onto a fiber backing. The conductive ink is comprised of 10 parts methyl carbitol (Aldrich Milwaukee, Wis.), 2 parts Bis A-epichlorhydrin copolymer (Aldrich Milwaukee, Wis.), and 88 parts of LCP1-19VS silver epoxy flake. The conductive ink may be applied to fibrous material such as those comprising of glass, metal, or cellulose. The system is heated sufficiently to evaporate the solvent. The conductive and flexible formable contact is then applied to one surface, wrapping around to another surface.

At least one embodiment of a polymeric formable contact incorporates a construction mechanism to either protect the metal, hide the metal color, or offer another color more appealing to the outside appearance of the glass edge. This construction would incorporate a polymeric film on the outside, followed inwardly by the metal coating, and followed inwardly by an adhesive. The metal coating within the system would need to have an exposed edge for making contact to one of the glass inside conductive surfaces. Contact to this end could be made with an applied conductive adhesive, solder, or other method to make a stable electrical contact. The opposite end could have contact made with conductive adhesive, solder, or other mechanical means.

In relation to the conductivity of a conductive polymer or composite, there are methods to describe the conductive polymer or composite's conductivity. Those skilled in the art of Isotropic and anisotropic conductive adhesives commonly use a 4-pin probe for the resistance measurement. A common unit of measurement in the field of conductive adhesives is ohms/square/mil. This measurement is expressed as not only a factor of width, but also of thickness. This measurement, when performed on a nonconductive substrate, expresses the linear conductivity of a conductive polymer or composite such as a metal or carbon or metal oxide conductive particle filled epoxy.

Another method by which to determine conductive polymer effectiveness for use as a bus is to utilize isolated conductive pads and bridge these isolated pads using the conductive polymer. A particular way to perform this test is to isolate conductive coatings on glass with laser ablating, physical scoring, or chemical removal. The uncured conductive polymer is applied to bridge the conductive pads so that the current path must pass through multiple contact interfaces, but is still isolated from itself so as to not short the bridges together. A resistance reading is taken at the ends, across the test piece.

Not all conductive polymers with high conductivity measured by the ohm/sq/mil method have adequate interfacial electric contact to the electrode surfaces used in an electrochromic device. Based on the above coupon using an ITO electrode as the isolated conductive pad, an acceptable resistance would be less than 1000 ohms. A more preferred resistance is less than 500 ohms, and an even more preferred resistance is less than 200 ohms.

There are methods to affect this interfacial conductivity through the selection of conductive polymer components. The shape of the metal powder or flake can affect the interfacial contact. Additives can also affect the interfacial contact. Coupling agents, curing catalysts or cross linkers, epoxy resin systems, and methods by which to process the silver epoxy can have an affect on the conductive polymer's ability to make electrical contact to an adjacent conductive surface.

In at least one embodiment, a silver epoxy comprising of 3 parts Hexahydrophthalic anhydride (Aldrich, Milwaukee Wis.), 2.14 parts Aniline glycidyl ether (Pacific Epoxy Polymers), 0.1 parts Benzyl dimethyl amine (Aldrich chemical, Milwaukee Wis.), and 23.9 parts silver flake LCP1-19VS (Ames Goldsmith, Glens Falls, N.Y.). When tested using an ohm/square/mil conductivity measurement, results are acceptable (approximately 0.020 ohm/sq/mil).

In another embodiment, U.S. Pat. No. 6,344,157 and U.S. Pat. No. 6,583,201 disclose the use of corrosion inhibitors, oxygen scavengers or metal chelating agents for use in conductive adhesives.

In some cases, additives can be added to silver epoxies to stabilize or improve conductivity. In at least one embodiment, a silver epoxy comprising of 3.4 parts Bis F epoxy resin (Dow Corporation; Midland, Mich.), 1.1 parts (Air Products and Chemicals; Allentown, Pa.), 20.5 parts silver flake (Ames Goldsmith, Glens Falls, N.Y.), and 0.03 parts Diethanolamine (Aldrich Milwaukee, Wis.). Results are acceptable for both conductivity (approximately 0.020 ohms/square/mil) and interfacial contact (approximately 190 ohms).

As mentioned elsewhere in this patent, a sputtered or vacuum applied metal coating can be extended beyond the seal and over the edge of the glass to be used as an electrical connection. The metal coating should meet the criteria of corrosion resistant metals listed above. The electrical connection to this coating could be made with a spring clip, or solder could be applied directly to the metal coating.

At least one embodiment of a solderable metal coating on glass, chrome is coated as the base layer then coated with any platinum group metal such as rhodium, irridium, palladium, ruthenium, or osmium, or copper, silver or gold, or alloys of the above are solderable using tin/lead solders.

In another embodiment, chrome is coated as the base layer, then coated with any platinum group metal such as rhodium, irridium, palladium, ruthenium, or osmium, then coated with copper, silver or gold or alloys of the above are solderable using tin/lead solders.

In current automotive construction, restrictions exist using lead base components such as solders. Other solders such as tin/zinc tin/silver, indium based solders containing silver, bismuth, tin, zinc, copper, and or antimony; silver solders or other non lead containing alloys may be used as a solder material. Soldering systems that may be employed are inductive heat, IR heat, ultrasonic, wave soldering or a soldering iron.

Another advantage to having a thinner conformable conductive bus clip material as an electrical interconnect to the conductive epoxy is to reduce distortion in the reflection of the first substrate particularly when the first element is larger than the second element. Distortion can be generated as a result of high temperature seal curing and differences in the coefficients of thermal expansion between the seal and the conductive clips. The thicker the clip material, the more distortion is seen, particularly when using more flexible substrates. A thinner clip material also has the advantage of being less noticeable if it is used to wrap around the $3^{rd}$ surface to the back of the mirror. This is particularly relevant if the first and second elements are aligned at the point the clip wraps around. When the first element extends past the second element, the clip can be hidden entirely from view.

Example: An electrochromic mirror was made with flat 1.6 mm thick glass for both front and rear elements. The front element was cut 0.040" larger (offset) on three sides. The inboard side (the side closest to the driver) had no offset to facilitate easier filling and plugging of the part. A 0.001"×0.5"×0.75" silver foil with 0.002" thick pressure sensitive adhesive was applied on top and bottom of the second element. The conformable conductor contacted 0.010"-0.030" of surface three then rapped around to the fourth surface. A primary seal material was then dispensed around the perimeter of the first element leaving approximately 0.040" for an offset on three sides and an additional 0.040 between the seal material and the edge of the glass element on both the top and bottom edge of the second surface of the first element. The second element was then attached to the first element leaving a 0.006" space between the elements. The seal material was cured to fix the elements in this spaced apart relationship. After cure of the primary seal, a Conductive epoxy was then injected into the part from the edge on the top and bottom of the part, thereby encapsulating and making electrical contact with the third surface portion of the conformable conductor. It should be noted that this process of dispensing a primary seal and a conductive seal could be accomplished more readily and easily on a dual dispense system, dispensing both epoxies at the same time. The conductive epoxy was then cured. The mirror was inspected for distortion of the first surface reflection over the conformable conductor, and no distortion was found. When similar mirrors were constructed using either Nickel, Stainless steel or Copper clips with a 0.003" thickness, visual distortion can be seen near the perimeter of the first surface in the area directly above the clip.

As mentioned elsewhere herein, establishing electrical contact to the second and third surface conductive electrodes typically involves coordination of a number of individually designed components. Turning to FIGS. 8a-i, various options for electrical clips are depicted. The placement of the electrical clips is discussed throughout this disclosure in concert with the electrically conductive material.

A preferred electrically conductive material comprises 27.0 g Dow 354 resin—a bis phenol F epoxy functional resin. Viscosity is preferably ~4000 cP 9.03 g Air Products Ancamine 2049—a cycloaliphatic amine cure agent. Viscosity preferably is ~60 cP, 164 g Ames Goldsmith LCP 1-19VS silver—a silver flake with tap density ~3 g/cc and average particle size ~6 microns.

As described herein, at least one embodiment comprises a perimeter material surrounding the periphery of the element. A preferred perimeter material comprises 120 g Dymax 429 with some fillers added (i.e. 0.40 g 6-24 silver flake available from Ames Goldsmith, 1.00 g silver coated glass flake (i.e. Conduct-o-fil available from Potters industries), 12.0 g crushed SK-5 glass filler available from Schott glass or a combination thereof crushed into a powder and sieved with a 325 mesh). This material can be applied to the mirror edge using a number of techniques. One technique is to load the material into a 30 cc syringe with a needle (~18 gage). The needle can be oriented in a vertical position such that the perimeter material is dispensed with air pressure (<50 psi) onto the edge of the element while the element is being mechanically rotated on a robot arm or other mechanical device. The applied edge material can then be cured with UV light. Complete cure can be accomplished in 20 seconds or less. A robot may also be employed to rotate the part as it is being cured to prevent sagging.

The intent of the perimeter material is to: protect the bus components; hide visible components like electrically conductive materials, clips, seals, glass edges; protect the cut edge of glass and offer an appealing visual appearance of the mirror element. This may also be achieved with use of conventional plastic bezels, grommets, elastomeric bezels and the like.

Many different materials (such as epoxy, silicone, urethane, acrylate, rubber, hotmelt) and cure mechanisms can be used for this edge treatment. The preferred cure method is by UV radiation. If fillers, dyes, or pigments that are partially opaque to UV radiation are used, a combination UV thermal cure can be used. Fillers such as glass or reflective silver aid the penetration of UV light by transmission, scattering or internal reflection, and are preferred for good depth of cure. Preferably the perimeter material has a gray color or appearance similar to that of a ground glass edge or is dark or black in color. Colors may be varied by use of organic dyes, micas, impregnated micas, pigments, and other fillers. A darker, more charcoal appearance may be achieved by selecting different fillers and different amounts of filler. Less crushed glass will darken and flatten the color of the above formulation. Use of only crushed glass (or flakes or other glass particle) with a different refractive index than the edge material resin binder will give the appearance of a ground glass edge, or rough pencil edge. Some additives are denser than the media they are contained in. Fumed silicas can be added to help prevent settling of the heavier components (metal and glass particles); 2% by wt of fumed silica was found to be sufficient in the preferred method.

Other ways to apply the perimeter material to the element edge include applying the material with a roll, wheel, brush, doctor bar or shaped trowel, spraying or printing.

The perimeter edge materials chosen for a vehicular exterior application preferably meet the following test criteria, these criteria simulate the exterior environment associated with a typical motor vehicle: UV stability (2500 kJ in UV weatherometer)—no yellowing or cracking or crazing of material when exposed to direct UV; Heat resistance—little or no color change, no loss of adhesion; Humidity resistance—little or no color change, no loss of adhesion; Thermal-cycling—No loss of adhesion, no cracking; CASS or salt spray—protection of the underlying metal coatings and conductive epoxy systems; No loss of adhesion and no visible sign of underlying corrosion and High Pressure water test—no loss of adhesion after parts have been tested in previous stated testing.

The perimeter edge materials chosen for an automotive exterior application preferably meet the following test criteria. These criteria simulate the exterior environment associated with a typical vehicle: UV stability (2500 kJ in UV weatherometer)—no yellowing or cracking or crazing of material when exposed to direct UV; Heat resistance—little or no color change, no loss of adhesion; Humidity resistance—little or no color change, no loss of adhesion; Thermal-cycling—No loss of adhesion, no cracking; CASS or salt spray—protection of the underlying metal coatings and conductive epoxy systems; No loss of adhesion and no visible sign of underlying corrosion and High Pressure water test—no loss of adhesion after parts have been tested in previous stated testing.

With further reference to FIGS. 7a-n, various embodiments for configuration of second and third surface electrode contact are shown. FIG. 7a-n depict configurations similar to that discussed elsewhere herein having a first surface stack of materials, a second surface stack of materials, a third surface stack of materials and, or, a fourth surface stack of materials. The word stack is used herein to refer to materials placed proximate a given surface of a substrate. It should be understood that any of the materials as disclosed in commonly assigned U.S. Pat. Nos. 6,111,684, 6,166,848, 6,356,376, 6,441,943, Ser. No. 10/115,860 U.S. Pat. Nos. 5,825,527, 6,111,683, 6,193,378, Ser. Nos. 09/602,919, 10/260,741 and 10/430,885, the disclosures of which are incorporated herein by reference, may be employed to define a unitary surface coating, such as a hydrophilic coating. Preferably, second, third and fourth surface stacks are as disclosed herein or in commonly assigned U.S. Pat. Nos. 5,818,625, 6,111,684, 6,166,848, 6,356,376, 6,441,943 and 6,700,692, the disclosure of each is incorporated in its entirety herein by reference.

FIGS. 7d-i depicts various embodiments for configuration of the anode and cathode connections to the second and third surface conductive electrodes, respectively. Preferably, the sheet resistance of the third surface conductive electrode is less than that of the second surface conductive electrode. Therefore, the cathode contact area may be substantially less than the anode contact area. It should be understood that in certain embodiments, the anode and cathode connections may be reversed.

The configuration of FIG. 7j may be used to constructing a no, or narrow, bezel rearview mirror assembly that does not incorporate a spectral filter. If the perimeter seal and electrode contact means 748j1, 748j2 were both substantially moved to the mirror edge there is not a requirement for a spectral filter material to cover the seal/contact area. When this approach to mirror element construction is used, the mirror element darkens substantially completely to the perimeter edge during glare conditions. In this approach most or all of the seal and contact area can be substantially moved from the perimeter of mirror substrate one, surface two and substrate two, surface three, to the edges of substrate one and substrate two.

In at least one embodiment, the top edge of the first substrate and the bottom edge of the second substrate were coated with a conductive epoxy to transfer electrically conductivity from the conductive electrode on each substrate to the substrate edge. The conductive epoxy is preferably formulated using: 3.36 g D.E.R. 354 epoxy resin (Dow Chemical, Midland, Mich.), 1.12 g Ancamine 2049 (Air Products and Chemicals, Reading Pa.) and 20.5 g of silver flake with an average particle size of 7 um tap density of 3.0-4.0 g/cc was thoroughly mixed into a uniform paste. This conductive epoxy mixture was thinned with enough toluene to produce a low viscosity conductive paint that could easily be applied to the substrate edge. The coated substrates were put in a 60 C oven for 15 to 20 minutes to evaporate the toluene.

A uniform layer of an epoxy that was sparsely filled with conductive particles (Z-axis conductor) was applied to 0.001" thick copper foil. The Z axis epoxy (5JS69E) was formulated as follows: 18 g of D.E.N.438, 2 g D.E.N. 431 (Dow Chemical, Midland, Mich.), 1.6 g of US-206 fumed silica (Degussa Corporation, Dublin, Ohio), 6.86 g Ancamine 2049 and 10.0 g silver flake FS 28 (Johnson Matthey, Royston, Hertfordshire, UK) was blended into a uniform paste. The silver flake filler had a tap density of 2.3 g/cc and an average particle size of 23 um. A cured thin film of this epoxy formulation becomes conductive in the z-axis and not in the x or y axis. This z-axis conductive epoxy was thinned with enough toluene or THF solvent to produce a viscosity suitable to spread into a thin uniform thickness onto the copper foil. The solvent was then evaporated off in a 60 c oven for approximately 5 min. The epoxy remained slightly tacky after solvent evaporation. The edges of the two substrates were aligned with virtually no offset. The gap between the substrates was accurately maintained by using precision sized PMMA beads as spacers. A small piece of Kapton tape approximately 2 mm wide was used on one end extending across the edges of both substrates and the cell spacing. The Kapton tape would eventually be removed from the cell after assembly and the Kapton tape area, which was not wetted with epoxy, would be used as a fill port. The copper foil with the z-axis conductive epoxy was then applied to the peripheral edge of the part such that the epoxy wetted both substrate edges completely. The element was then cured in an oven at 200 C for 15 minutes. After the cure, a small separation was made in the copper foil on each side to electrically isolate the copper foil on the top from the copper foil on the bottom of the part. The copper foil covering the Kapton tape and the Kapton tape was removed. The opening created by the removed Kapton tape was used to fill the part. The opening was then plugged with an UV curable adhesive. The opening on the opposite side was also plugged with an UV curable adhesive but before filling.

Figure 8N:
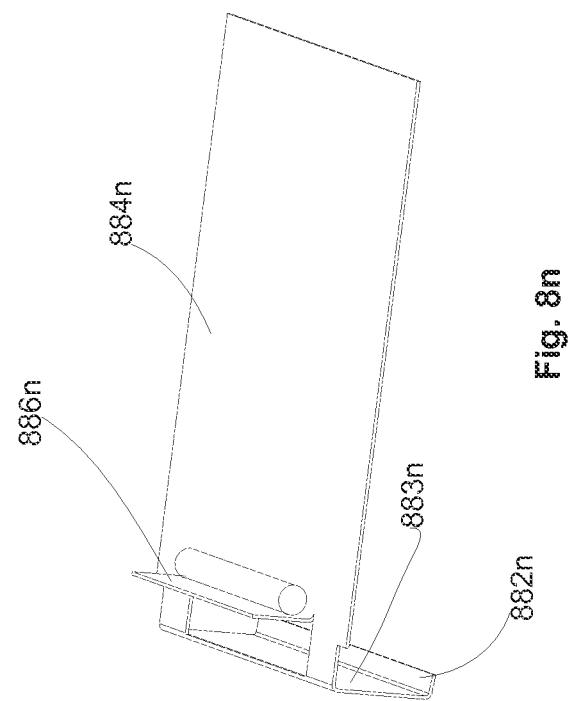
FIGS. 8a-n depict various electrical clips for establishing external electrical connections to the second and third surface conductive electrodes.

FIGS. 8a-n depict various embodiments for configuration of an electrical clip. Generally, the individual clips are depicted to define substantially a "J" shaped cross section.

The embodiment of FIG. 8a depicts a J-clip 884a configured to accommodate an electrical connection post (not shown) fixed thereto. In at least one embodiment, the first and second electrical clips are configured in combination with a carrier plate (as described in detail herein with respect to FIGS. 10a-c) to form a "plug" type electrical connector. The J-clip comprises an edge portion 883a and an inner element portion 882a. The inner element portion is configured to be positioned between a first and second substrate and to be in electrical contact with an electrically conductive epoxy, solder or conductive adhesive to make electrical contact with either a second or third surface stack of materials.

FIG. 8b depicts a series of apertures 885 bextending through an inner element portion 882b to, at least in part, facilitate a mechanical and, or, electrical contact with an electrically conductive material. The J-clip 884b comprises a wire connection feature 886b and an edge portion 883b. The wire connection feature may be configured to either accommodate a solder or a crimp type wire connection.

FIGS. 8c-e depict various J-clip configurations 884c, 884d, 884e comprising an electrical connection stab 886c, 886d, 886e having a friction fit hole 887c, 887d, 887e. Each J-clip has an edge portion 883c, 883d, 883e and an inner element portion 882c, 882d, 882e. FIG. 8c depicts having a portion 885c of the J-clip folded such that the J-clip is not as long and is taller than the J-clip of FIG. 8d. FIG. 8e depicts a series of apertures 881e extending through a third portion of the clip to provide a stress relief area to accommodate variations in material coefficients of expansion.

FIG. 8f depicts a raised portion 885f on a J-clip 884f along with a wire crimp 886f configured to spacially separate the wire contact area from the element. This J-clip comprises an edge portion 883f and an inner element portion 882f.

FIG. 8g depicts a J-clip 884g comprising a wire crimp 886g, an edge portion 883g and an inner element portion 882g. FIG. 8h depicts a J-clip 884h comprising a wire crimp 886h, an edge portion 883h and an inner element portion 882h. The inner element portion comprises a series of apertures 881h to facilitate enhanced mechanical and, or, electrical contact. FIG. 8i depicts a J-clip 884i comprising a wire crimp 886i, an edge portion 883i and an inner element portion 882i. FIG. 8j depicts a J-clip 884j comprising a wire crimp 886j, an edge portion 883j and an inner element portion 882j.

FIG. 8k depicts a J-clip 884k similar to that of FIG. 8a except having a longer portion for adhering to a substrate. This J-clip comprises an edge portion 883k and an inner element portion 882k.

FIG. 8l depicts a J-clip 884l having two large apertures 886l for stress relief along with four bumps 887l for enhancing electrical connection placement. This J-clip comprises an edge portion 883l and an inner element portion 882l.

Figure 8M:
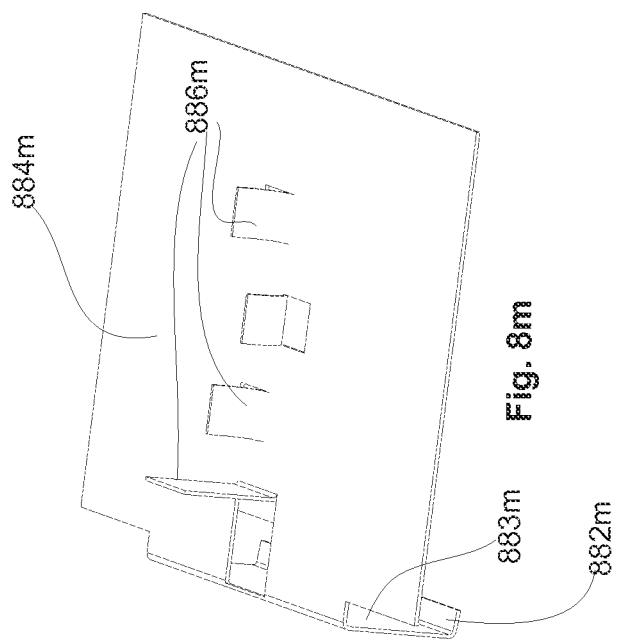

FIG. 8m depicts a J-clip 884m comprising a wire crimp 886m, an edge portion 883m and an inner element portion 882m. FIG. 8n depicts a J-clip 884n comprising a wire crimp 886n, an edge portion 883n and an inner element portion 882n.

Electro-optic mirrors often incorporate a bezel that covers the edge of the mirror element and the electrical bus connections. In addition, the mirror edge and bus connection are often encapsulated in a potting material or sealant. As long as the mirror remains functional, the aesthetics of the mirror edge and bus connection are not a concern. In contrast, Electro-optic mirrors without a bezel typically have both the mirror element edge and the associated electrical bus connections exposed to the environment. The bus connection typically utilizes a metal member (the term metal throughout this discussion on corrosion can represent a pure metal or a metal alloy) such as a formed clip or strip. Electro-optic mirrors with bezels often have formed metallic clips or strips made of copper or copper alloy. The appearance and corrosion resistance of these formed clips or strips becomes important if good aesthetics are to be maintained over the life of the vehicle. Copper and copper alloys tend to corrode and turn green in the salty wet environments an EC outside mirror is exposed to. This is not aesthetically acceptable. Even if the metal bus cannot be viewed directly, the formed metal clips or strips are typically made of thin material, usually less than 0.010" thick and more typically 0.005" or less in thickness. These thin metal pieces can corrode quickly resulting in structural failure, loss of spring electrical contact force or loss of electrical continuity. This issue can be minimized if the edge of the mirror and/or back of the mirror is covered with a paint or coating. The metal clip could also be protected from the environment with a coating such as a conformal coating, paint or varnish or metal plating or cladding. Examples of suitable conformal coatings are:

1. UV curing epoxy system comprising of 354 bis F resin (Dow Chemical) with 2% (by weight) of US-206 (Degussa) and 3% (by weight) of UVI-6992 (Union Carbide Corp—subsidiary of Dow Chemical). 0-3% (by weight) of US-206 and 2-5% (by weight) of UVI-6992.

2. Solvated urethane conformal coating like Humiseal 1A33 (Chase Corporation, Woodside N.Y.).

3. Solvated polyisobutylene comprising of 3 parts (by weight) pentane and 1 part (by weight) Vistanex LM-MS-LC (Exxon Chemical).

Examples of protective metal platings include gold, palladium, rhodium, ruthenium, nickel and silver. In general these coatings or surface platings retard the corrosion and extend the useful life of the electrical bus; however, corrosion often eventually occurs. Another approach to extending useful bus life is to make the bus clip or strip out of a metal or metal alloy that has good corrosion resistance in salty environments. Suitable metals include the noble metals and noble metals alloys comprising gold, platinum, iridium, rhodium, ruthenium, palladium and silver as well as metals and metal alloys of titanium, nickel, chromium, molybdenum, tungsten and tantalum including stainless steel, Hastalloy C, titanium/aluminum alloys, titanium palladium alloys, titanium ruthenium alloys. Zirconium and its alloys also perform well under certain circumstances. A table ranking a number these metals and metal alloys after copper accelerated salt spray (CASS) testing is included herein. The rankings are 4—unacceptable corrosion, 3—corrosion evident but acceptable, 2—light corrosion evident, 1—very light/no corrosion.

| Corrosion Ranking Table | | |
| --- | --- | --- |
| Material | Plating | Ranking |
| Olin 725 (Cu—Ni—Sn) | None | 4 |
| Olin 638 (Cu—Al—Si—Co) | None | 4 |
| Olin 194 (Cu—Fe—P—Zn) | None | 4 |
| Olin 510 Phos. Bronze (Cu—Sn—P) | None | 4 |
| Olin 713 | None | 4 |
| Phos. Bronze | Tin | 4 |
| Olin 770 German Silver (Cu—Zn—Ni) | None | 3 |
| Olin 752 (Cu—Zn—Ni) | None | 3 |
| Monel (Ni—Cu) | None | 3 |
| Brush Wellman (Cu—Be) | None | 4 |
| 174-10 | Palladium | 3 |
| 174-10 | Silver | 3 |
| 174-10 | Tin | 4 |
| 302 Stainless Steel | None | 2 |
| 302 Stainless Steel | Tin | 3 |
| 302 Stainless Steel | Silver | 3 |
| 302 Stainless Steel | Rhodium | 2 |
| 302 Stainless Steel | Nickel Strike | 1 |
| 302 Stainless Steel | Passivated Surface by JS | 2 |
| 316 Stainless Steel | None | 2 |
| Tin Foil | None | 3 |
| Silver Foil | None | 1 |
| Nickel | None | 1 |
| Titanium Unalloyed (grade 1) | None | 1 |
| Titanium Unalloyed (grade 2) | None | 1 |
| Titanium Unalloyed (grade 4) | None | 1 |
| Ti—6Al—4V (grade 5) | None | 1 |
| Ti—3Al—2.5V (grade 9) | None | 1 |
| Ti—0.15—Pd (grade 11) | None | 1 |
| Ti—0.15Pd (grade 16) | None | 1 |
| Ti—0.1Ru (grade 26) | None | 1 |
| Ti—3Al—2.5V—0.1Ru (grade 28) | None | 1 |
| Ti—6Ai—4V—0.1Ru (grade 29) | None | 1 |
| Molybdenum Foil | None | 2 |
| Gold Foil | None | 1 |
| Rhodium Foil | None | 1 |
| Lead Foil | None | 3 |
| Tungsten Foil | None | 1 |
| Palladium Foil | None | 1 |
| Cobalt Foil | None | 4 |
| Tantalum Foil | None | 1 |
| Nickel Foil | None | 1 |
| Nickel Foil | Silver | 1 |
| 316 Stainless Steel | Tin | 3 |

When the bus interconnection technique incorporates the use of two or more different metals in close contact with one another, the effects of galvanic corrosion is preferably considered. Many interconnection techniques utilize conductive adhesives. These adhesives generally are organic resins such as epoxy, urethane, phenolic, acrylic, silicone or the like that are embedded with conductive particles such as gold, palladium, nickel, silver, copper, graphite or the like. Unlike a metal solder joint, organic resins breathe. Moisture, oxygen and other gasses can diffuse through organic resins and cause corrosion. When dissimilar metals are in contact with one another this corrosion may be accelerated by the difference in the electrochemical potential of the metals. Generally, the greater the difference in electrochemical potential between the metal, the greater the probability of galvanic corrosion. It is therefore desirable to minimize the difference in electrochemical potential between metals selected for use in a bus system, especially when a naturally non-hermetic electrically conductive adhesive is used. When one or both of the metals are plated, it is preferred that a plating material is selected that has an electrochemical potential in between the electrochemical potentials of the two metals. For office environments that are humidity and temperature controlled the electrochemical potentials differences between the metals are preferably no more than 0.5V. For normal environments the potential difference is preferably no more than 0.25V. For harsh environments the potential difference is preferably no more than 0.15V. Many conductive adhesives use silver particulate or flake as the conductive filler. Silver represents a good compromise between cost and nobility. Silver is also has excellent conductivity. As described in metals galvanic compatibility charts such as those supplied by Engineers Edge (www.engineersedge.com) and Laird Technologies (www.lairdtech.com), silver has an anodic index of 0.15V. Tin plated copper or copper alloy that is typically used for bus connections in bezeled mirrors has an anodic index of 0.65V. When tin plated copper is used in contact with silver, the large 0.5V anodic potential difference is acceptable for use in controlled office like environments. The environment associated with outside vehicular mirrors is by no means a controlled environment. A potential difference of less than 0.45V is desirable, a difference of less than 0.25V is preferred and a difference of less than 0.15V is most preferred.

| Metals Galvanic Compatibility Chart | |
|---|---|
| Metal Surface | Anodic Index |
| Gold, solid and plated, Gold-platinum alloy, Graphite Carbon | 0.00 |
| Rhodium plated on silver | 0.05 |
| Rhodium plating | 0.10 |
| Silver, solid or plated; High silver alloys, monel metal. High nickel-copper alloys | 0.15 |
| Nickel, solid or plated, titanium and s alloys, Monel, nickel-copper alloys, titanium alloys | 0.30 |
| Copper, beryllium copper, cooper; Ni—Cr alloys; austenitic corrosion-resistant steels; most chrome-poly steels; specialty high-temp stainless steels, solid or plated; low brasses or bronzes; silver solder; German silvery high copper-nickel alloys; nickel-chromium alloys | 0.35 |
| Commercial yellow brass and bronzes | 0.40 |
| High brasses and bronzes, naval brass, Muntz metal | 0.45 |
| 18% chromium type corrosion-resistant steels, common 300 series stainless steels | 0.50 |
| Chromium plated; tin plated; 12% chromium type corrosion-resistant steels; Most 400 series stainless steels | 0.60 |
| Tin-plate; tin-lead solder | 0.65 |
| Lead, solid or plated, high lead alloys | 0.70 |
| Aluminum, wrought alloys of the 2000 Series | 0.75 |
| Iron, wrought gray or malleable, plain carbon and low alloy steels; armco iron; cold-rolled steel | 0.85 |
| Aluminum, wrought alloys other than the 2000 Series aluminum, cast alloys of the silicon type; 6000 Series Aluminum | 0.90 |
| Aluminum, cast alloys other than silicon type, cadmium, plated and chromate | 0.95 |
| Hot-dip zinc plate; galvanized steel or electro galvanized steel | 1.20 |
| Zinc, wrought; zinc-base die-casting alloys; zinc plated | 1.25 |
| Magnesium & magnesium-base alloys, cast or wrought | 1.75 |
| Beryllium | 1.85 |
| High brasses and bronzes, naval brass, Muntz metal | 0.45 |
| 18% chromium type corrosion-resistant steels, common 300 series stainless steels | 0.50 |

It should be noted that the potential differences between metals depends, at least in part, on the nature of the corrosive environment they are measured in. Results measured in, for example, seawater may be slightly different than for fresh water. It should also be noted that there can be large differences between passive and active surfaces of the same material. The anodic potential of a stainless steel surface may be substantially reduced by a passivation treatment using nitric acid and/or solutions of oxidizing salts. The anodic potential difference may be kept within the most preferred 0.15V if silver is used in combination with, for example, gold, gold/platinum alloys, platinum, zirconium, carbon graphite, rhodium, nickel, nickel-copper alloys, titanium and monel. The potential difference may be kept within the preferred 0.25V with for example beryllium copper, brass, bronze, silver solder, copper, copper-nickel alloys, nickel-chrome alloys, austenitic corrosion resistant steels, most chrome-moly steels. The potential difference may be kept within the desired 0.40V by using, for example, 18-8 stainless steel or 300 series stainless steels, high brasses and bronzes, naval brass and Muntz metal. When a plating is used, it is desirable to have the plating material within these anodic potential ranges and most preferably have a potential between the two base materials in close contact with each other. For example, gold, palladium, rhodium, ruthenium, nickel or silver plating generally meets these requirements. The electrical bus is generally connected to the EC mirror drive voltage source by use of a spade connector or soldered joint. When a soldered joint, or connection, is used, the bus metal is preferably solderable. Platings such as gold, palladium, rhodium, ruthenium, nickel, silver and tin can enhance the solderability of the bus clip. For instance, even though tin is not a preferred plating, a tin plated stainless steel bus clip solders easily when compared to a plain stainless steel clip. A solder friendly more preferred substrate/plating combination is stainless steel with palladium, silver, nickel or rhodium plating. Stainless steel with a nickel plating followed by a silver, palladium, gold, rhodium or ruthenium plating is a preferred material. Other preferred materials include metals or metal alloys comprising tantalum, zirconium, tungsten, and molybdenum with a nickel, silver, gold, palladium, rhodium and ruthenium plating. Other preferred materials are metals, or metal alloys, comprising titanium or nickel with a nickel and/or silver plating. For enhanced stability, it is desirable to passivate the surface of the base metal.

Turning now to FIGS. 9a and 9b, a mirror element comprising a first substrate 912b and a second substrate 902b is depicted subsequent to being received by a carrier assembly. The carrier assembly comprises a substantially rigid portion 901a, 901b integrated with a pliable peripheral gripping portion 903a, 903b. The substantially rigid portion and the pliable peripheral gripping portion may be co-molded, individually molded and adhered to one another, designed to friction fit together, designed to interference fit together, individually molded and melted together, or a combination thereof. In any event, the pliable peripheral gripping portion 903a, 903b is preferably designed to result in an interface 909 between the pliable peripheral gripping portion and the perimeter material beyond the crown 913 such that from near the crown to near the tip 907 there is a restraining force generated that, at least in part, retains the element proximate the carrier assembly as desired. An additional adhesion material 905a, 905b may be utilized to further retain the element proximate the carrier assembly. It should be understood that the perimeter portion 903a, 903b may be constructed, at least in part, from a material that adheres to the perimeter material 960 such that the retentive force is also generated along the interface 911 on the rigid portion 901a, 901b side of the crown 903a, 903b; in such a case, the perimeter portion 903a, 903b may extend short of the crown or just beyond the crown as depicted in FIG. 9b. Preferably, the perimeter portion tip 907 is tapered slightly to provide a visually appealing transition to the element irrespective of whether the perimeter portion extends beyond the crown. It should be understood that the shape of the perimeter material may be altered to provide at least one edge substantially parallel to surface 915 and the perimeter portion may be designed to impart a more pronounced transition between the crown and the interface 909.

FIG. 9c depicts an element comprising a first substrate 912c and a second substrate 902c positioned within a carrier 901c and perimeter portion 903c. This configuration typically represents the as-molded condition of the pliable peripheral gripping portion. FIG. 9b would typically represent the installed position of the pliable peripheral gripping portion. The installed position allows the pliable peripheral gripping portion to conform to the potential irregularities of the glass profile. FIG. 9b is depicting a mechanical interlock between the rigid portion of the carrier and the pliable peripheral gripping portion. This is useful for materials that are not intended to be bonded together whether adhered or bonded through a molding process. The mechanical interlocks can be spaced around the perimeter of the assembly as needed. FIG. 9c is depicting a cross section without a mechanical interlock. Both sections can be used as needed. Another difference between FIGS. 9b and 9c is the height of the pliable peripheral gripping portion off of the back side of the carrier. FIG. 9b limits the height off of the back of the carrier of the pliable peripheral gripping portion by placing some of the pliable peripheral gripping portion between the glass and carrier in place of the heater/foam assembly. This potentially eliminates clash conditions inside the housing. FIG. 9c can be used to allow the heater/foam assembly to be placed to the edge of the glass perimeter. This allows heating of the glass assembly all the way out to the edge. However, it could potentially create clash conditions of the mirror assembly in the mirror housing.

Turning now to FIGS. 9d-m, various carrier plates are depicted with perimeter gripping portions. FIGS. 9d-g depict a carrier plate 901d, 901e, 901f, 901g having an integral perimeter gripping portion 903d, 903e, 903f, 903g. In at least one embodiment, the perimeter gripping portion comprises a "goose neck" cross section shape and comprises a series of alternating lands 903d1, 903e1, 903f1 and apertures 903d2, 903e2, 903g2. The combination of the goose neck shape and the alternating lands and apertures provides hoop stress relief to account for differences in expansion coefficients between the element and the carrier plate/perimeter gripping portion.

FIG. 9h depicts an element comprising a first substrate 912h and a second substrate 902h held in spaced apart relationship with respect to one another via a primary seal material 978h within a carrier plate 901h and perimeter gripping portion 903h. In this embodiment, the perimeter gripping portion comprises a compressible material that is sandwiched between the element and an outer part of the carrier plate to allow for the variations in expansion coefficients between the element and the carrier plate/perimeter gripping portion.

FIG. 9i depicts an element comprising a first substrate 912i and a second substrate 902i held in spaced apart relationship with respect to one another via a primary seal material 978i within a carrier plate 901i and perimeter gripping portion 903i. In this embodiment, the perimeter gripping portion comprises a compressible material 904i that is sandwiched between the carrier plate and the perimeter gripping portion to allow for the variations in expansion coefficients between the element and the carrier plate/perimeter gripping portion.

FIG. 9j depicts a carrier plate 901j having a swivel portion 901j1 for pivotally attaching a perimeter gripping portion 903j. The fact that the perimeter gripping portion is allowed to pivot about the swivel portion accounts for variations in expansion coefficients between the element and the carrier plate/perimeter gripping portion.

FIG. 9k depicts a carrier plate 901k having a perimeter gripping portion 903k. The perimeter gripping portion is preferably molded such that it is tilted toward an associated element (not shown). A compression material 904k is provided to account for variations in expansion coefficients between the element and the carrier plate/perimeter gripping portion.

FIG. 9l depicts a carrier plate 901l having a perimeter gripping portion 903l. The perimeter gripping portion is preferably molded such that it is tilted toward an associated element (not shown). A series of vertically extending compression elements 904l are provided to account for variations in expansion coefficients between the element and the carrier plate/perimeter gripping portion.

FIG. 9m depicts a carrier plate 901m having a perimeter gripping portion 903m. The perimeter gripping portion is preferably molded such that it is tilted toward an associated element (not shown). A series of horizontally extending compression elements 904m are provided to account for variations in expansion coefficients between the element and the carrier plate/perimeter gripping portion.

Figure 10A:
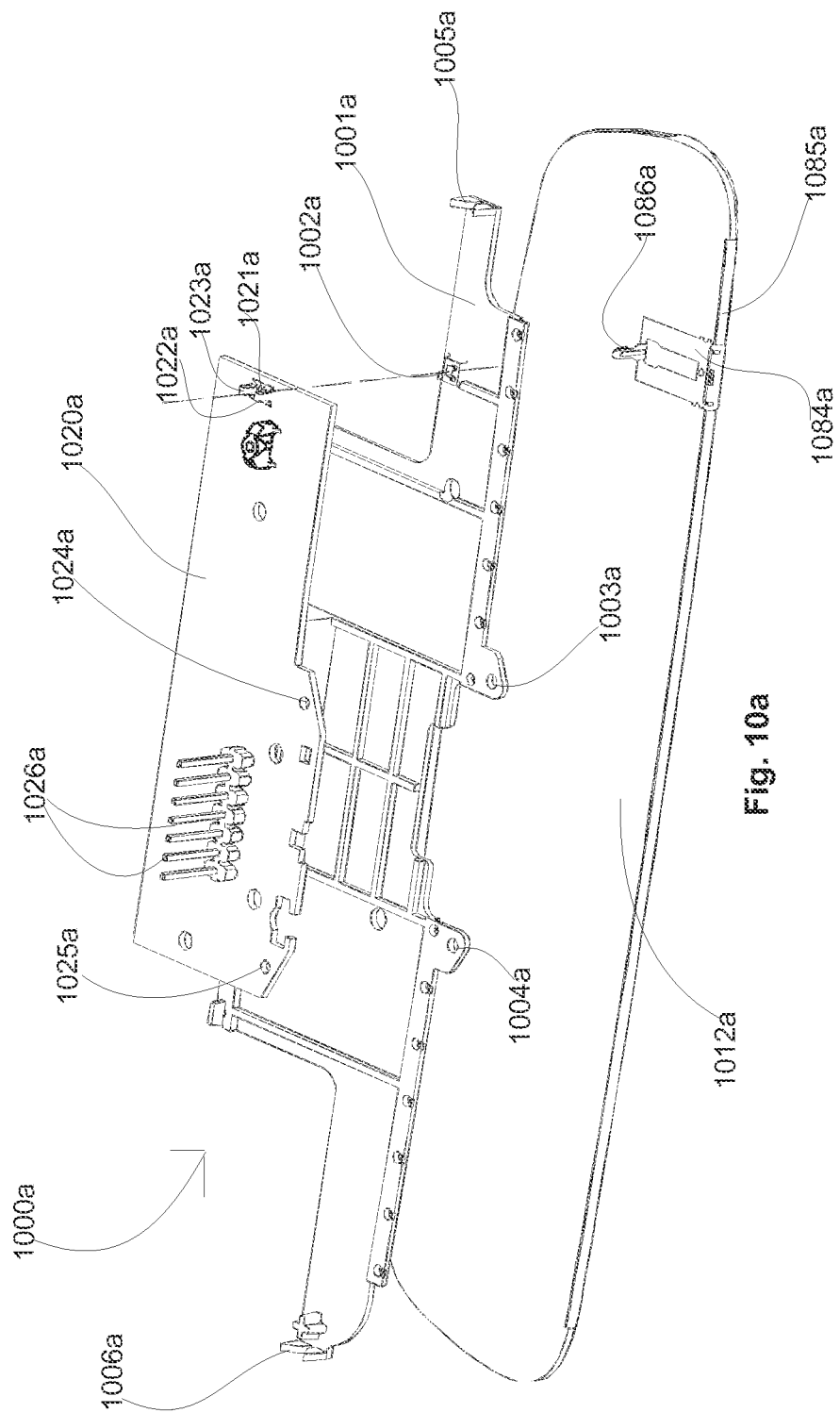

Turning now to FIGS. 10a-c, an element 1012a is depicted proximate an alignment plate 1001a, 1001b and an electrical circuit board 1020a, 1020b. In at least one embodiment, an electrical clip 1084a, 1084b having a contact post 1086a, 1086c is connected to an element electrical connection 1085a, 1085b. The element electrical connection may be via an electrically conductive epoxy, solder, conductive adhesive or an edge spring clip. When the element is engaged with the electrical circuit board the contact post is received through a hole 1021a, 1021c in the electrical circuit board and is slidingly engaged with friction fit contacts 1022a, 1022c, 1023a, 1023c. FIG. 10c depicts an enlarged view of the corresponding area 1027b of FIG. 10b. In at least one embodiment, the alignment plate comprises apertures 1003a, 1004a for alignment with apertures 1024b, 1025b, respectively, of the electrical circuit board. Preferably, alignment pins (not shown) are provided elsewhere in the associated mirror assembly, such as, in the housing or bezel to accurately position the individual components within the assembly. In at least one embodiment, the alignment plate comprises an aperture 1002a through which the contact post is received for alignment with the corresponding hole in the circuit board. In at least one embodiment, the alignment plate comprises features 1005a, 1005b, 1006a, 1006b for accurately securing the components within a complete assembly. It should be understood that the electrical circuit board may comprise components such as a microprocessor and, or, other electrical components, such as a display driver, a compass sensor, a temperature sensor, a moisture detection system, an exterior light control system and operator interfaces that are at least partially shared with at least one mirror element dimming circuitry.

It should be understood that the above description and the accompanying figures are for illustrative purposes and should in no way be construed as limiting the invention to the particular embodiments shown and described. The appending claims shall be construed to include all equivalents within the scope of the doctrine of equivalents and applicable patent laws and rules.

What is claimed is:

1. A vehicular rearview assembly prepared by a process comprising the steps:
    providing a first substrate comprising a first surface and a second surface;
    providing a second substrate comprising a third surface and a fourth surface;
    applying an electrically conductive coating to at least a portion of the second surface;
    applying an electrically conductive coating to at least a portion of the third surface;
    ablating by a laser a portion of the electrically conductive coating on the second surface forming an isolation area that is substantially devoid of the electrically conductive coating and a plurality of non-ablated portions of the electrically conductive coating;
    applying a perimeter seal to the second surface and the third surface to define a cavity;
    filling the cavity with an electro-optic medium to form an electro-optic element; and
    connecting the electro-optic element to a housing structure having an aperture corresponding to a front of the assembly, wherein the housing structure is configured to support the electro-optic element.

2. The vehicular rearview assembly prepared by a process according to claim 1, wherein the isolation area comprises an isolation line having a width of about 0.005 inches to about 0.010 inches.

3. The vehicular rearview assembly prepared by a process according to claim 1, wherein the isolation area comprises an isolation line having a width of about 0.002 inches to about 0.004 inches.

4. The vehicular rearview assembly prepared by a process according to claim 1, wherein the isolation area comprises an isolation line having a width of less than or equal to about 0.002 inches.

5. The vehicular rearview assembly prepared by a process according to claim 1, wherein the isolation area comprises an isolation line having a width of less than or equal to about 1 um.

6. The vehicular rearview assembly prepared by a process according to claim 1, wherein the isolation area comprises an isolation line configured such that the electrical resistance between the plurality of non-ablated portions of the electrically conductive coating is greater than 30 ohms.

7. The vehicular rearview assembly prepared by a process according to claim 1, wherein the isolation area comprises an isolation line configured such that the electrical resistance between the plurality of non-ablated portions of the electrically conductive coating is greater than 100 ohms.

8. The vehicular rearview assembly prepared by a process according to claim 1, wherein the electro-optic mirror element further comprises one or more of a textual feature, emblem, graphic, and artwork, and further wherein the isolation area is substantially incorporated into the one or more of the textual feature, emblem, graphic, and artwork.

9. The vehicular rearview assembly prepared by a process according to claim 1, further comprising the step:
    providing a spectral filter between the second surface and the perimeter seal, the spectral filter comprises a first and a second spectral filter portion substantially isolated from one another by the isolation area.

10. The vehicular rearview assembly prepared by a process according to claim 9, wherein the isolation area is located over the perimeter seal.

11. The vehicular rearview assembly prepared by a process according to claim 10, wherein the step of applying an electrically conductive coating to at least a portion of the second surface comprises applying the electrically conductive coating directly on the second surface.

12. The vehicular rearview assembly prepared by a process according to claim 10, wherein the step of providing a spectral filter between the second surface and the perimeter seal comprises applying the spectral filter directly on the second surface.

13. The vehicular rearview assembly prepared by a process according to claim 10, wherein the spectral filter comprises an inboard edge and the isolation area is substantially aligned in close proximity to the inboard edge such that the isolation area is substantially hidden from view with respect to the front of the vehicular rearview assembly.

14. A vehicular rearview assembly prepared by a process comprising the steps:
- providing a first substrate comprising a first surface and a second surface;
- providing a second substrate comprising a third surface and a fourth surface;
- applying an electrically conductive coating over at least a portion of the second surface;
- applying an electrically conductive coating over at least a portion of the third surface;
- applying a perimeter seal to the second surface and the third surface to define a cavity;
- providing a spectral filter over at least a portion of the second surface and between the second surface and the perimeter seal;
- ablating by a laser a viewable portion of the spectral filter;
- filling the cavity with an electro-optic medium to form an electro-optic element; and
- connecting the electro-optic element to a housing structure having an aperture corresponding to a front of the assembly, wherein the housing structure is configured to support the electro-optic element.

15. The vehicular rearview assembly prepared by a process according to claim 14, further comprising the step:
- ablating by a laser a portion of the electrically conductive coating and the spectral filter over at least a portion of the second surface to form (a) an isolation area that is substantially devoid of the electrically conductive coating and the spectral filter, (b) a plurality of non-ablated portions of the electrically conductive coating, and (c) a plurality of non-ablated portions of the spectral filter.

16. The vehicular rearview assembly prepared by a process according to claim 15, wherein the step of applying the electrically conductive coating over at least a portion of the second surface is performed before the step of providing a spectral filter.

17. The vehicular rearview assembly prepared by a process according to claim 16, wherein the electrically conductive coating over at least a portion of the second surface comprises a transparent conductive oxide.

18. The vehicular rearview assembly prepared by a process according to claim 17, wherein the electrically conductive coating over at least a portion of the second surface comprises indium tin oxide.

19. The vehicular rearview assembly prepared by a process according to claim 15, wherein the step of applying the electrically conductive coating over at least a portion of the second surface is performed after the step of providing a spectral filter.

20. The vehicular rearview assembly prepared by a process according to claim 19, wherein the electrically conductive coating over at least a portion of the second surface comprises a transparent conductive oxide.

21. The vehicular rearview assembly prepared by a process according to claim 20, wherein the electrically conductive coating over at least a portion of the second surface comprises indium tin oxide.

22. The vehicular rearview assembly prepared by a process according to claim 14, wherein the spectral filter comprises chrome material.

23. The vehicular rearview assembly prepared by a process according to claim 14, wherein the spectral filter comprises a stack of materials.

24. The vehicular rearview assembly prepared by a process according to claim 14, wherein the electro-optic medium comprises an electrochromic material.

\* \* \* \* \*

UNITED STATES PATENT AND TRADEMARK OFFICE
CERTIFICATE OF CORRECTION

| | | |
|---|---|---|
| PATENT NO. | : 9,346,402 B2 | Page 1 of 1 |
| APPLICATION NO. | : 14/699402 | |
| DATED | : May 24, 2016 | |
| INVENTOR(S) | : Tonar et al. | |

It is certified that error appears in the above-identified patent and that said Letters Patent is hereby corrected as shown below:

In the claims,

Col. 48, claim 5, line 25;

"um" should be --μm--.

Signed and Sealed this
Second Day of August, 2016

Michelle K. Lee
*Director of the United States Patent and Trademark Office*